United States Patent
Sugahara et al.

(10) Patent No.: US 7,545,013 B2
(45) Date of Patent: Jun. 9, 2009

(54) RECONFIGURABLE LOGIC CIRCUIT USING A TRANSISTOR HAVING SPIN-DEPENDENT TRANSFER CHARACTERISTICS

(75) Inventors: Satoshi Sugahara, Kanagawa (JP); Tomohiro Matsuno, Tokyo (JP); Masaaki Tanaka, Saitama (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 450 days.

(21) Appl. No.: 10/550,652

(22) PCT Filed: Mar. 26, 2004

(86) PCT No.: PCT/JP2004/004379

§ 371 (c)(1),
(2), (4) Date: Dec. 7, 2005

(87) PCT Pub. No.: WO2004/086625

PCT Pub. Date: Oct. 7, 2004

(65) Prior Publication Data

US 2006/0114018 A1     Jun. 1, 2006

(30) Foreign Application Priority Data

Mar. 26, 2003    (JP)  ............................... 2003-086499

(51) Int. Cl.
*H01L 29/739*     (2006.01)
(52) U.S. Cl. ....................... 257/421; 257/422; 257/425; 257/295; 257/E29.323; 257/E29.164
(58) Field of Classification Search ................. 257/295, 257/421, 422, 425, E29.323, E29.164
See application file for complete search history.

(56) References Cited

U.S. PATENT DOCUMENTS

| | | | |
|---|---|---|---|
| 5,652,445 A | | 7/1997 | Johnson |
| 5,654,566 A | * | 8/1997 | Johnson ...................... 257/295 |
| 5,661,421 A | * | 8/1997 | Ohmi et al. ................... 327/63 |
| 5,998,842 A | | 12/1999 | Sano |

FOREIGN PATENT DOCUMENTS

| | | |
|---|---|---|
| EP | 0 685 808 A1 | 12/1995 |
| JP | A-05-343984 | 12/1983 |
| JP | A-61-234623 | 10/1986 |
| JP | A-06-250994 | 9/1994 |

(Continued)

OTHER PUBLICATIONS

Notification of Reasons for Refusal, Mar. 25, 2008.

(Continued)

*Primary Examiner*—Eugene Lee
(74) *Attorney, Agent, or Firm*—Oliff & Berridge, PLC

(57) ABSTRACT

A nonvolatilely reconfigurable logical circuit is built. It is a reconfigurable logical circuit based on the CMOS configuration using the spin MOSFET. By changing the transmission characteristic of each transistor in accordance with the magnetization states of Tr1, Tr2, Tr5, and Tr8 which are spin MOSFETs, it is possible to reconfigure all the two-input symmetric functions AND/OR/XOR/NAND/NOR/XNOR/ "1"/"0". Since it is possible to constitute the logical function by a small number of non-volatile elements, it is possible to reduce the chip area, thereby increasing the speed and reducing the power consumption.

40 Claims, 51 Drawing Sheets

FOREIGN PATENT DOCUMENTS

| JP | A-09-097906 | 4/1997 |
|----|-------------|--------|
| JP | A-11-340542 | 12/1999 |
| JP | A-2000-349619 | 12/2000 |
| JP | A-2002-246487 | 8/2002 |
| JP | A-2003-008105 | 1/2003 |
| JP | A-2003-060211 | 2/2003 |
| JP | A-2003-092412 | 3/2003 |

OTHER PUBLICATIONS

S. Sugahara et al.; "A Spin MOSFET and its Applications"; The Magnetics Society of Japan; vol. 134; Jan. 2004; pp. 93-100. (w/ abstract).

Stephen Trimberger; "A Reprogrammable Gate Array and Applications"; *Proceedings of the IEEE*; vol. 81, No. 7; Jul. 1993; pp. 1030-1041.

Scott Hauck; "The Roles of FPGA's in Reprogrammable Systems"; *Proceedings of the IEEE*; vol. 86, No. 4; Apr. 1998; pp. 615-638.

Toshinori Sueyoshi; "Programmable Logic Devices—from the Past to the Future"; *Technical Report of IEICE*; vol. 101, No. 632; 2002; pp. 17-24 (w/ abstract).

Tadashi Shibata et al.; "A Functional MOS Transistor Featuring Gate-Level Weighted Sum and Threshold Operations"; *IEEE Transactions on Electron Devices*; vol. 39, No. 6; Jun. 1992; pp. 1444-1455.

Tadashi Shibata et al.; Neuron MOS Binary-Logic Integrated Circuits- Part I: Design Fundamentals and Soft-Hardware-Logic Circuit Implementation; *IEEE Transactions on Electron Devices*; vol. 40, No. 3, Mar. 1993; pp. 570-576.

Hiroshi Sawada et al; "Consideration for a Reconfigurable Logic Device using Neuron MOS Transistors"; Technical Report of IEICE; vol. 99, No. 481; Nov. 1999; pp. 41-48. (w/ abstract).

\* cited by examiner

A/D CONVERTER

A/D CONVERTER

FIG. 5A  FIG. 5B  FIG. 5C
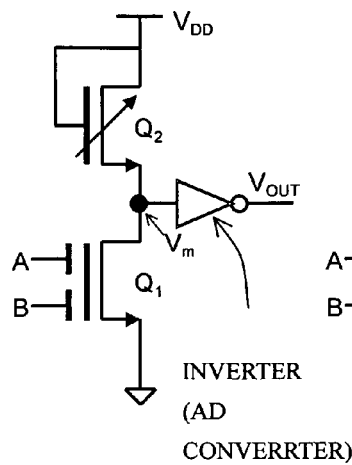
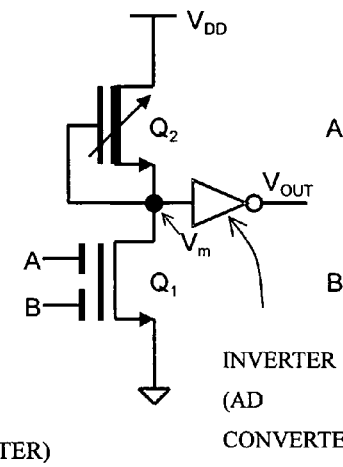
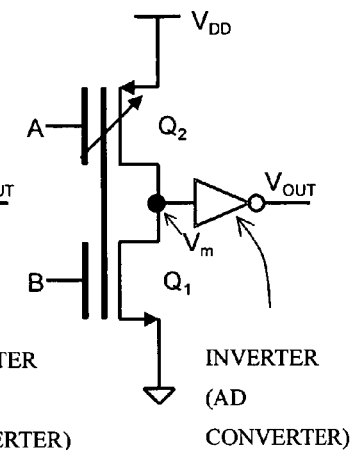
FIG. 6
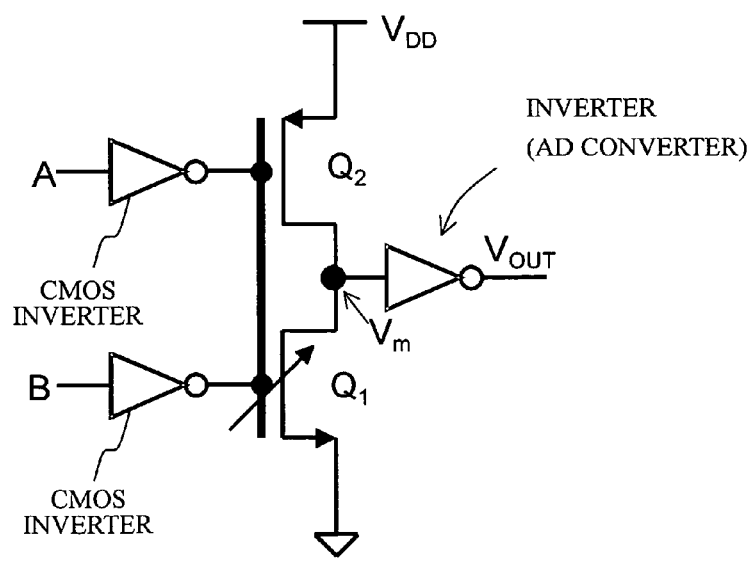

(A)

βn1 = 1

| A | B | Vm | Vout |
|---|---|----|------|
| 0 | 0 | VO | "0"  |
| 0 | 1 | VP | "1"  |
| 1 | 1 | VQ | "1"  |

OR (B)

βn1 = 10

| A | B | Vm | Vout |
|---|---|----|------|
| 0 | 0 | VO | "0"  |
| 0 | 1 | VR | "0"  |
| 1 | 1 | VS | "1"  |

AND

FIG. 11
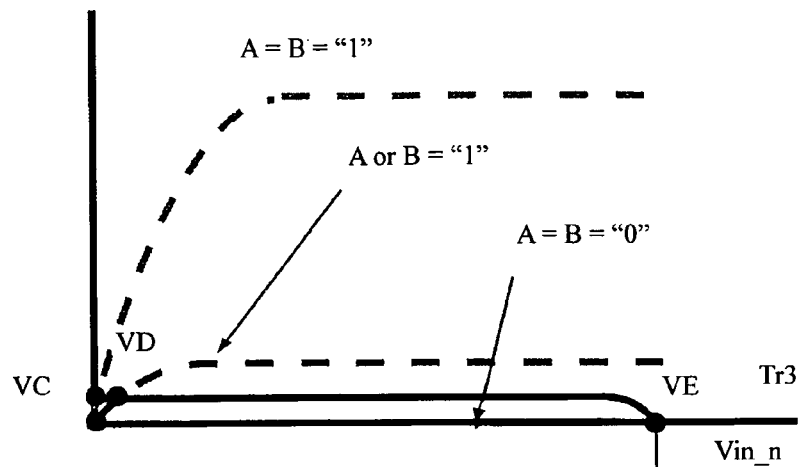
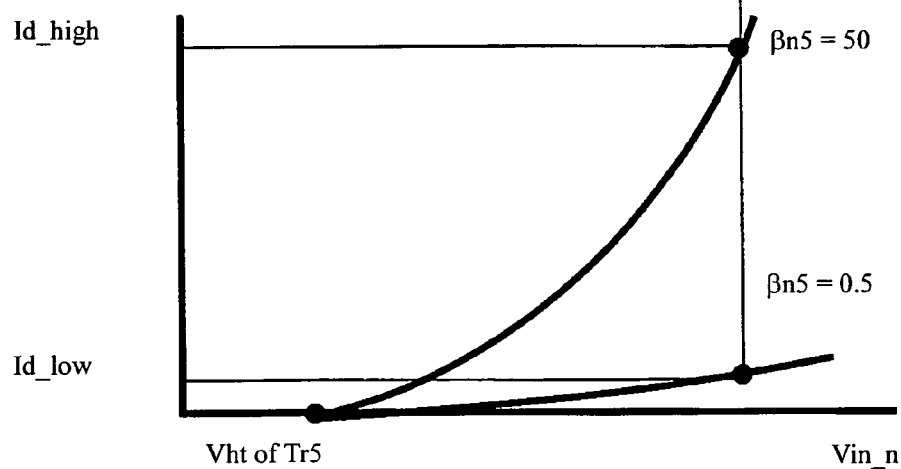

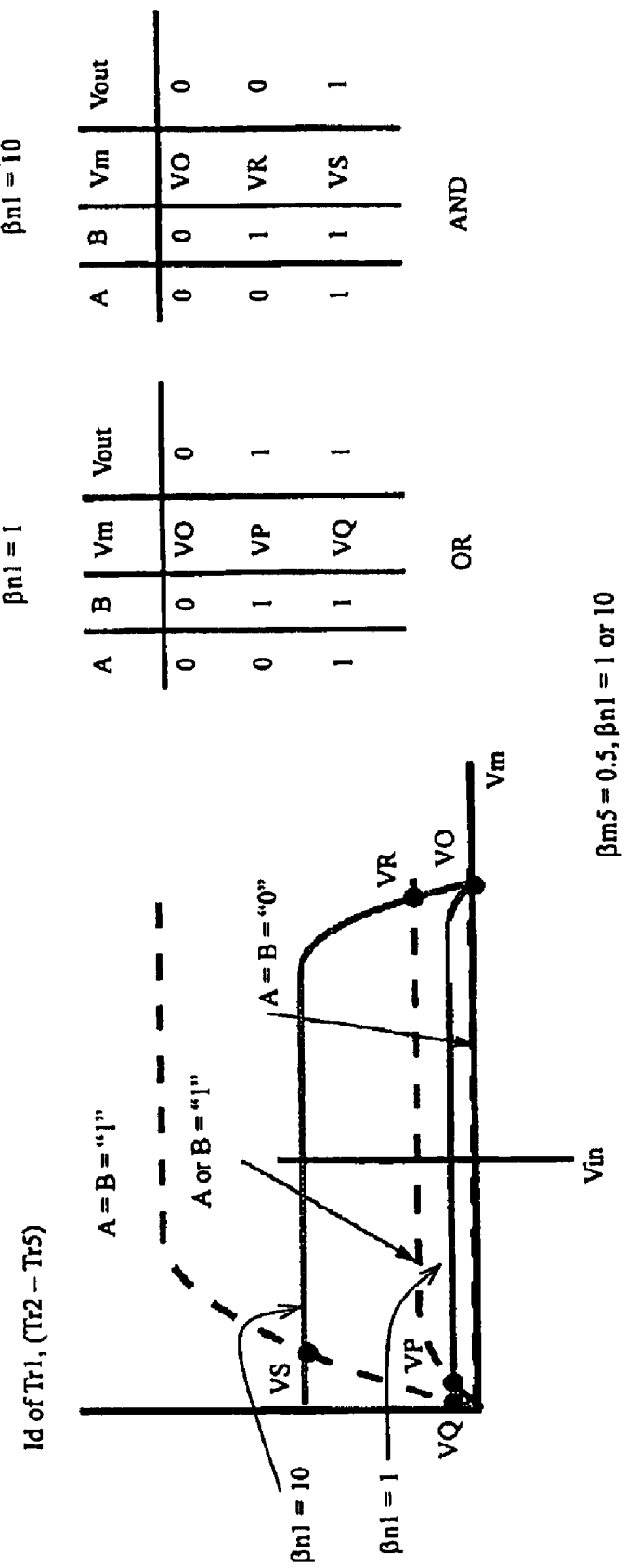

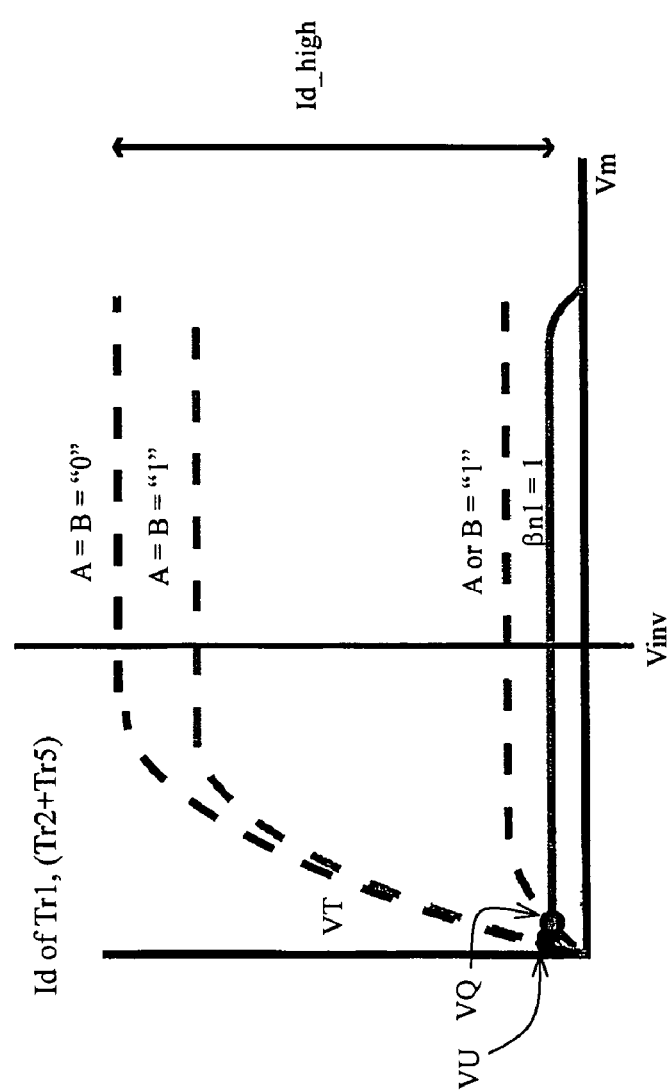

FIG. 19A
FIG. 19B
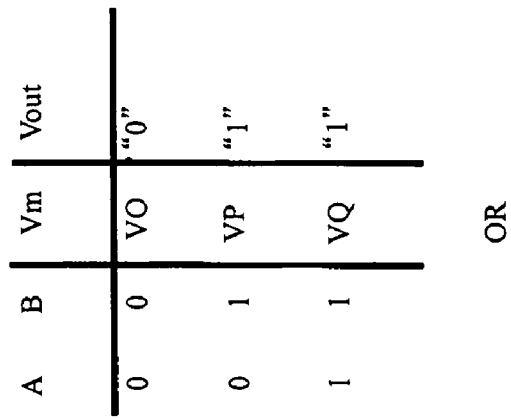
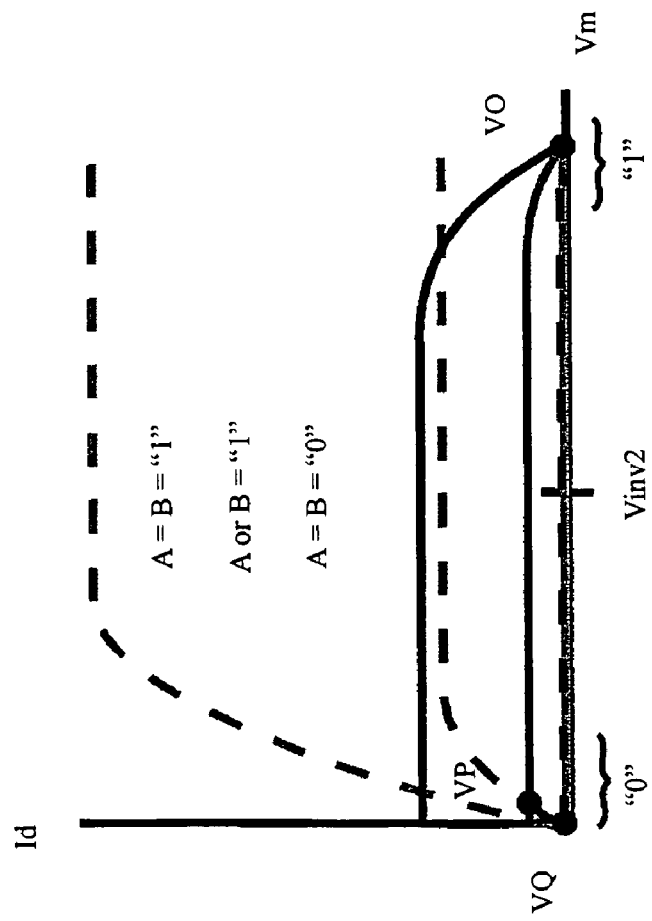

AND $\beta p1 = 10, \beta n2 = 1$

| A | B | Vm | Vout |
|---|---|----|------|
| 0 | 0 | VO | "0" |
| 0 | 1 | VP | "1" |
| 1 | 1 | VQ | "1" |

OR

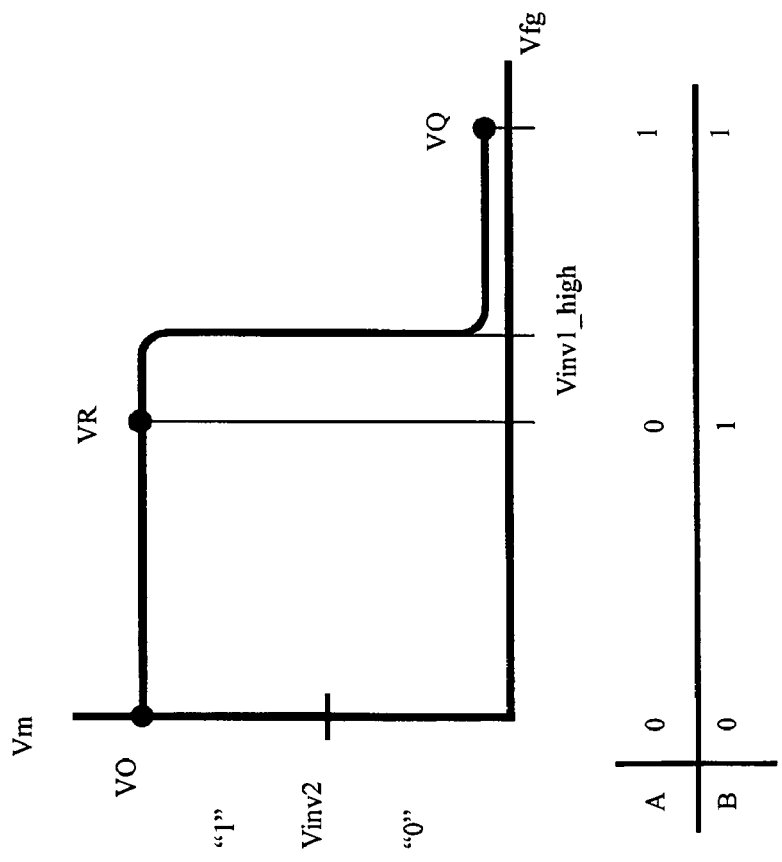

FIG. 25
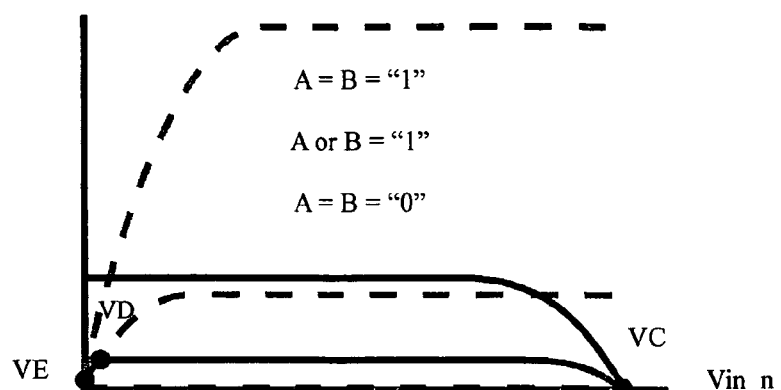
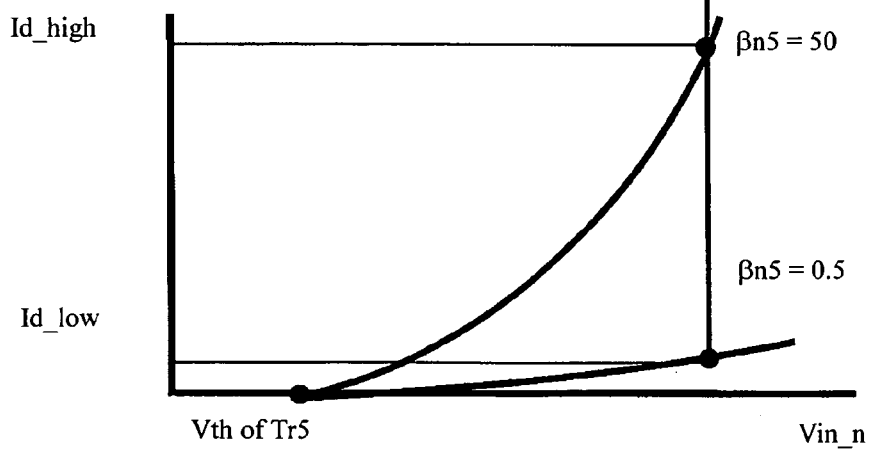

OR

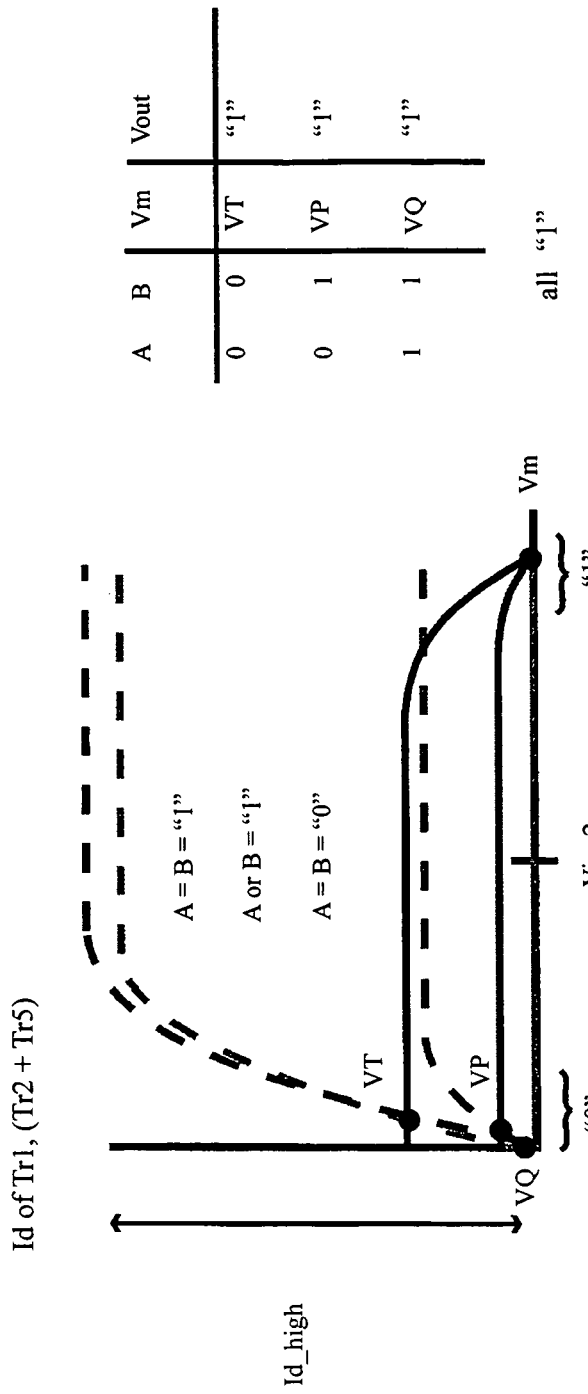

XNOR

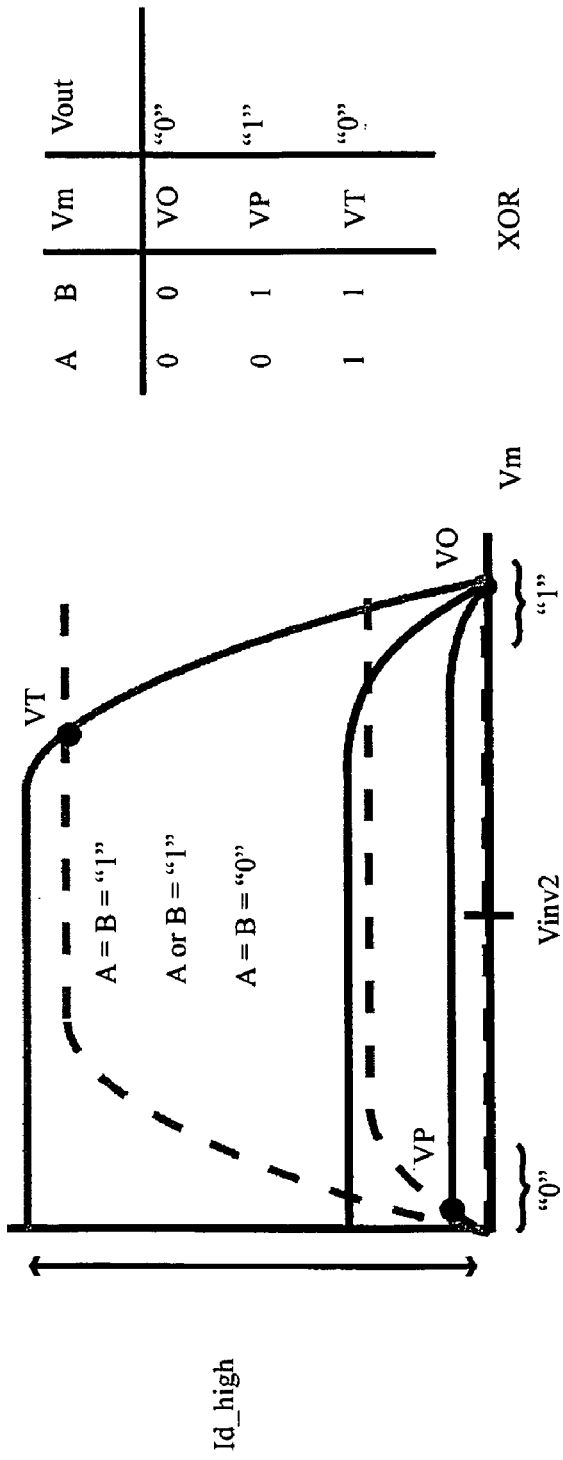

NAND

NOR

|   A   |   B   |  Vm   | Vout Vinv_low | Vinv_high |
|-------|-------|-------|---------------|-----------|
|   0   |   0   |  VO   |       1       |     1     |
|   0   |   1   |  VP   |       0       |     1     |
|   1   |   1   |  VQ   |       0       |     0     |
|       |       |       |     NOR       |    NAND   |

FIG. 42A
FIG. 42B
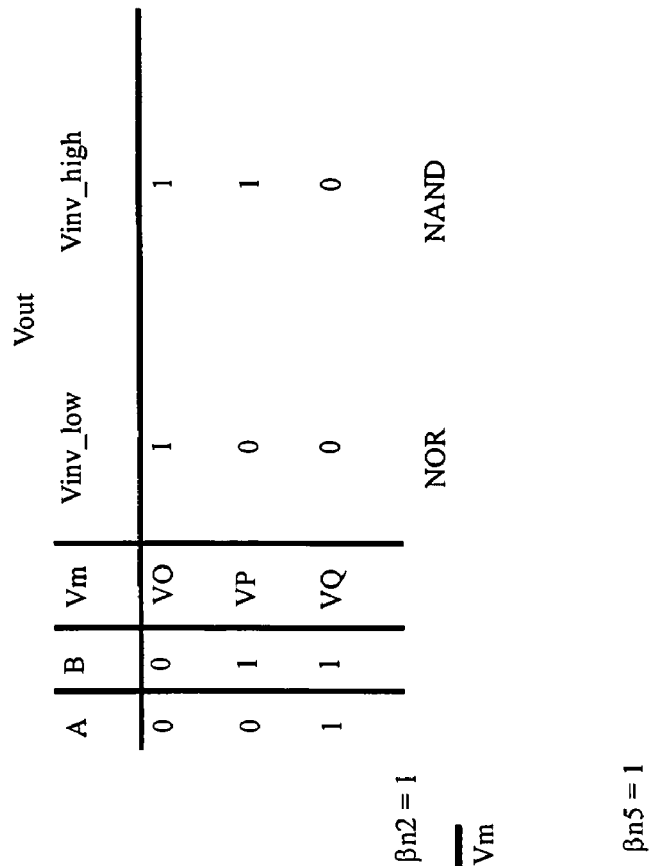
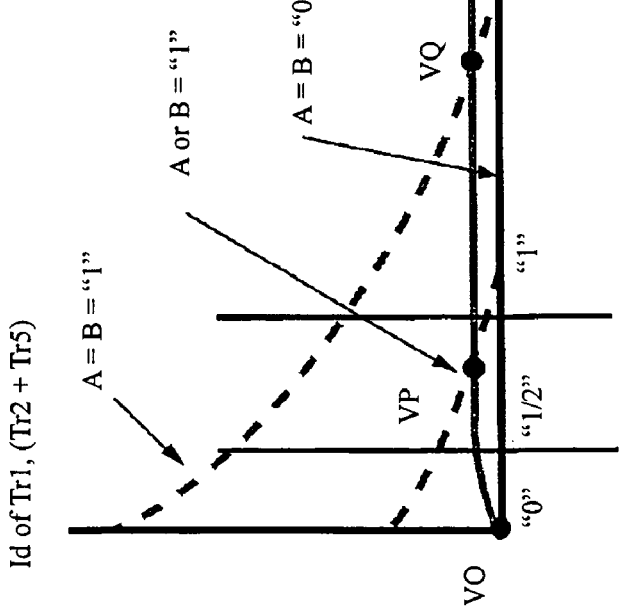

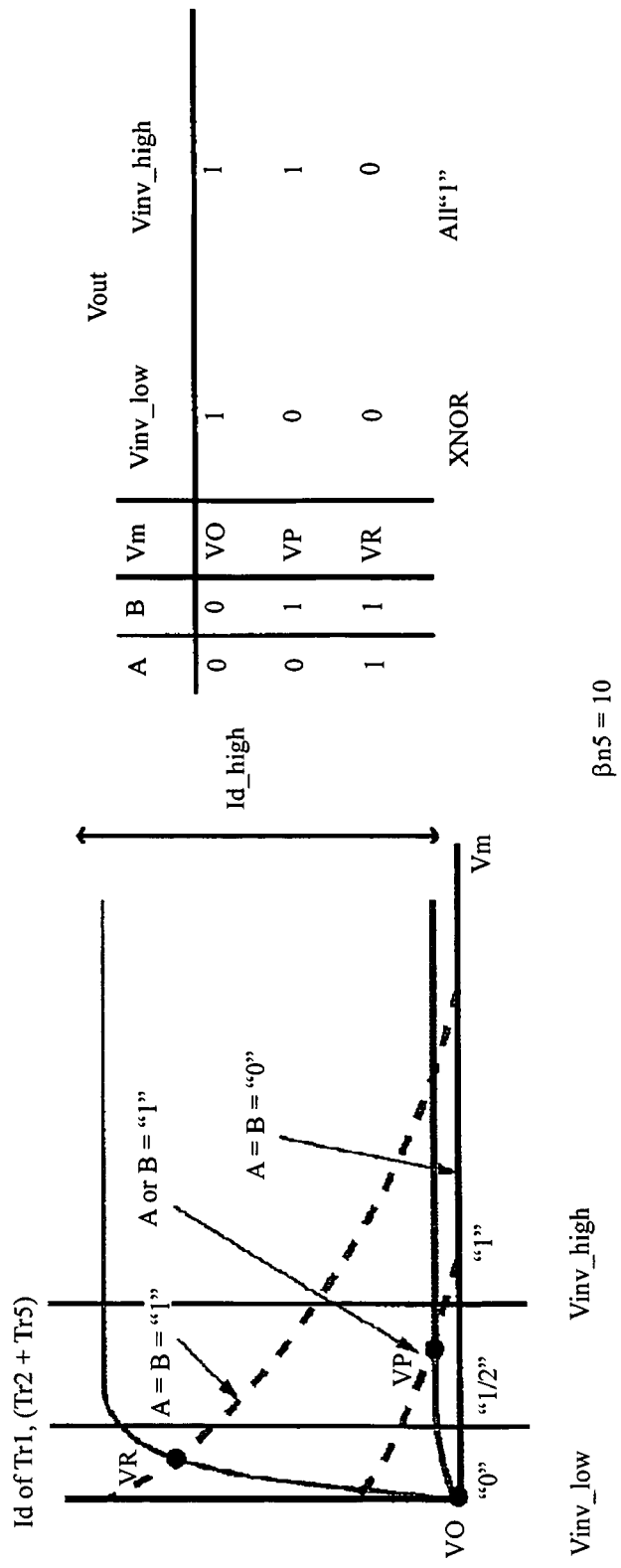

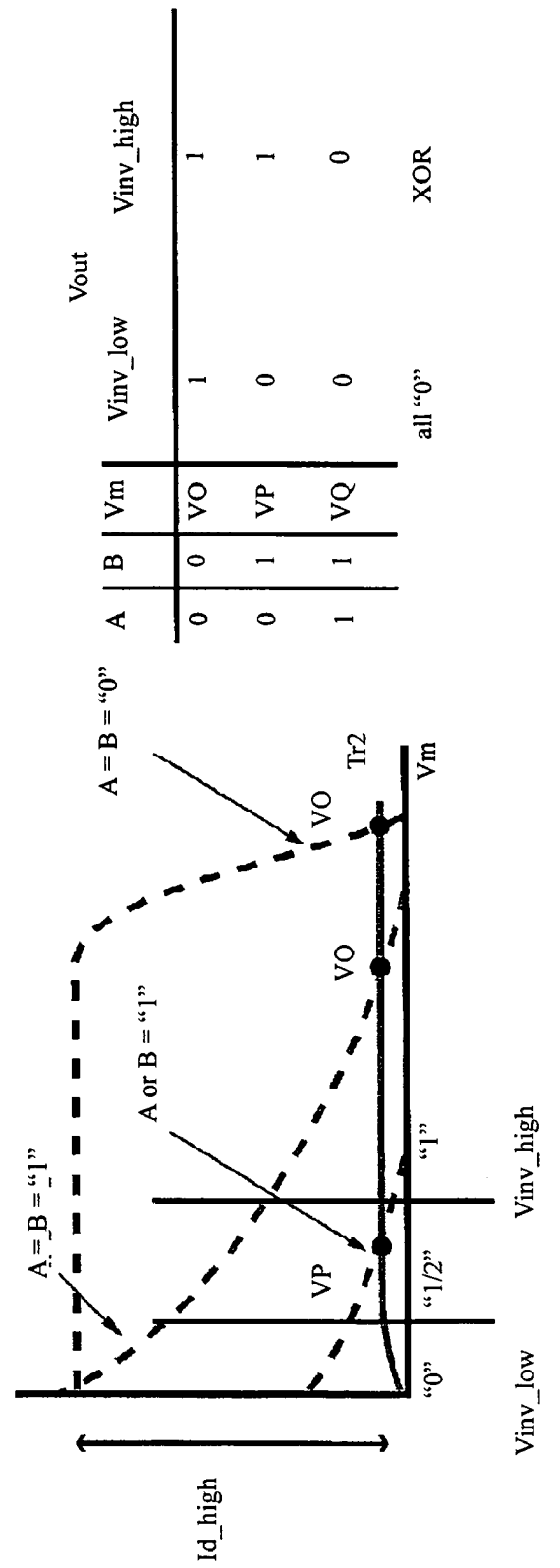

FIG. 50
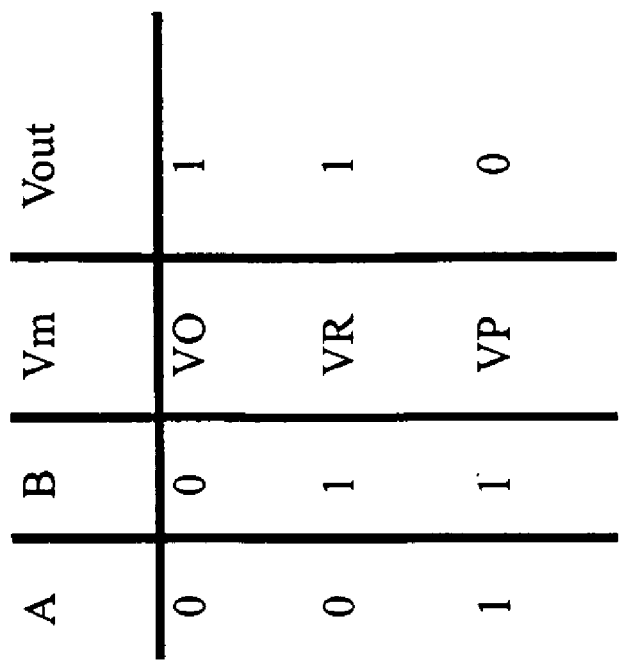
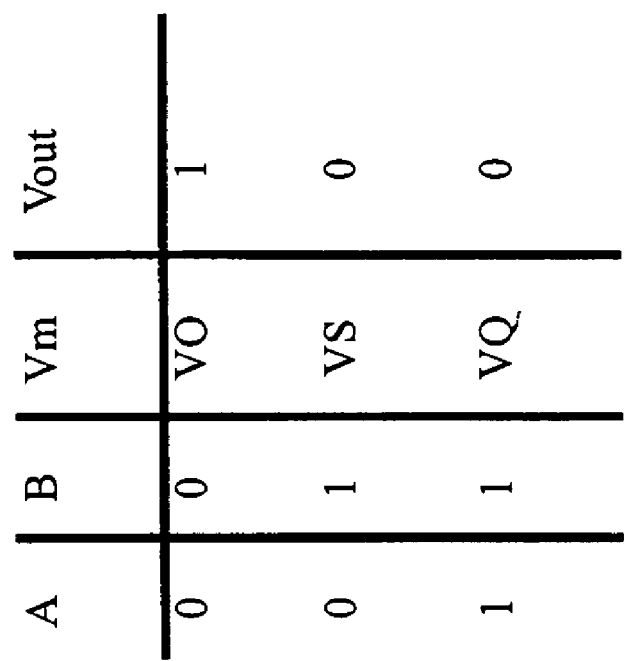

FIG. 51A
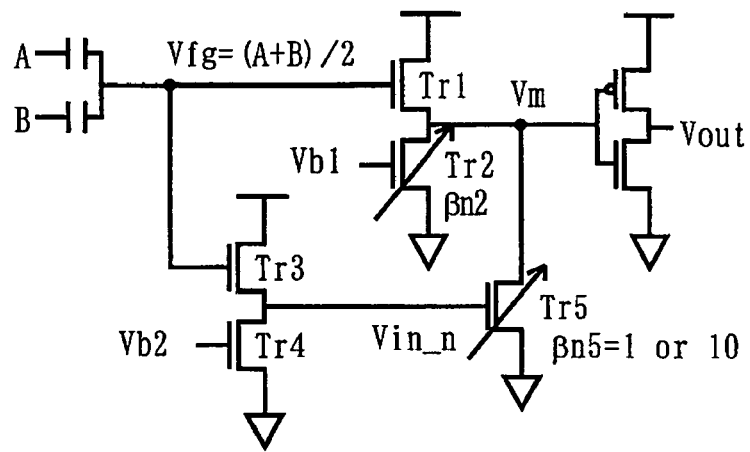
FIG. 51B
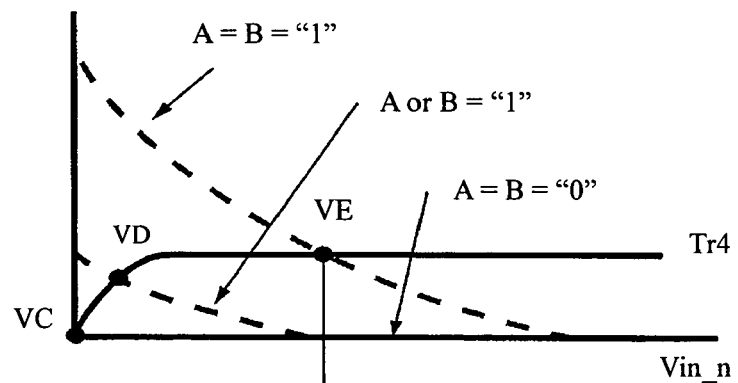
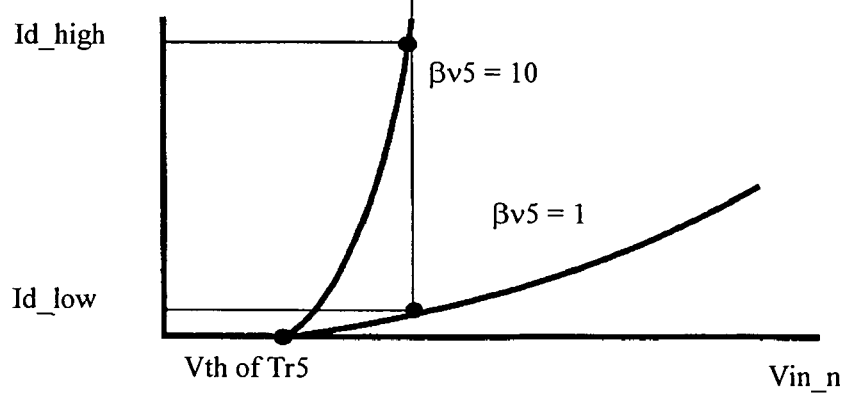

| A | B | Vm | Vout |
|---|---|----|------|
| 0 | 0 | VO | 1 |
| 0 | 1 | VS | 0 |
| 1 | 1 | VU | 1 |

XNOR

| A | B | Vm | Vout |
|---|---|----|------|
| 0 | 0 | VO | 1 |
| 0 | 1 | VR | 1 |
| 1 | 1 | VV | 1 |
| all "1" | | | |

US 7,545,013 B2

RECONFIGURABLE LOGIC CIRCUIT USING A TRANSISTOR HAVING SPIN-DEPENDENT TRANSFER CHARACTERISTICS

FIELD OF THE INVENTION

The present invention relates to logic circuits with reconfigurable functions, and more particularly, to a reconfigurable logic circuit using transistors (hereafter referred to as the "spin transistors") that contain ferromagnetic bodies and have transfer characteristics depending on the magnetization states of the ferromagnetic bodies.

BACKGROUND OF THE INVENTION

Recently, attention has been drawn to logic circuits that can reconfigure (or reprogram) functions in accordance with user programs. For example, a field programmable logic array (FPGA) that has been developed by the LSI technique is widely used (disclosed by S. Trimberger in Proc. IEEE 81 (1993) pp. 1030-1041, S. Hauck in Proc. IEEE 86 (1998) pp. 615-638, and Toshinori Sueyoshi in "Programmable Logic Devices" IEICE Tech. Report, Vol. 101, No. 632, (2002) pp. 17-24, for example). Conventionally, the FPGA has been used only for test products and limited products. However, since shipment can be made quickly and the functions can be rewritten after shipment, the FPGA is incorporated as the last component into mobile devices such as portable telephone devices that tend to be replaced with newly developed devices in a short time. Also, studies have been made on the FPGA as an information device of novel architecture that reconfigures its hardware for each operation.

There are several types of configurations for the FPGA. Among them, the Look Up Table (LUT) method using SRAMs is most widely used. In this configuration, small-sized logic blocks that are formed with LUTs for achieving desired functions are arranged in a matrix fashion, and the blocks are connected to one another with lines that can be changed by a switch (a pass transistor, for example) (see FIG. 57A).

A desired logic circuit is realized by rewriting the values to be written in the register of the LUT and the switch for the lines. Each logic block includes a flip-flop (FF) for operations in synchronization with the LUT (see FIG. 57B). The LUT includes a decoder circuit for matching each input pattern with an address, and memories (SRAM cells) for storing a value in the register of each address. FIG. 57C shows an example of the LUT circuit that can achieve symmetric Boolean functions.

A SRAM is a volatile memory, and loses stored information when the power supply is cut off. Therefore, so as to maintain data, a non-volatile memory (a flash memory, for example) is prepared externally, and the information stored in the non-volatile memory is loaded every time the power supply is resumed.

Recently, studies have been made on a circuit that has a neuron MOS (hereinafter referred to as the "νMOS") in the logic circuit blocks. This circuit has been developed as a reconfigurable logic circuit based on principles entirely different from those of the FPGA according to the LUT method (disclosed by T. Shibata and T. Ohmi in IEEE Trans. Electron Dev. ED-39 (1992) pp. 1444-1455 and IEEE Trans. Electron Dev. ED-40 (1993) pp. 570-576, and by Hiroshi Sawada, Kazuo Aoyama, Akira Nagoya, and Kazuo Nakajima in "Consideration for a Reconfigurable Logic Device using Neuron MOS Transistors", IEICE Tech. Report, Vol. 99, No. 481, (1999) pp. 41-48). Using νMOS, symmetric functions can be efficiently realized. Although the functions are limited compared with the functions according to the LUT method, attention is being drawn to this method, as a large number of symmetric functions appear in the stage of logic design.

FIG. 56 illustrates an example structure of a logic circuit that can achieve symmetric Boolean functions. This logic circuit includes three pre-inverters 201, 203, and 205 that employ νMOS structures, and a main inverter 207 that also employs the νMOS structure. In the pre-inverters that serve as input units, digital values are input via equal capacitances. The inverters 201, 203, 205, and 207 have different logic threshold values from one another. In the drawing, $V_k/n$ indicates that the number of inputs to the inverter is n, and the logic threshold value is $V_k/n$ with respect to the logic level "1".

Also, inputs are denoted by A and B, and the input of each control signal is denoted by $C_k$ (k=0, 1, 2). The input to the main inverter 207 is controlled with $C_k$, thereby achieving a desired symmetric function. In the operation of this circuit, if $C_k$ is "1", the output is "0" only when the number of "1"s in the input is k. In other cases, the output is "1". For example, if $C_0$ and $C_2$ are "1" and $C_1$ is "0", the output is "0" when the number of "1"s is 0 (A=B="0") and when the number of "1"s is 2 (A=B="1"), but the output is "1" when the number of "1"s is 1 (A or B="1"). Thus, a XOR logic circuit is obtained.

DISCLOSURE OF THE INVENTION

The above described logic blocks of the FPGA have the following problems. More specifically, the logic blocks that utilizes the LUT method and νMOS have problems in the volatility of logic functions. Also, problems are caused with respect to the number of devices (the occupied area).

First, the problems with the logic blocks according to the LUT method are described. In accordance with the LUT method, the circuit does not have capacity to rewrite to reconfigure logics, but refers to the values stored in the registers. SRAMs are employed for LUTs, the problems are caused by the volatility of the SRAMs. When the power supply is cut off, the contents of the LUTs, or the logic functions, are lost. In a case where the circuit is incorporated into a product, it is necessary to externally provide a non-volatile memory with an extremely large capacity for maintaining data. As a result, the area of the entire chip becomes larger, and the power consumption increases as a longer start-up time is required when power supply is resumed.

Also, in a case where a large number of devices (forty transistors are required in the circuit of FIG. 56C, for example) are employed to achieve symmetric Boolean functions with decoders and SRAM cells including transistors in the logic blocks, the area occupied by the logic blocks becomes larger.

Next, the problems with the logic blocks using νMOS are described. In such logic blocks, the operation of the circuit can be rewritten with a control signal, unlike in the logic blocks according to the LUT method. For two inputs, the number of MOSFETs is 8, and the number of capacitors is 14, which are almost half of the number of devices required according to the LUT method. However, the area occupied by the capacitors for the νMOS structure is not small. Also, to maintain the functions of the circuit, a control signals needs to be constantly supplied during the use of the circuit. It is also necessary to prepare a control signal of a size different from the supply voltage and to employ a control circuit (a controller) for controlling the control signal. Since functions cannot be stored in a non-volatile manner, there is a problem in the maintenance of the non-volatility for logic functions, as with the LUT method.

It is therefore an object of the present invention to provide a non-volatilely reconfigurable circuit with a small number of devices. Such a circuit should be small in size and have low power consumption.

In a circuit in accordance with the present invention, a transistor (hereinafter referred to as "spin transistor") with transfer characteristics that depend on the spin direction of the conduction carriers or the magnetization states of the ferromagnetic bodies in the transistor is employed, and the input of the transistor is formed with a vMOS transistor. The operating point of the circuit is adjusted to rewrite functions by varying the driving force of the transistor through the control of the magnetization state of the spin transistor. This circuit is based on a novel technique of rewriting functions entirely in terns of hardware, as the characteristics of the device are changed. This circuit differs from a logic block only with a vMOS in that logic functions can be maintained in a non-volatile manner and a control signal is not required for switching logic functions. Furthermore, the functions of the circuit can be stored in a non-volatile manner, by virtue of the ferromagnetic bodies in the spin transistor. Using such a logic circuit of the present invention, the above described problems in FPGA can be eliminated.

The non-volatility is now described. The functions of a circuit are determined by the magnetization states of the ferromagnetic bodies included in the spin transistor. Accordingly, even when the power supply is cut off, the logic functions are maintained in a non-volatile manner, as the magnetization states do not change. In view of this, the portion corresponding to a logic block unit that is necessary in the conventional FPGA becomes unnecessary in an external non-volatile memory. This is advantageous in reducing the chip size. Furthermore, the time for loading logic functions is not required. Accordingly, the time required for start-up can also be shortened.

In a circuit in accordance with the present invention, the logic block includes nine to eleven MOSFETs and two capacitors. Accordingly, the number of devices decreases to a third of the number of device in the LUT structure or even less than that. Compared with a logic block using only a vMOS, the number of devices is halved. Since the external non-volatile memories are employed only for the line unit, the total number of devices is much smaller than that in a conventional circuit.

A spin transistor can be employed as a switch for selecting the line that connects logic blocks. Especially, a spin MOSFET that is described later is employed as the switch, so that the mutual lines between logic blocks can also be stored in a non-volatile manner. In such a case, a non-volatile memory becomes unnecessary for the line unit. The spin MOSFET as the switch may be a depletion MOSFET or an enhancement MOSFET. Further, a transfer gate that is formed with p-channel and n-channel spin MOSFETs can also be employed.

One aspect of the present invention can provide a circuit that includes a spin transistor having transfer characteristics depending on the spin direction of conduction carriers. In this circuit, the spin direction of the conduction carriers is changed so as to vary the transfer characteristics of the spin transistor, and an operating point is changed based on the transfer characteristics, thereby reconfiguring a function.

An A-D converter is connected to an output terminal of the circuit, so that the analog operating point at the output terminal is converted to a digital logic level. Also, the A-D converter includes a spin transistor, so that functions can be reconfigured by setting a threshold value depending on the magnetization state of the spin transistor.

Instead of the spin transistor, another spin transistor with variable transfer characteristics can be employed in the circuit. In such a case, the operating point is also moved by changing the transfer characteristics of the transistor, thereby reconfiguring functions. Here, the "variable transfer characteristics" are variable solid-state properties other than the biases such as $V_{ds}$ and $V_{gs}$, and the transfer characteristics of a transistor can be varied in a non-volatile manner. Accordingly, the output characteristics vary, even when biases are applied under the same conditions. Such a transistor can be realized with a ferromagnetic material or a ferroelectric material, or can be formed by a floating gate technique (by which carriers are injected to a floating gate so as to change a threshold value). The above described spin transistor is one of the transistors with variable transfer characteristics.

BRIEF DESCRIPTION OF THE DRAWINGS

FIGS. 5A, 5B, and 5C show AND/OR reconfigurable logic circuits with E/E, E/D, and CMOS inverter structures;

FIG. 6 illustrates an example structure of a NAND/NOR reconfigurable logic circuit, with a CMOS inverter for an input;

FIGS. 9A and 9B are truth tables of the AND/OR circuit with the n-channel spin MOSFET of a depletion type;

FIG. 11 illustrates a first operation of the circuit illustrated in FIG. 10;

FIG. 12A shows the operating curve of the AND/OR function;

FIG. 12B shows a truth table of the OR circuit;

FIG. 12C shows a truth table of the AND circuit;

FIG. 14A illustrates a third operation of the circuit illustrated in FIG. 10;

FIG. 14B is a truth table of the operation;

FIG. 19A shows a first operation of the circuit illustrated in FIG. 18;

FIG. 19B shows a truth table of the operation;

FIG. 23A corresponds to FIG. 22A, showing the operation when the threshold value is varied;

FIG. 23B corresponds to FIG. 22B, showing truth table;

FIG. 25 shows the operating curve of Vin_n of the circuit illustrated in FIG. 24;

FIG. 28A shows a third operation of the circuit illustrated in FIG. 24;

FIG. 28B shows a truth table of the operation;

FIG. 32A shows a first operation of the circuit illustrated in FIG. 30;

FIG. 32B shows a truth table of the operation;

FIG. 42A shows a first operation of the circuit illustrated in FIG. 40;

FIG. 42B shows a truth table of the operation;

FIG. 43A shows a second operation of the circuit illustrated in FIG. 40;

FIG. 43B shows a truth table of the operation;

FIG. 46A shows a first operation of the circuit illustrated in FIG. 44;

FIG. 46B shows a truth table of the operation;

FIG. 50 shows truth tables of the NOR circuit and the NAND circuit shown in FIG. 48;

FIG. 51A illustrates an example structure of an NAND/NOR/XNOR circuit;

FIG. 51B shows the operating points of Vin_n of the circuit illustrated in FIG. 51A;

DESCRIPTION OF THE PREFERRED EMBODIMENTS

Figure 1A:
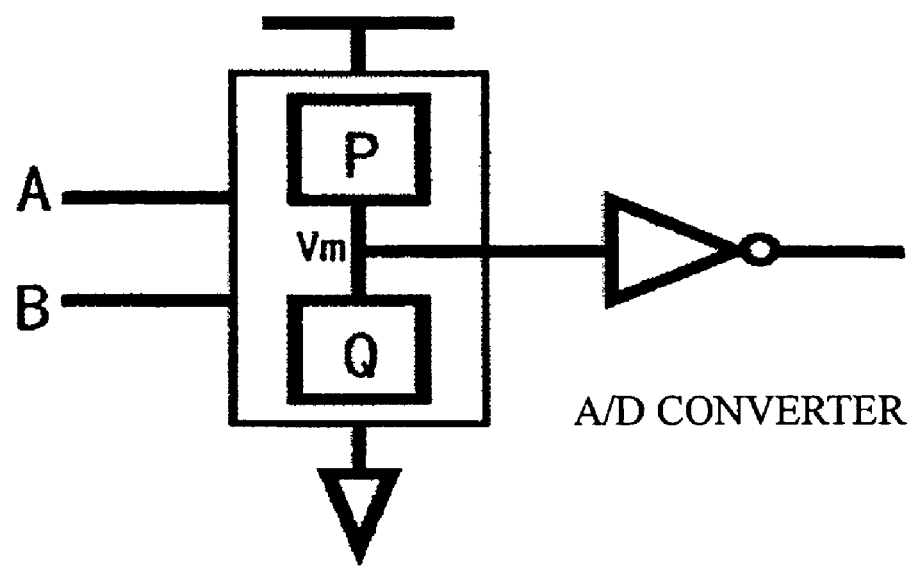
FIGS. 1A and 1B are block diagrams each illustrating the fundamental structure of a circuit in accordance with the present invention.
Figure 1B:
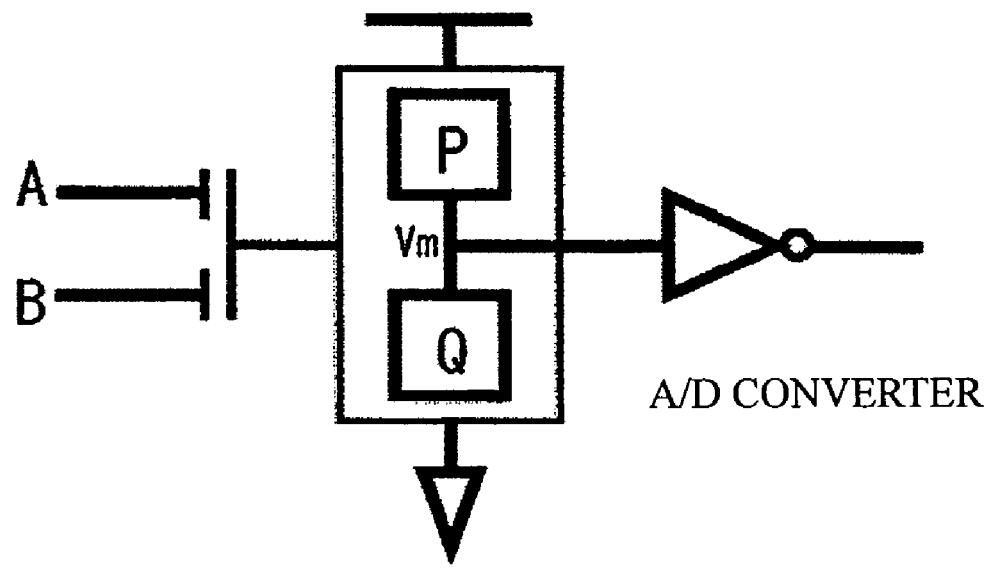

Referring to FIGS. 1A and 1B, the fundamental structure of a circuit in accordance with the present invention is described. As shown in FIGS. 1A and 1B, the circuit in accordance with the present invention includes a terminal $V_m$ (hereinafter, "$V_m$" will be used as the name of the terminal, but will also be used as the potential of the terminal), a circuit group P that charges the terminal $V_m$ with parasitic capacitance and the next stage with input capacitance, a circuit group Q for discharging, and an A-D converter that amplifies the analog voltage $V_m$ to a digital logic level. The voltage $V_m$ is determined by the values of input signals A and B, regardless of the circuit of the next stage.

As shown in FIG. 1A, a spin transistor is contained in at least one of the circuit groups P and Q, and the current control capacity can be controlled in accordance with the magnetization state of the spin transistor. Therefore, even if the input signals A and B have the same values, the voltage $V_m$ varies depending on the magnetization state of the spin transistor.

The variation of $V_m$ caused by a change in the magnetization sate of the spin transistor is amplified to the digital logic level by the A-D converter having a predetermined logic threshold value, thereby forming a reconfigurable logic circuit. Alternatively, with an A-D converter that can change the logic threshold value using the spin transistor, a reconfigurable logic circuit can be formed.

The circuit shown in FIG. 1B has a 2-input ν-MOS structure with equally weighted inputs. In a symmetric function, the input signals A and B do not need to be distinguished from each other. Accordingly, with the 2-input ν-MOS structure having equally weighted inputs, inputs can be efficiently performed to the circuit groups. If there is a need to distinguish the input signals A and B from each other, the weights on the input capacity should be made different from each other between the input signals A and B.

The circuit in accordance with the present invention contains ferromagnetic bodies made of a ferromagnetic metal or the like. This circuit is a non-volatile, reconfigurable circuit, and more particularly, is a logic circuit that employs a spin transistor that can control its transfer characteristics in accordance with the spin direction of the conduction carriers or the magnetization states of the ferromagnetic bodies. Using the spin transistor, a symmetric Boolean function can be realized with a small number of components.

In the following, the spin transistor is described in greater detail. The spin transistor has at least one ferromagnetic body (free layer) with a magnetization direction that can be independently controlled with a magnetic field or the like, and at least one ferromagnetic body (pin layer) with a fixed magnetization direction. In this spin transistor, the relative magnetization state between the free layer and the pin layer can be switched between parallel magnetization and antiparallel magnetization by changing the magnetization direction of the free layer.

In the spin transistor, output characteristics in accordance with the magnetization state inside can be realized by virtue of the conduction phenomena, such as spin-dependent scattering, a spin-dependent tunneling effect, and a spin filter effect, which depend on the spin direction of the carriers and the magnetization directions of the ferromagnetic bodies. Accordingly, the transfer characteristics of the spin transistor can be controlled in accordance with the relative magnetization direction of the pin layer with respect to the free layer contained in the spin transistor, even when the same biases are applied.

In the following, an example case where the spin transistor is a MOSFET spin transistor (hereinafter referred to as "spin MOSFET") is described. Although spin-dependent conduction phenomena are included, the transistor operation is based on the same principles as those of the operation of a conventional MOSFET. Particularly, the output characteristics can be represented by gradual channel approximation.

Figure 2A:
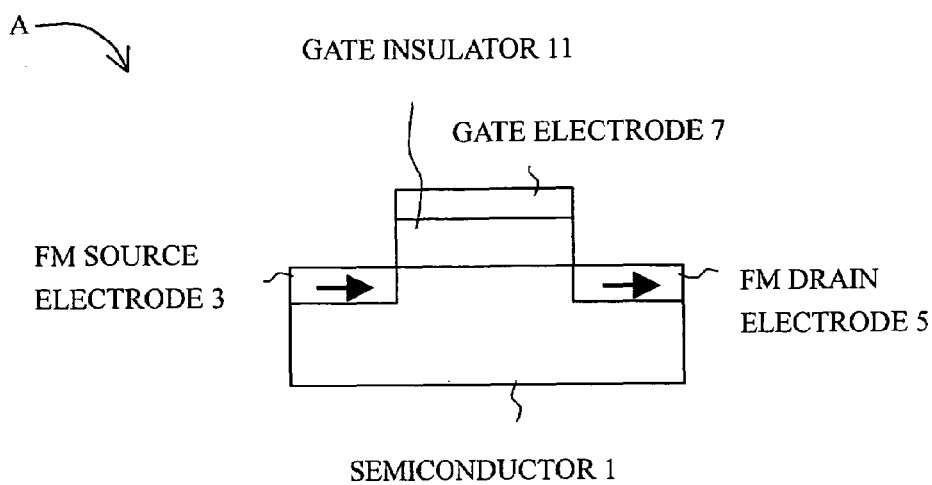
FIG. 2A illustrates an example structure of a MOSFET-type spin transistor (hereinafter referred to as "spin MOSFET")

FIG. 2A illustrates an example structure of a spin MOSFET. As shown in FIG. 2A, the spin MOSFET (A) is formed on a semiconductor (substrate) 1, and has the same structure as a conventional MOSFET, including the aspect that a gate electrode 7 is formed on a gate insulating film 11. The spin MOSFET (A) differs from a conventional MOSFET in that a source electrode 3 and a drain electrode 5 are made of a ferromagnetic material. Hereinafter, the source electrode made of a ferromagnetic material will be referred to simply as the ferromagnetic source 3, and the drain electrode made of a ferromagnetic material will be referred to simply as the ferromagnetic drain 5. In the drawings, "FM" indicates "ferromagnetic metal", but the source and drain may be made of some other electric conductive ferromagnetic material.

The ferromagnetic source 3 serves as a spin injector that injects spin-polarized carriers to a channel formed below the gate in the semiconductor 1. The ferromagnetic drain 5 serves as a spin analyzer that detects an electric signal representing the direction of the spins injected to the channel. In a case where a ferromagnetic metal (FM) is employed as the ferromagnetic material, the ferromagnetic source 3 and the ferromagnetic drain 5 are formed with the Schottky junctions with the semiconductor (substrate) 1. A gate voltage is applied to the gate electrode 7, so that spin-polarized carriers can be injected from the ferromagnetic source 3 to the channel via a Schottky barrier.

The injected spin-polarized carriers reach the ferromagnetic drain 5 via the channel (for ease of explanation, the Rashba effect caused by the gate field of the spin-polarized carriers injected to the channel is ignored). In a case where parallel magnetization is observed between the source and the drain, the spin-polarized carriers injected to the ferromagnetic drain 5 become a drain current, without adverse influence of spin-dependent scattering. In a case where antiparallel magnetization is observed, on the other hand, the ferromagnetic drain 5 is subjected to the resistance due to spin-dependent scattering. Accordingly, in the spin MOSFET, the current drive force varies depending on the relative magnetization direction between the source and the drain.

Figure 3A:
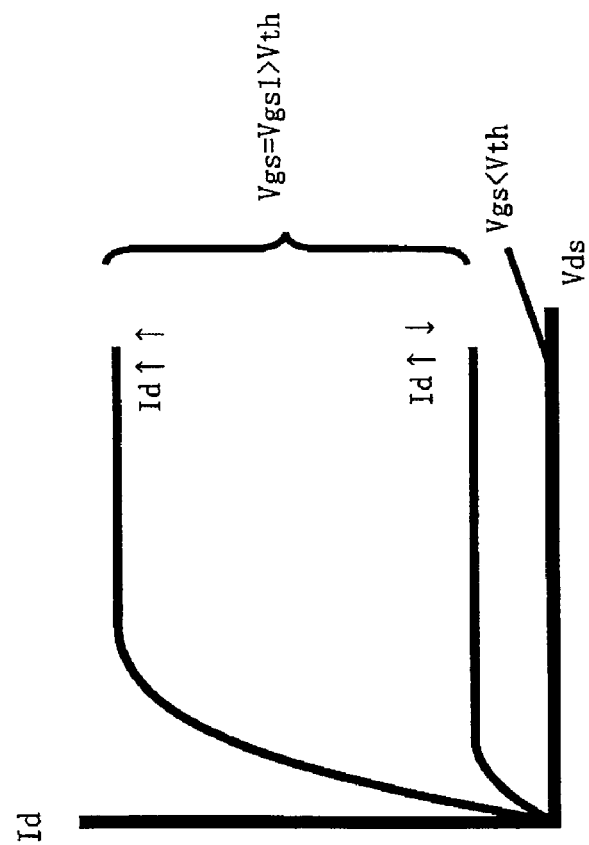
FIG. 3A shows the idealized static characteristics of a spin MOSFET.
Figure 3B:
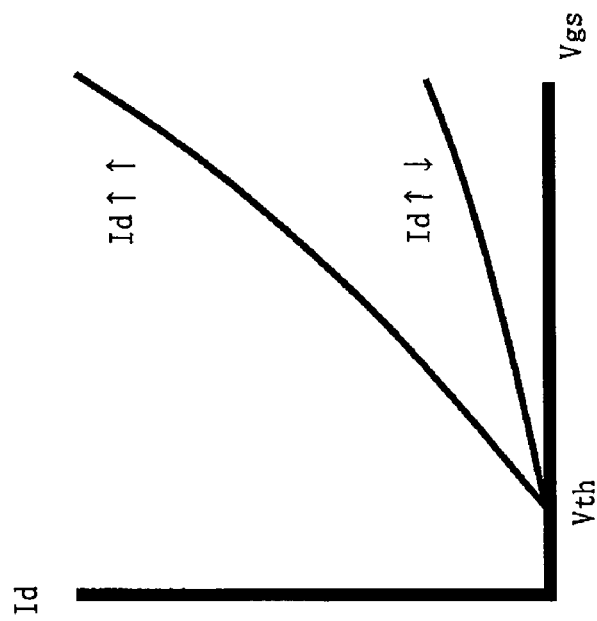
FIG. 3B shows the gate voltage dependence of the drain current.

FIGS. 3A and 3B show idealized static characteristics of a spin MOSFET. With a gate voltage equal to or lower than a threshold value ($V_{gs} < V_{th}$), the spin MOSFET is in an OFF state, as in the case of a conventional MOS transistor. This does not change with the magnetization state of the spin MOSFET. When a gate voltage equal to or higher than the threshold value ($V_{gs} = V_{gs1} < V_{th}$) is applied, the spin MOSFET is put into an ON state. However, even when the same gate voltage is applied, the drain current $I_d$ varies depending on the magnetization state of the ferromagnetic bodies included in the spin MOSFET. In the case of parallel magnetization, a high drain current $I_{d\uparrow\uparrow}$ flows. In the case of antiparallel magnetization, a low drain current $I_{d\uparrow\downarrow}$ flows. If the drain current of the spin MOSFET can be represented using the same gain coefficient as that of a conventional MOSFET, the gain coefficient is high in the case of parallel magnetization, and the gain coefficient is low in the case of antiparallel magnetization. In the following, relative parameters β representing the gain coefficients of the spin MOSFETs and the MOSFETs are introduced. With the gain coefficients of the spin MOSFETs and the MOSFETs included in the circuit being $\beta_{G1}, \beta_{G2} \ldots \beta_{GN}$ (for the spin MOSFET, the gain coefficient in the case of parallel magnetization is set separately from the gain coefficient in the case of antiparallel magnetization), the gain coefficient of the spin MOSFETs and the MOSFETs can be expressed as $\beta_{G1} = \beta_1 \beta_{G1}$, $\beta_{G2} = \beta_2 \beta_{G1}$, $\beta_{G3} = \beta_3 \beta_{G1} \ldots \beta_{GN} = \beta_N \beta_{G1}$, using the gain coefficient $\beta_{G1}$. With the coefficients $\beta_1 (=1), \beta_2, \ldots \beta_N$, the magnitude correlation among the gain coefficients of the transistors can be expressed. Although the magnitude correlation among the gain coefficients $\beta_1, \beta_2, \ldots \beta_N$ is expressed with given numerals, the numeric values β are merely examples of representations of the magnitude correlation, and those numeric values do not limit the scope of the present invention. Also, the magnitude correlation among the gain coefficients $\beta_1, \beta_2, \ldots \beta_N$ indicates an example of the magnitude correlation among output currents when the same bias is applied to the MOSFET and the spin MOSFET, including a case where the output characteristics of the spin MOSFET cannot be expressed with the output characteristics of the conventional MOSFET.

Figure 2B:
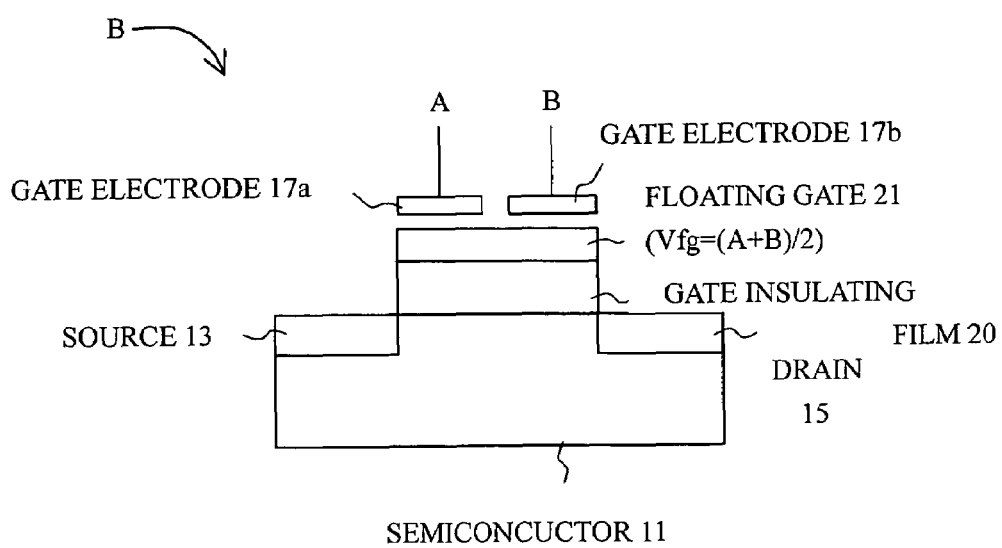
FIG. 2B illustrates an example structure of a vMOS (B)
Figure 4:
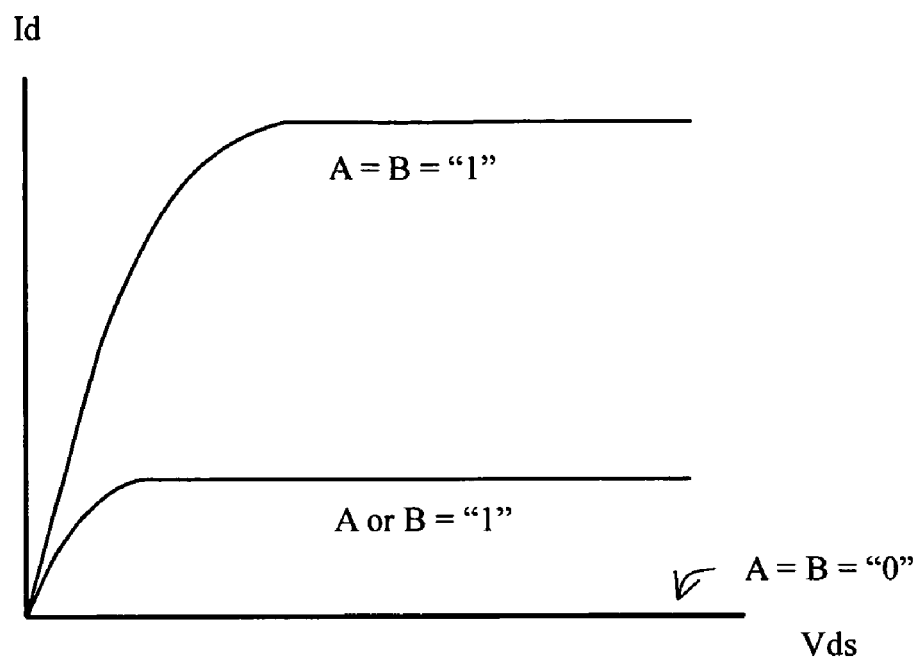
FIG. 4 shows the static characteristics of the vMOS transistor of FIG. 2B, with the inputs A and B being digital values.

Next, a νMOS structure is described in conjunction with FIG. 2B and FIG. 4. As shown in FIG. 2B, a MOSFET (B)

with a νMOS structure includes a source 13 and a drain 15 that are formed on a semiconductor 11, a floating gate 21 formed above the semiconductor 11 via a gate insulating film 20, and two divided gate electrodes 17a and 17b. As described above, inputs A and B are input to the gates 17a and 17b of the νMOS structure via the input capacitances of the gate electrode and the floating gate. The inputs can be weighted by varying the magnitudes of the gate electrode and the floating gate. Here, a case where all the input capacitances are equal to one another is described as an example.

In the 2-input νMOS structure shown in FIG. 2B, the potential $V_{fg}$ of the floating gate 21 is represented by the input mean value, which is $V_{fg}=(A+B)/2$, obtained by coupling of capacitances in a case where the gate capacitance can be ignored. Likewise, in a case of multiple inputs (n inputs (n>2)), it is safe to assume that the mean value of the n inputs is input to the floating gate. FIG. 4 shows the static characteristics in a case where the inputs A and B are digital values. However, the inputs may be analog values. As shown in FIG. 4, in the case of A=B="0", the drain current $I_d$ hardly flows. In the case of A=B="1", the drain current $I_d$ flows. When either A or B is "1", the drain current that is equivalent to that obtained by applying a gate voltage half the above described gate voltage is generated. In the symmetric function, the input signals A and B do not need to be distinguished from each other. Accordingly, using the equally-weighted 2-input νMOS structure, input can be efficiently performed to the circuit groups.

An AND/OR reconfigurable logic circuit can be realized using the inputs of the νMOS structure and an inverter structure having an E/E configuration, an E/D configuration, or a CMOS configuration formed with spin MOSFETS and conventional MOSFETS as the circuit structure of the circuit group P and the circuit group Q. FIGS. 5A, 5B, and 5C illustrate AND/OR reconfigurable logic circuits using the inverter structures of the E/E configuration, the E/D configuration, and the CMOS configuration. Hereinafter, each spin MOSFET will be indicated by a transistor symbol with an arrow. In the drawings, spin MOSFETs are used for active loads (Q2) of the inverters of the E/E configuration, the E/D configuration, and the CMOS configuration. However, spin MOSFETs may be used for drivers (Q1). Alternatively, both the active loads (Q2) and the drivers (Q1) may be formed with spin MOSFETs. The input νMOS structure is used for the drivers (Q1) in the E/E configuration and the E/D configuration. In the CMOS configuration, the νMOS structure is realized with a floating gate shared between Q2 and Q1. The inverter in the output stage is used to divide the output of $V_m$ into the logic levels of "1" and "0". This inverter serves as an A-D converter. The active load Q2 in each of FIGS. 5A through 5C forms the circuit group P, while the driver Q1 forms the circuit group Q. Further, an extra circuit for controlling the potential of $V_m$ in each of the circuits of FIGS. 5A through 5C is added to the circuit group P and the circuit group Q, thereby achieving a complicated, reconfigurable logic circuit.

As shown in FIG. 6, it is also possible to achieve the operation equivalent to that of the νMOS structure by employing CMOS inverters for inputs, instead of the capacitance coupling. In such a case, however, a logic function that is obtained by inverting the logic function of FIGS. 5A through 5C is output.

Next, a reconfigurable logic circuit in accordance with a first embodiment of the present invention is described in conjunction with the accompanying drawings. In the logic circuit in accordance with this embodiment, the driver or the active load of an E/D inverter circuit formed with an enhancement MOSFET and a depletion MOSFET is replaced with a spin MOSFET. To replace the driver, an enhancement spin MOSFET should be employed. To replace the active load, a depletion spin MOSFET should be employed. The input νMOS structure is used for the driver. As for the inverter of the output stage, a CMOS inverter is most preferred in terms of performance, but it is possible to employ an inverter of another type, such as an E/D inverter.

The load curve in the E/E configuration varies according to the voltage generated in the driver. With the E/D configuration, on the other hand, the load curve with the active load is saturated. Accordingly, a wider logic margin can be allowed.

1) AND/OR Circuit

Figure 7:
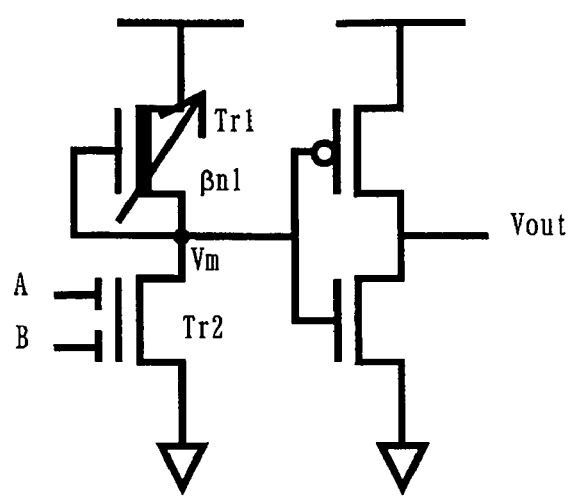
FIG. 7 illustrates an AND/OR circuit with a n-channel spin MOSFET of a depletion type.
Figure 8:
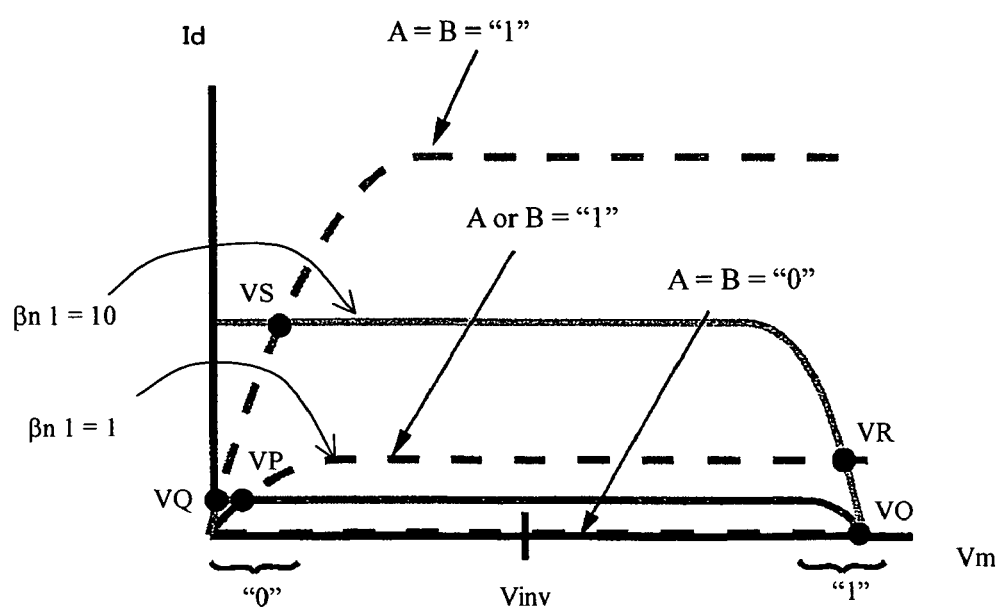
FIG. 8 shows the operating curve of an AND/OR circuit with the n-channel spin MOSFET of a depletion type.
Figures 9, 10:
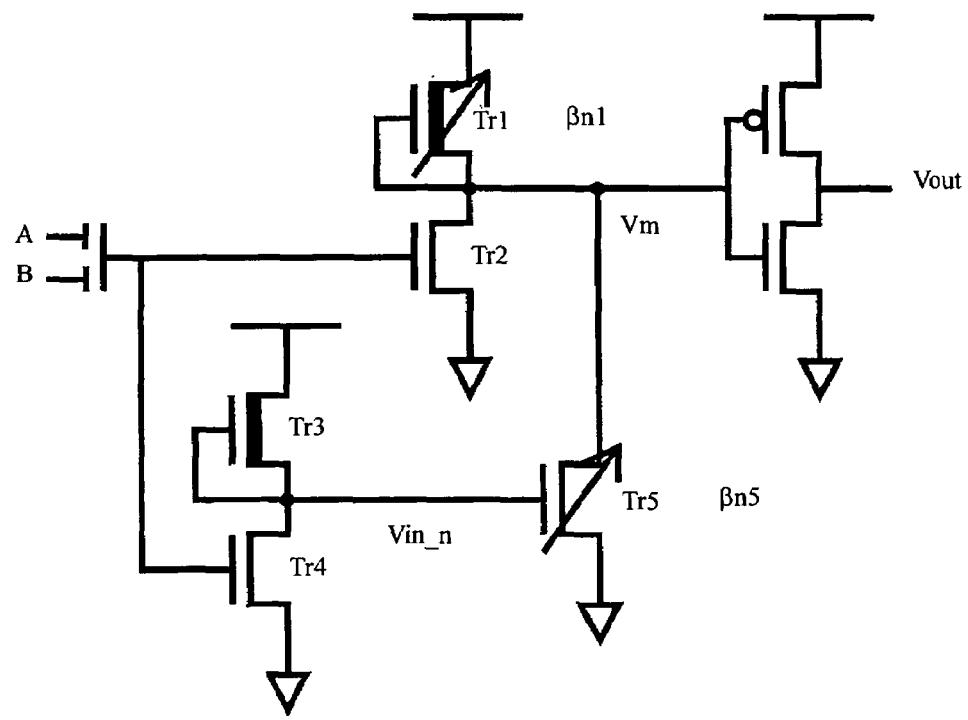
FIG. 10 illustrates a circuit that has a XNOR function added to the circuit illustrated in FIG. 7.

Referring now to FIGS. 7 through 9, an AND/OR circuit with a n-channel spin MOSFET of a depletion type is described. In FIG. 7, the n-channel spin MOSFET of a depletion type is denoted by Tr1, and the parameter $\beta_{n1}$ can be 1 or 10 in the case of antiparallel magnetization or parallel magnetization. Since the source and the gate of Tr1 are short-circuited, the load curve is saturated with respect to Vm as indicated by the solid line in FIG. 8. A νMOS structure is used for the input of a transistor Tr2, and its operation can be as indicated by the broken line in FIG. 8. FIGS. 9A and 9B are the truth tables of this circuit. Also, the details of the operation are shown in Table 1.

TABLE 1

| | | $V_m$ | | | $V_{out}$ | | | |
|---|---|---|---|---|---|---|---|---|
| $\beta_{n1}$ | A<br>B | 0<br>0 | 0<br>1 | 1<br>1 | (in order of Vm) | | | function |
| 1 | | $V_O$("1") | $V_P$("0") | $V_Q$("0") | "0" | "1" | "1" | OR |
| 10 | | $V_O$("1") | $V_R$("1") | $V_S$("0") | "0" | "0" | "1" | AND |

In a case where the circuit functions as an OR circuit, the spin MOSFET is put into the antiparalell magnetization configuration, and the parameter $\beta_{n1}$ is set at 1, with which the current driving capacity is small. Here, in the case of A=B="0", the operating point $V_m$ is $V_O$ according to FIG. 8, and the output $V_{out}$ is inverted and amplified to "0". In the case of A or B="1" (hereinafter, (A, B)=("1", "0") or (A, B)=("0", "1") will be expressed simply as A or B="1"), the operating point $V_m$ is $V_P$, and accordingly, the output $V_{out}$ is "1". In the case of A=B="1", the operating point $V_m$ is $V_Q$, and accordingly, the output $V_{out}$ is "1".

In a case where the circuit functions as an AND circuit, the spin MOSFET is put into the paralell magnetization configuration, and the parameter $\beta_{n1}$ is set at 10, with which the current driving capacity is large. Here, in the case of A=B="0", the operating point $V_m$ is $V_O$, and accordingly, the output $V_{out}$ is "0". In the case of A or B="1", the operating point $V_m$ is $V_R$, and accordingly, the output $V_{out}$ is "0". In the case of A=B="1", the operating point $V_m$ is $V_S$, and accordingly, the output $V_{out}$ is "1".

2) AND/OR/XNOR Circuit

FIG. 10 illustrates a circuit in which an XNOR function is added to the circuit shown in FIG. 7. The XNOR function is added as a Q group that is a circuit in which the input/output correlation is the same as that in an AND circuit, in the case of A or B="0" and A=B="1", and $V_{out}$ is "1" ($V_m$ is "0") in the case of A=B="0". In FIG. 10, the transistors Tr3 through Tr5 are the added part. The transistors Tr3 and Tr4 that forms an inverter serve as a level shifter. As shown in FIG. 11, the transistor Tr5 is energized (is put into an ON state) only when A and B are "0". The transistor Tr5 is a spin MOSFET, but the variation of $\beta_{n5}$ according to the magnetization state is designed to be greater than the variation of $\beta_{n1}$ of the transistor 1. For example, $\beta_{n5}$ is 0.5 or 50 in the case of antiparallel magnetization or parallel magnetization. In the case of parallel magnetization, $\beta_{n5}$ is 50, with which a sufficiently high current ($I_{d\_high}$) flows. In the case of antiparallel magnetization, $\beta_{n5}$ is 0.5, with which the current value ($I_{d\_low}$) is very small. FIGS. 12A through 14B show the operating point $V_m$ with respect to each parameter $\beta$. The sum of currents flowing through the transistors Tr2 and Tr5 is indicated by solid lines, and the current $I_{d\_low}$ can be ignored. The circuit functional correlation between $\beta_{n1}$ and $\beta_{n5}$ is shown in Table 2.

TABLE 2

| | | | $V_m$ | | | | | |
|---|---|---|---|---|---|---|---|---|
| | | A | 0 | 0 | 1 | | $V_{out}$ | |
| $\beta_{n1}$ | $\beta_{n5}$ | B | 0 | 1 | 1 | (in order of Vm) | | function |
| 1 | 0.5 | | $V_O$("1") | $V_P$("0") | $V_Q$("0") | "0" | "1" | "1" | OR |
| 10 | 0.5 | | $V_O$("1") | $V_R$("1") | $V_S$("0") | "0" | "0" | "1" | AND |
| 1 | 50 | | $V_T$("0") | $V_R$("1") | $V_S$("0") | "1" | "0" | "1" | XNOR |
| 10 | 50 | | $V_U$("0") | $V_R$("0") | $V_V$("0") | "1" | "1" | "1" | all "1" |

Referring first to FIGS. 12A through 12C, the AND/OR function is described. The transistor Tr5 is put into an antiparalell magnetization configuration, and the current driving capacity is made very small ($\beta_{n5}$=0.5). By doing so, the flowing current $I_{d\_low}$ can be ignored, and the corresponding portion is regarded as open. As a result, the circuit has the same structure as that of the circuit shown in FIG. 7, and the AND(FIG. 12C)/OR(FIG. 12B) function can be maintained.

Figures 13A, 13B:
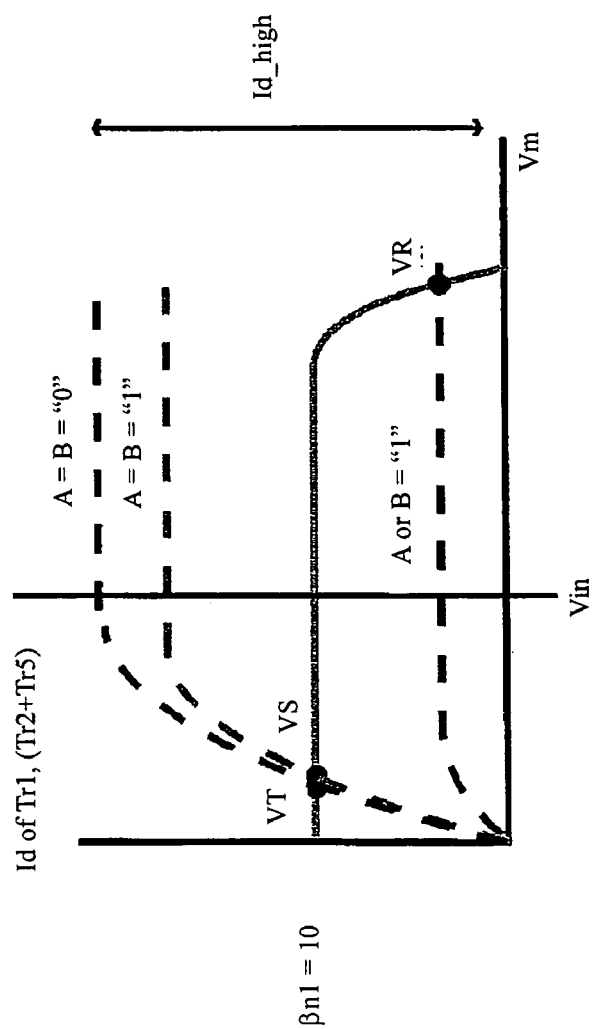
FIG. 13A shows the operating curve of the XNOR function.
FIG. 13B shows a truth table of the XNOR circuit.

Next, the XNOR function is described in conjunction with FIGS. 13A and 13B. The transistor Tr5 is put into a paralell magnetization configuration, and the current driving capacity is made high ($\beta_{n5}$=50). The transistor Tr2 is also put into a paralell magnetization configuration ($\beta_{n1}$=10) as in the case of AND. In the case of A=B="1" or A or B="1", the transistor Tr5 is regarded as open, and accordingly, functions as an AND circuit. In the case of A=B="0", $V_m$ is discharged by the current $I_{d\_high}$ of the transistor Tr5, to obtain $V_m$=$V_T$<$V_{inv}$ and $V_{out}$="1". Further, when the transistor Tr1 is put into an antiparalell magnetization configuration ($\beta_{n1}$=1) and the transistor Tr5 is put into a paralell magnetization configuration ($\beta_{n5}$=50), $V_{out}$ becomes "1" for all the inputs (see FIGS. 14A and 14B). This circuit is characterized in that the operating point $V_m$ is always close to 0V or $V_{dd}$, and the logic margin is wide.

3) AND/OR/XNOR/NAND/NOR/XOR Functions

Figure 15:
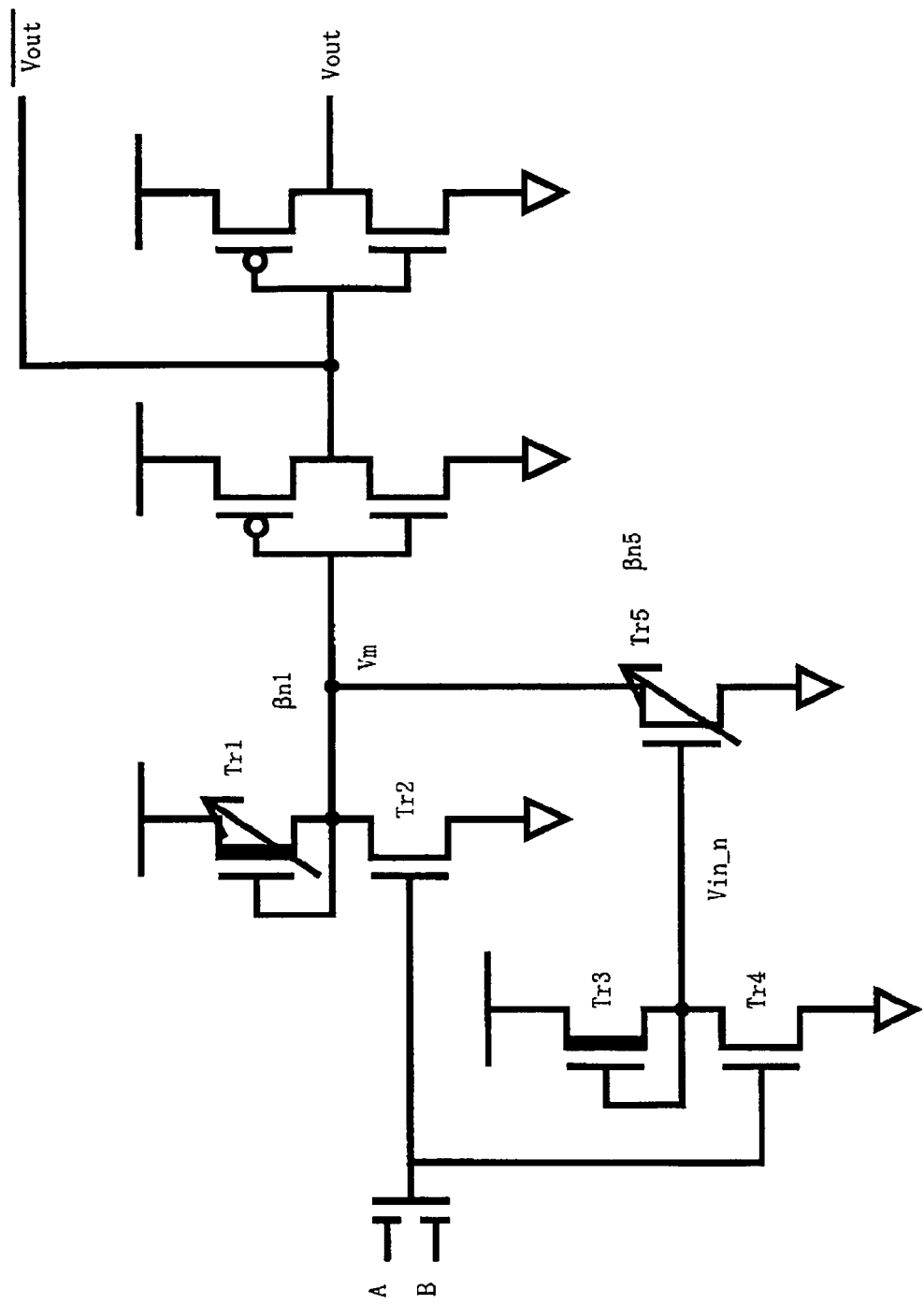
FIG. 15 illustrates the structure of a circuit that can reconfigure all the symmetric Boolean functions.

In a circuit shown in FIG. 15, another stage of an inverter circuit is added to the output. The details of the operation of this circuit are shown in Table 3. Basically, this circuit is the same as the circuit illustrated in FIG. 10, but all the symmetric Boolean functions can be realized with $V_{out}$ and its inverted output.

TABLE 3

| | | | $V_{out}$ | | | | $\overline{V_{out}}$ | | | |
|---|---|---|---|---|---|---|---|---|---|---|
| | | A | 0 | 0 | 1 | A | 0 | 0 | 1 | |
| $\beta_{n1}$ | $\beta_{n5}$ | B | 0 | 1 | 1 | B | 0 | 1 | 1 | function |
| 1 | 0.5 | | "0" | "1" | "1" | | "1" | "0" | "0" | OR/NOR |
| 10 | 0.5 | | "0" | "0" | "1" | | "1" | "1" | "0" | AND/NAND |
| 1 | 50 | | "1" | "0" | "1" | | "0" | "1" | "0" | XNOR/XOR |
| 10 | 50 | | "1" | "1" | "1" | | "0" | "0" | "0" | all "1"/ all "0" |

Next, a reconfigurable logic circuit in accordance with a second embodiment of the present invention is described in conjunction with the accompanying drawings. A logic circuit in accordance with this embodiment can be formed by using a spin MOSFET for either the n-channel MOSFET or the p-channel MOSFET in a CMOS inverter, or using spin MOSFETs for both the n-channel MOSFET and the p-channel MOSFET. The vMOS structure used for the input is formed with a floating gate shared by the n-channel device and the p-channel device. The inverter of the output stage is a conventional inverter of the CMOS configuration.

In accordance with this embodiment, the operating curve is saturated as in the E/D configuration, and accordingly, the mean logic margin can be made wider. Also, it is effective for low power consumption.

1) Threshold Value Variable Inverter

Figure 16B:
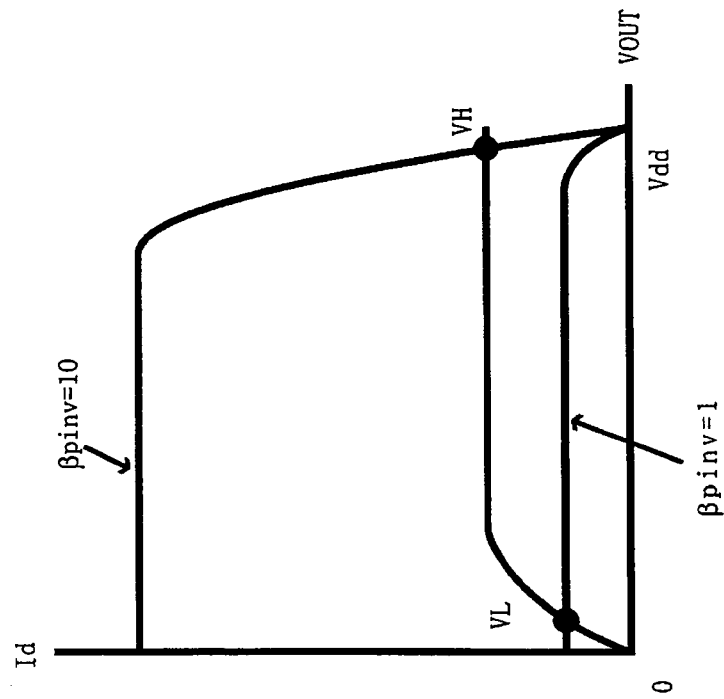
FIG. 16B illustrates an example operation of the inverter.
Figure 16A:
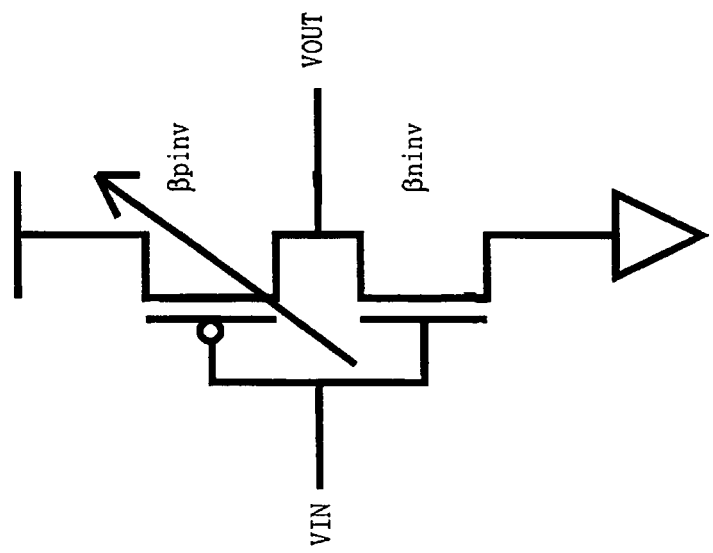
FIG. 16A illustrates the circuit structure of a threshold value variable inverter.

FIG. 16A is a circuit diagram of an inverter having a variable logic threshold value. In this circuit, the n-channel MOSFET and the p-channel MOSFET of a conventional CMOS inverter are replaced with a p-channel spin MOSFET. Here, the current driving capacity of the p-channel spin MOSFET in the case of parallel magnetization and antiparallel magnetization is made $p_{inv}$=1 or 10, and the current driving capacity of the n-channel spin MOSFET is a value between 1 and 10. The logic threshold value of the inverter circuit shown in FIG. 16A varies according to the combination of parameters $\beta$. FIG. 16B shows the characteristics of both spin MOSFETs in a case where the parameter $\beta_{ninv}$ is fixed while the parameter $\beta_{pinv}$ is set to 1 or 10. Although the input is constant, the output $V_{out}$ is $V_L$ of the low level when the parameter $\beta_{pinv}$ is 1, and the output $V_{out}$ is $V_H$ of the high level when the parameter $\beta_{pinv}$ is 10. In this manner, the output $V_{out}$ varies according to the current driving capacity of the p-channel spin MOSFET. More quantitatively, this can be explained as follows.

The inverter circuit shown in FIG. 16A can be considered as the same as a conventional CMOS inverter. In such a case, the p-channel spin MOSFET and the n-channel spin MOSFET operate in the saturation region. With the drain current $I_d$ flowing through the n-channel spin MOSFET and the p-channel spin MOSFET, the following equation can be obtained:

$$V_{inv} = \frac{V_{dd} - |V_{thp}| + V_{thn}\sqrt{\beta_{inv}}}{1 + \sqrt{\beta_{inv}}} \quad \text{[Equation 1]}$$

where $$\beta_{inv} = \frac{\beta_{ninv}}{\beta_{pinv}}$$

Figure 17:
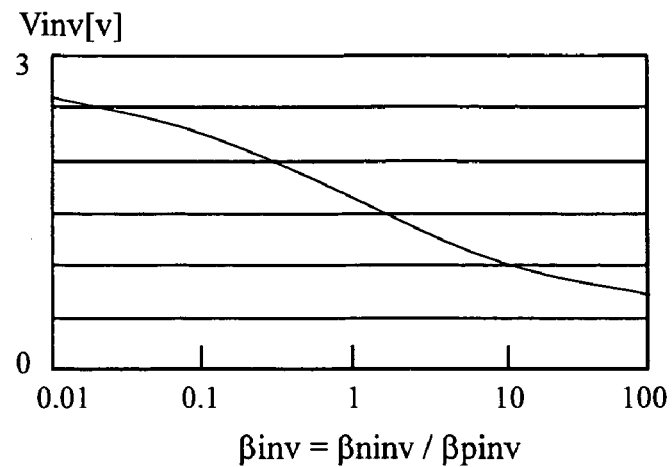
FIG. 17 has the threshold value of a conventional CMOS inverter as the function of the ratio of β of a pMOS to β of an nMOS.

Here, the logic threshold value $V_{inv}$ is plotted as the function of the driving force ratio $\beta_{inv}$=$\beta_{ninv}$/$\beta_{pinv}$ in FIG. 17, with $V_{dd}$ being 3.3V and $V_{thn}$ being |$V_{thp}$|=0.5V. As shown in FIG. 17, the threshold value according to the ratio $\beta_{inv}$=0.1, 1, 10 can be obtained.

2) AND/OR

Figure 18:
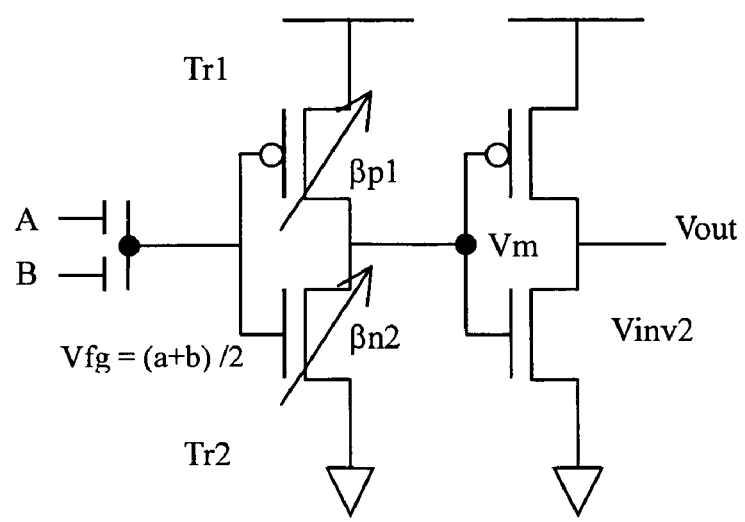
FIG. 18 illustrates an example structure of an AND/OR circuit.

FIG. 18 illustrates an AND/OR circuit that employs the threshold value variable inverter shown in FIG. 16A. As shown in FIG. 18, the AND/OR circuit is formed with inverters of two stages. The inverter at the input side is a threshold value variable inverter, and the inverter at the output side is a conventional inverter (with a threshold value $V_{inv2}$=$V_{dd}$/2). The operating characteristics of the circuit shown in FIG. 18 are shown in FIGS. 19A and 19B. In FIG. 19A, the solid line indicates the characteristics of the transistor Tr1, and the broken line indicates the characteristics of the transistor Tr2. The details of the operation of this circuit are shown in Table 4.

TABLE 4

| | | | $V_m$ | | | | |
|---|---|---|---|---|---|---|---|
| $\beta_{n1}$ | $\beta_{n2}$ | A<br>B | 0<br>0 | 0<br>1 | 1<br>1 | $V_{out}$<br>(in order of Vm) | function |
| 1 | 10 | | $V_O$("1") | $V_P$("0") | $V_Q$("0") | "0"  "1"  "1" | OR |
| 10 | 1 | | $V_O$("1") | $V_R$("1") | $V_Q$("0") | "0"  "0"  "1" | AND |

2-1) OR

Referring now to FIGS. 19A and 19B, an OR circuit is described. In a case where the circuit illustrated in FIG. 18 functions as an OR circuit, the transistor Tr1 is put into an antiparalell magnetization configuration ($\beta_{p1}$=1), and the transistor Tr2 is put into a paralell magnetization configuration ($\beta_{n2}$=10). Here, in the case of A=B="0", the operating point $V_m$ is $V_O$ according to FIG. 19A, and the output $V_{out}$ is inverted and amplified to "0". In the case of A or B="1", the operating point $V_m$ is $V_P$, and the output $V_{out}$ is "1". In the case of A=B="1", the operating point $V_m$ is $V_Q$, and the output $V_{out}$ is "1".

2-2) AND

Figure 20B:
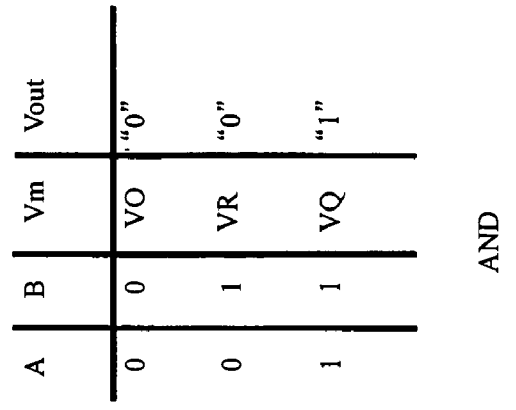
FIG. 20B shows a truth table of the operation.
Figure 20A:
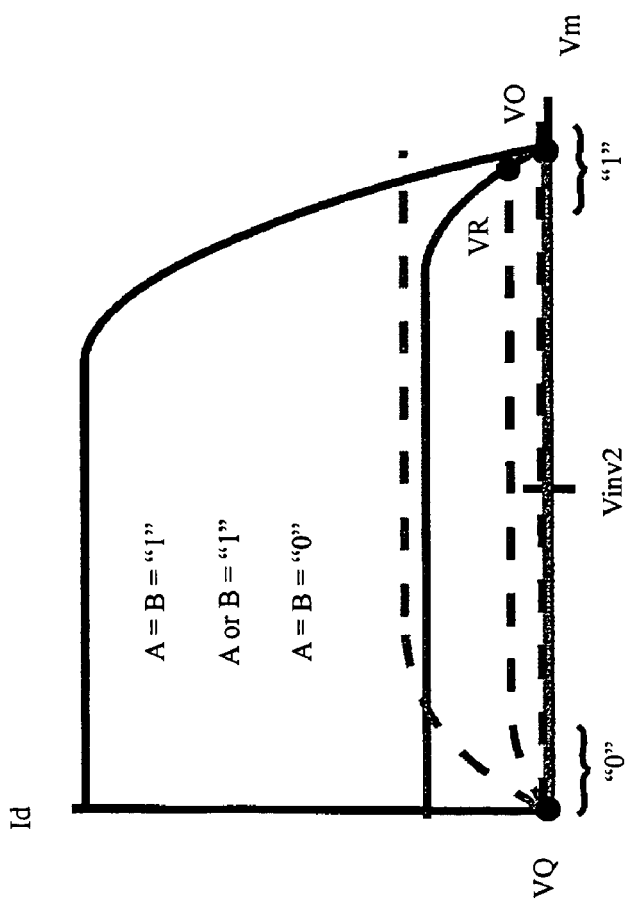
FIG. 20A shows a second operation of the circuit illustrated in FIG. 18.

Referring now to FIGS. 20A and 20B, an AND circuit is described. The transistor Tr1 is put into a paralell magnetization configuration ($\beta_{p1}$=10), and the transistor Tr2 is put into an antiparalell magnetization configuration ($\beta_{n2}$=1). Here, in the case of A=B="0", the operating point $V_m$ is $V_O$, and the output $V_{out}$ is inverted and amplified to "0". In the case of A or B="1", the operating point $V_m$ is $V_R$, and the output $V_{out}$ is "0". In the case of A=B="1", the operating point $V_m$ is $V_Q$, and the output $V_{out}$ is "1".

As can be seen from FIGS. 21 through 23B, the threshold value $V_{inv1}$ of the threshold value variable inverter (formed with the transistors Tr1 and Tr2) at the input side may be regarded as the reference value. In the following, the operation in such a case is described.

2-3) OR

Figure 21:
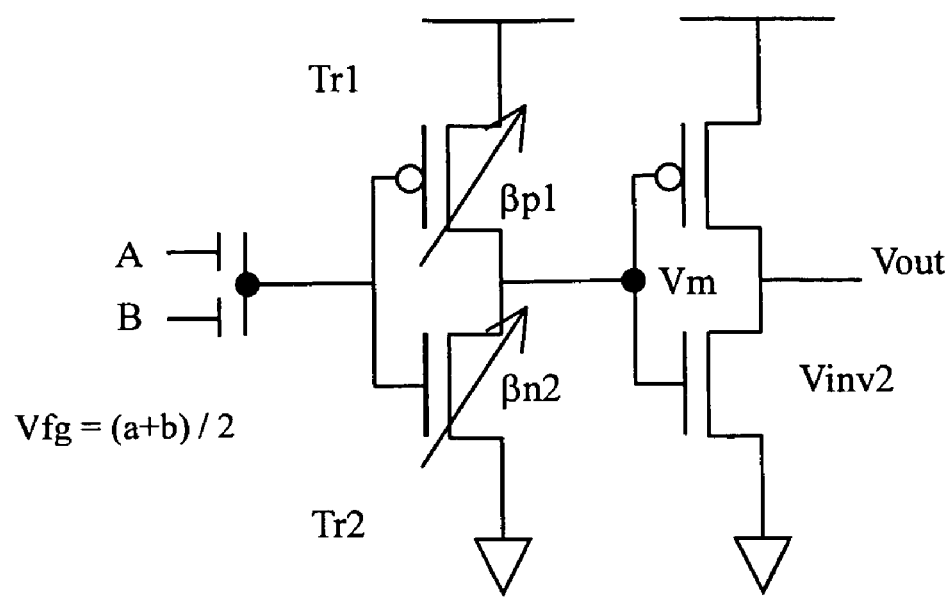
FIG. 21 shows another example structure of an AND/OR circuit.
Figure 22B:
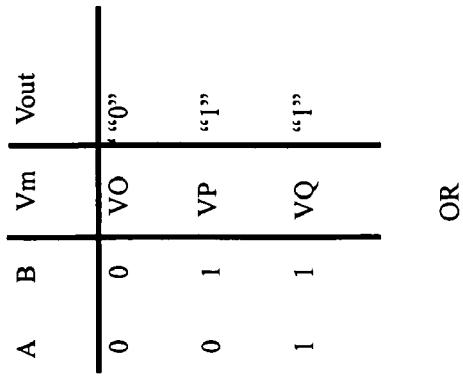
FIG. 22B shows a truth table of the inverter.
Figure 22A:
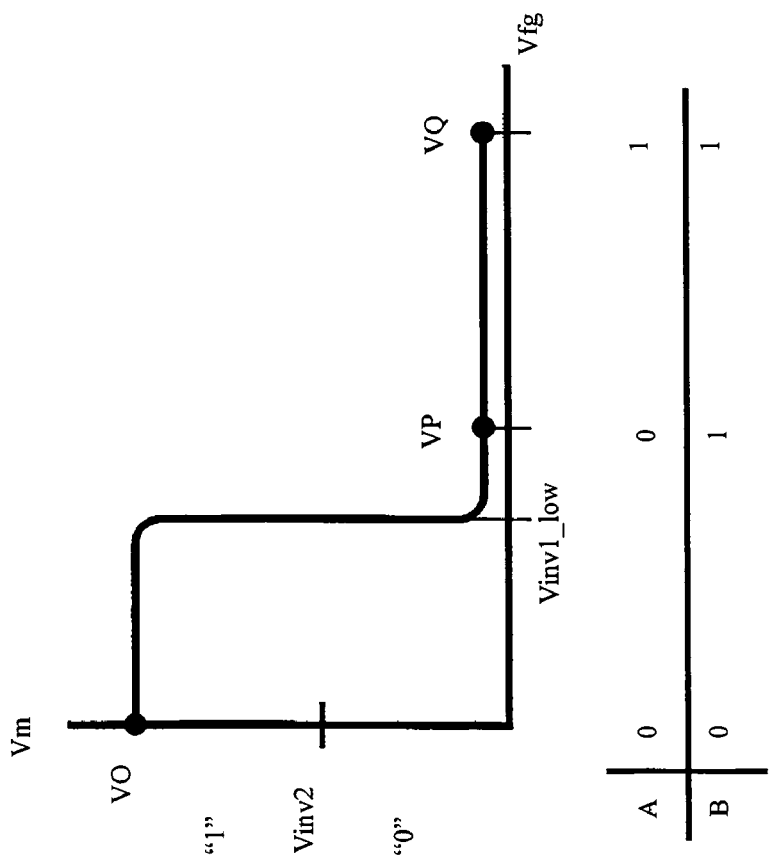
FIG. 22A shows the characteristics of the variable threshold value inverter of FIG. 21.

When the transistor Tr1 is put into an antiparalell magnetization configuration ($\beta_{p1}$=1) and the transistor Tr2 is put into a paralell magnetization configuration ($\beta_{n2}$=10) in a circuit illustrated in FIG. 21, the logic threshold value $V_{inv1}$ becomes $V_{inv1\_low}<V_{dd}/2$, as shown in FIG. 22A. Also as shown in FIGS. 22A and 22B, in the case of A=B="0", $V_{fg}$ becomes "0". Accordingly, the operating point $V_m$ is $V_O$="1", and the output $V_{out}$ is "0". In the case of A or B="1", $V_{fg}$ is $V_{dd}/2>V_{inv1\_low}$. Accordingly, the operating point $V_m$ is $V_P$="0", and the output $V_{out}$ is "1". In the case of A=B="1", $V_{fg}$ is $V_{dd}$. Accordingly, the operating point $V_m$ is $V_Q$="0", and the output $V_{out}$ is "1".

2-4) AND

When the transistor Tr1 is put into a paralell magnetization configuration ($\beta_{p1}$=10) and the transistor Tr2 is put into an antiparalell magnetization configuration ($\beta_{n2}$=1) in the circuit illustrated in FIG. 21, the logic threshold value $V_{inv1}$ becomes $V_{inv1\_high}>V_{dd}/2$, as shown in FIG. 23A. In the case of A=B="0", $V_{fg}$ becomes "0". Accordingly, the operating point $V_m$ is $V_O$="1", and the output $V_{out}$ is "0". In the case of A or B="1", $V_{fg}$ is $V_{dd}/2<V_{inv1\_low}$. Accordingly, the operating point $V_m$ is $V_R$="1", and the output $V_{out}$ is "0". In the case of A=B="1", $V_{fg}$ is $V_{dd}$. Accordingly, the operating point $V_m$ is $V_Q$="0", and the output $V_{out}$ is "1".

3) AND/OR/XNOR

Figure 24:
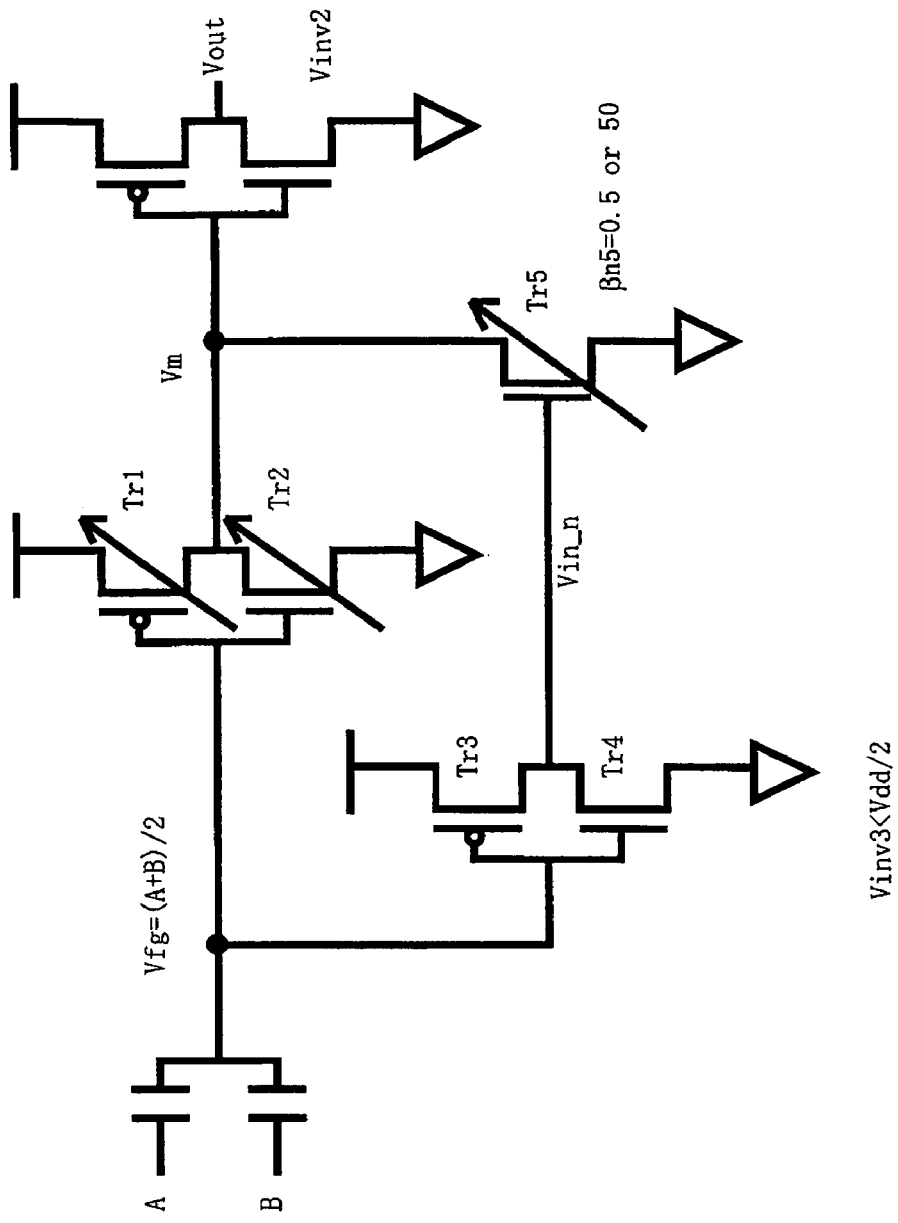
FIG. 24 illustrates an example structure of an AND/OR/XNOR circuit.
Figure 26A:
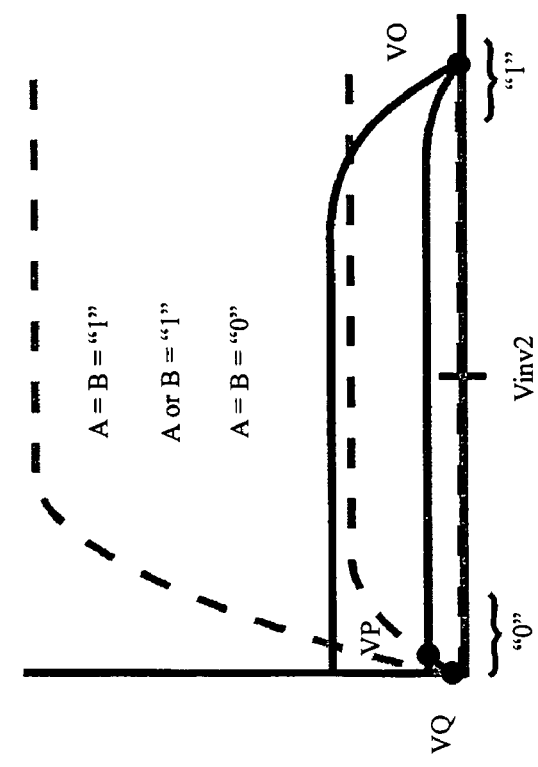
FIG. 26A shows a first operation of the circuit illustrated in FIG. 24.
Figure 26B:
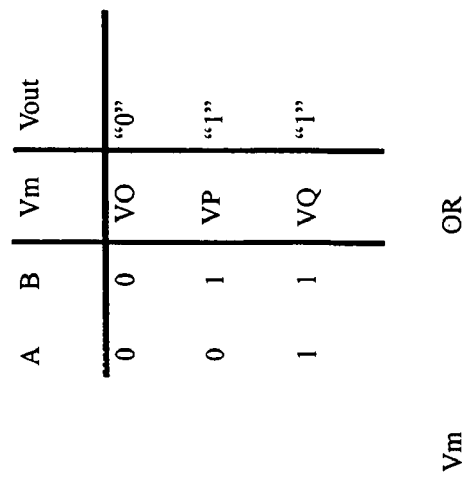
FIG. 26B shows a truth table of the operation.
Figure 27A:
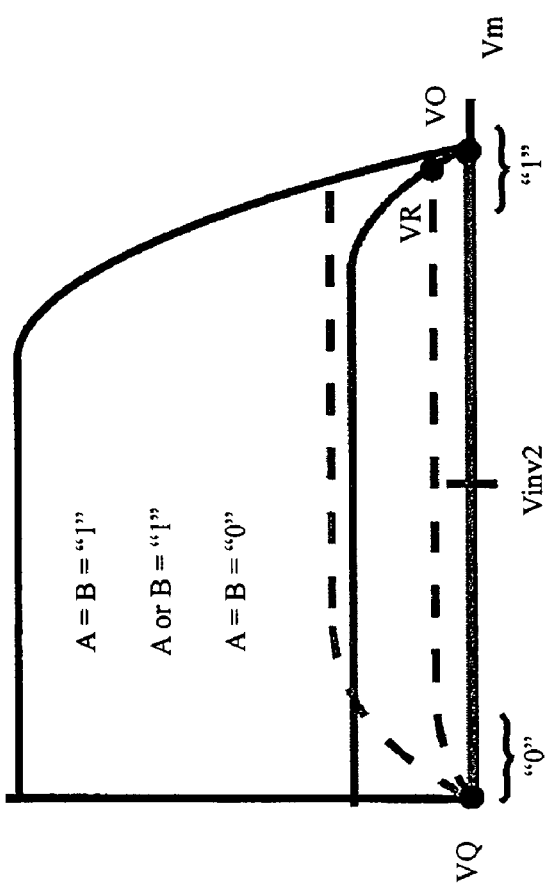
FIG. 27A shows a second operation of the circuit illustrated in FIG. 24.
Figure 27B:
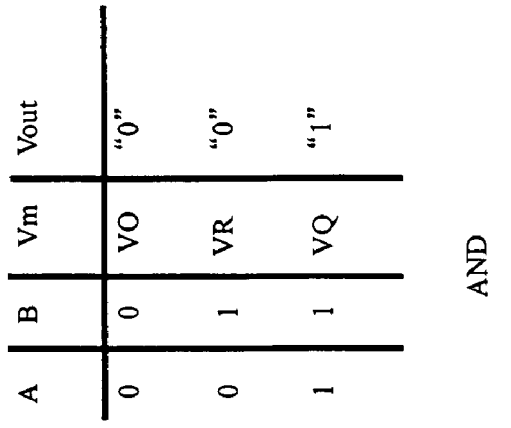
FIG. 27B shows a truth table of the operation.

FIG. 24 illustrates an AND/OR/XNOR circuit. The principles of the operation are the same as in the case of the circuit shown in FIG. 10. In the XNOR circuit, the input/output correlation is the same as that in the AND circuit in the case where A=B="1" or A or B="1", but is different from that in the AND circuit only in the case where A=B="0", with $V_{out}$ being "1" ($V_m$="0"). This function can be realized by adding a circuit formed with the transistors Tr3, Tr4, and Tr5 (an n-channel spin MOSFET) to the circuit group Q. The inverter (a level shifter) formed with the transistors Tr3 and Tr4 has a threshold value $V_{inv3}$ lower than $V_{dd}/2$. Accordingly, only in the case where A=B="0", $V_{in\_n}$ becomes "1", and the transistor Tr5 is turned on. The variation in the current driving capacity $\beta_{n5}$ of the transistor Tr5 between parallel magnetization and antiparallel magnetization is wider than that in the case of the transistors Tr1 and Tr2, and $\beta_{n5}$ is 0.5 (antiparallel magnetization) or 50 (parallel magnetization). In the case of parallel magnetization ($\beta_{n5}$=50), a sufficiently high current ($I_{d\_high}$) flows, but in the case of antiparallel magnetization ($\beta_{n5}$=0.5), the value of the current ($I_{d\_low}$) is very small (see the upper and lower graphs in FIG. 25).

The details of the operation are shown in Table 5.

TABLE 5

| | | | | $V_m$ | | | |
|---|---|---|---|---|---|---|---|
| $\beta_{p1}$ | $\beta_{n2}$ | $\beta_{n5}$ | A<br>B | 0<br>0 | 0<br>1 | 1<br>1 | $V_{out}$ (in<br>order of Vm) function |
| 1 | 10 | 0.5 | | $V_O$("1") | $V_P$("0") | $V_Q$("0") | "0"  "1"  "1"  OR |
| 10 | 1 | 0.5 | | $V_O$("1") | $V_R$("1") | $V_Q$("0") | "0"  "0"  "1"  AND |
| 1 | 10 | 50 | | $V_T$("0") | $V_P$("0") | $V_Q$("0") | "1"  "1"  "1"  all"1" |
| 10 | 1 | 50 | | $V_S$("0") | $V_R$("1") | $V_Q$("0") | "1"  "0"  "1"  XNOR |

3-1) AND/OR (See FIGS. 26A and 26B, 27A and 27B)

As the transistor Tr5 is put into an antiparalell magnetization configuration ($\beta_{n5}$=0.5), the current $I_{d\_low}$ can be ignored, and the transistor Tr5 can be regarded as open. Accordingly, the circuit becomes equivalent to the AND/OR circuit shown in FIG. 18.

Figure 29A:
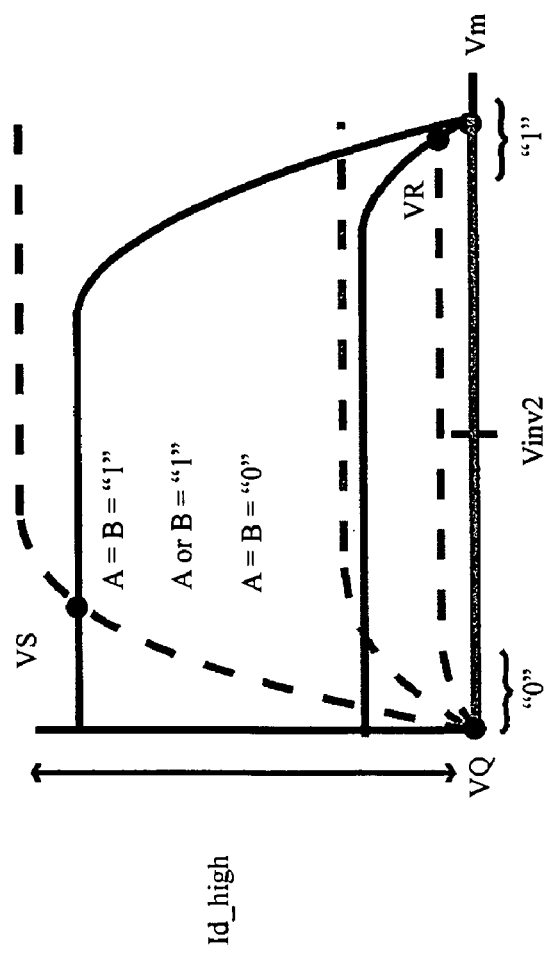
FIG. 29A shows a fourth operation of the circuit illustrated in FIG. 24.
Figure 29B:
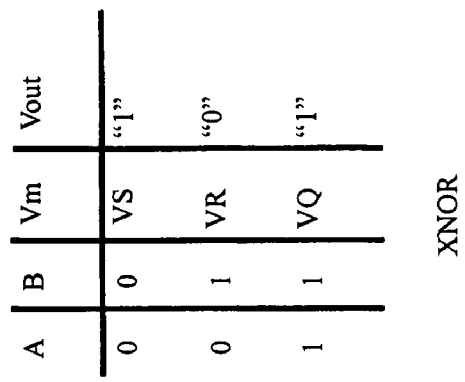
FIG. 29B shows a truth table of the operation.

3-2) XNOR (See FIGS. 29A and 29B)

The transistor Tr5 is put into a paralell magnetization configuration ($\beta_{n5}$=50). In the inverter part, the transistor Tr1 is put into a paralell magnetization configuration ($\beta_{p1}$=10), and the transistor Tr2 is put into an antiparalell magnetization configuration ($\beta_{n2}$=1), as in the AND circuit. In the case where A=B="1" or A or B="1", the transistor Tr5 is equivalent to an open circuit, and operates in the same manner as the AND circuit. In the case where A=B="0", $V_m$ is discharged by the current $I_{d\_high}$ of the transistor Tr5, so as to be $V_m=V_S<V_{inv2}$. Accordingly, $V_{out}$ becomes "1". Where the transistor Tr1 is put into an antiparalell magnetization configuration ($\beta_{p1}$=1), the transistor Tr2 is put into a paralell magnetization configuration ($\beta_{n2}$=10), and the transistor Tr5 is put into a paralell magnetization configuration ($\beta_{n5}$=50), the output $V_{out}$ becomes "1" for all the input patterns (see FIGS. 28A and 28B).

Although all symmetric Boolean functions can be realized by adding an inverter to the output of the circuit shown in FIG. 24, a technique of achieving all the symmetric Boolean functions by adding a new circuit to the circuit group P is described below.

4) AND/OR/XNOR/XOR

Figure 30:
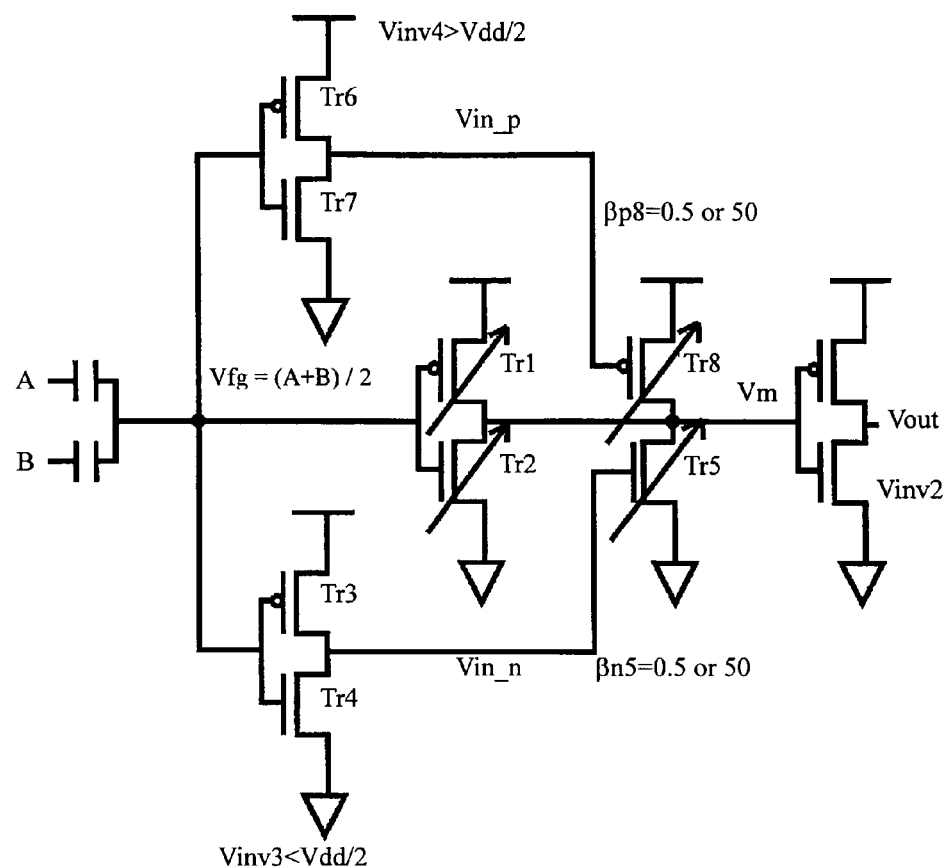
FIG. 30 illustrates an example structure of an AND/OR/XOR/XNOR circuit.
Figure 31:
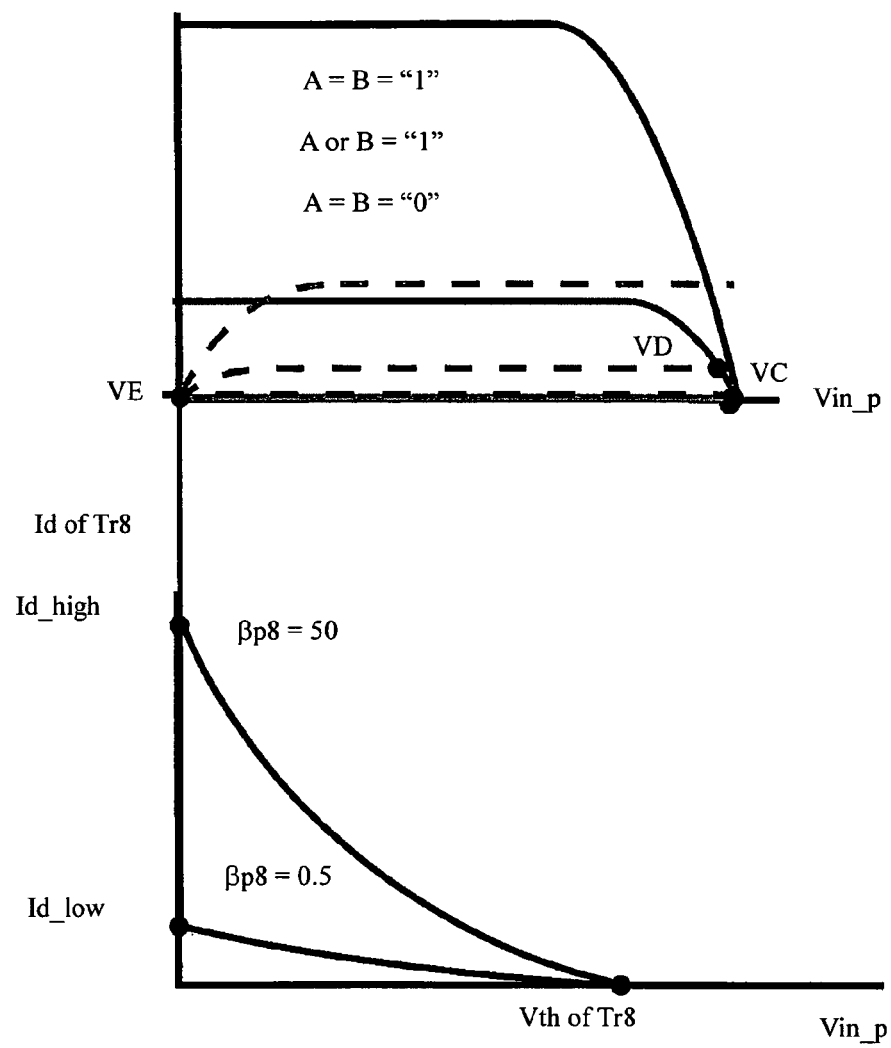
FIG. 31 shows the operating points of Vin_p of the circuit illustrated in FIG. 30.
Figures 33A, 33B:
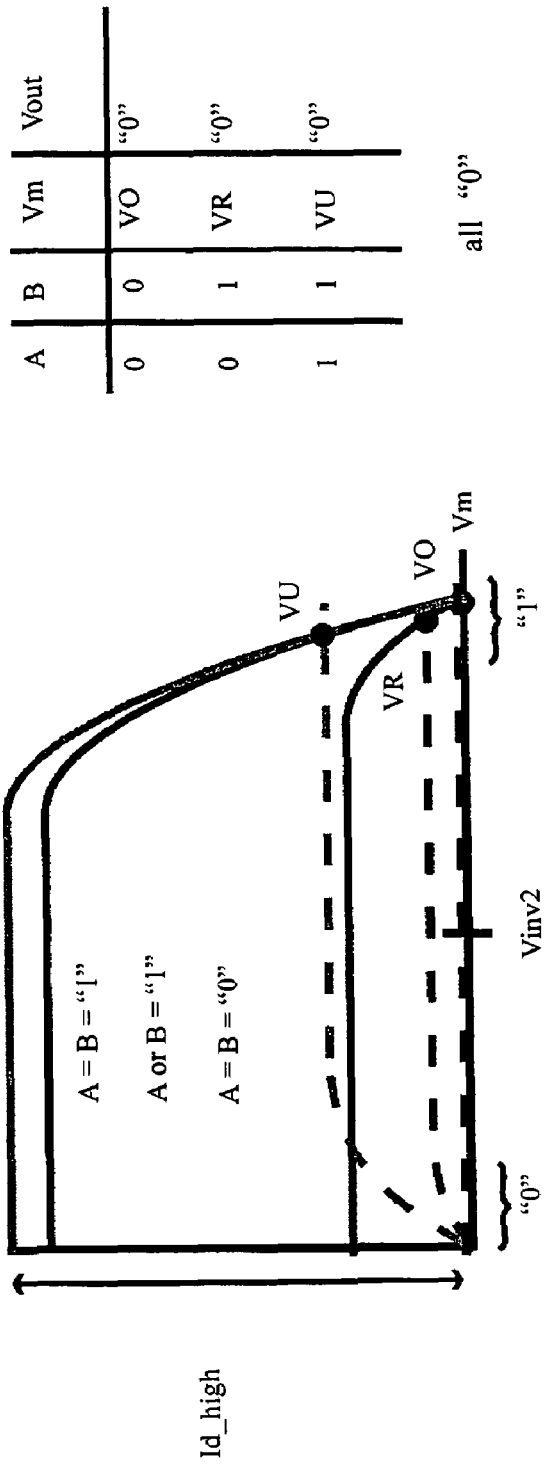
FIG. 33A shows a second operation of the circuit illustrated in FIG. 30.
FIG. 33B shows a truth table of the operation.

FIG. 30 illustrates an AND/OR/XNOR/XOR circuit. In the XOR circuit, the input/output correlation is the same as that in the OR circuit in the case where A=B="1" or A or B="1", but is different from that in the OR circuit only in the case where A=B="1", with $V_{out}$ being "0". Accordingly, this function can be realized by adding a circuit with which $V_{out}$ becomes "0" in the case where A=B="1". The XOR function can be achieved by employing the transistors Tr6, Tr7, and Tr8 (a p-channel spin MOSFET) in a complementary manner together with the transistors Tr3, Tr4, and Tr5 (an n-channel spin MOSFET). The inverter formed with the transistors Tr6 and Tr7 has a threshold value $V_{inv4}$ higher than $V_{dd}/2$. Accordingly, only in the case where A=B="1", $V_{in\_n}$ becomes "0", and the transistor Tr8 is turned on (see FIG. 31).

The variation in the current driving capacity $\beta_{p8}$ of the transistor Tr8 between parallel magnetization and antiparallel magnetization is wider than that in the case of the transistors Tr1 and Tr2, and $\beta_{p8}$ is 0.5 (antiparallel magnetization) or 50 (parallel magnetization). In the case of parallel magnetization ($\beta_{8p}$=50), a sufficiently high current ($I_{d\_high}$) flows, but in the case of antiparallel magnetization ($\beta_{p8}$=0.5), the value of the current ($I_{d\_low}$) is very small. FIGS. 32A and 32B and FIGS. 33A and 33B show the operating point $V_m$ in the case of the transistor Tr8 is in the paralell magnetization configuration ($\beta_{p8}$=50) and the transistor Tr5 is in the antiparalell magnetization configuration ($\beta_{n5}$=0.5). The sum of currents flowing through the transistors Tr1 and Tr8 is indicated by solid lines, and the sum of currents flowing through the transistors Tr2 and Tr5 is indicated by broken lines. Here, the current $I_{d\_low}$ is ignored.

The operation of this circuit is shown in Table 6.

4-2) XOR (See FIGS. 32A and 32B)

The transistor Tr8 is put into a paralell magnetization configuration ($\beta_{p8}$=50). In the other parts, the transistor Tr1 is put into an antiparalell magnetization configuration ($\beta_{p1}$=1), the transistor Tr2 is put into a paralell magnetization configuration ($\beta_{n2}$=10), and the transistor Tr5 is put into an antiparalell magnetization configuration ($\beta_{n5}$=0.5), as in the OR circuit. In the case where A=B="0" or A or B="1", the transistor Tr8 is open, and operates in the same manner as the OR circuit. In the case where A=B="1", $V_m$ is charged with the current $I_{d\_high}$ of the transistor Tr8, so as to be $V_m=V_T<V_{inv\_2}$. Accordingly, $V_{out}$ becomes "0". Where the transistor Tr1 is put into a paralell magnetization configuration ($\beta_{p1}$=10), the transistor Tr2 is put into an antiparalell magnetization configuration ($\beta_{n2}$=1), the transistor Tr5 is put into an antiparalell magnetization configuration ($\beta_{n5}$=0.5), and the transistor Tr8 is put into a paralell magnetization configuration ($\beta_{p8}$=50), the output $V_{out}$ becomes "0" for all the input patterns (see FIGS. 33A and 33B).

5) AND/OR/XNOR/XOR/NAND/NOR

As in the case shown in FIG. 15, an inverter may be added to the output of the circuit shown in FIG. 24. However, it is possible to achieve the circuit by employing the circuit shown in FIG. 30. The transistor Tr5 in FIG. 30 functions only in the

TABLE 6

| | | | | | $V_m$ | | | $V_{out}$ | | | |
|---|---|---|---|---|---|---|---|---|---|---|---|
| $\beta_{n1}$ | $\beta_{n2}$ | $\beta_{n5}$ | $\beta_{p8}$ | A<br>B | 0<br>0 | 0<br>1 | 1<br>1 | (in order of Vm) | | | function |
| 1 | 10 | 0.5 | 0.5 | | "1" | "0" | "0" | "0" | "1" | "1" | OR |
| 10 | 1 | 0.5 | 0.5 | | "1" | "1" | "0" | "0" | "0" | "1" | AND |
| 1 | 10 | 50 | 0.5 | | "0" | "0" | "0" | "1" | "1" | "1" | all "1" |
| 10 | 1 | 50 | 0.5 | | "0" | "1" | "0" | "1" | "0" | "1" | XNOR |
| 1 | 10 | 0.5 | 50 | | $V_O$("1") | $V_P$("0") | $V_T$("1") | "0" | "1" | "0" | XOR |
| 10 | 1 | 0.5 | 50 | | $V_O$("1") | $V_R$("1") | $V_T$("1") | "0" | "0" | "0" | all "0" |

4-1) AND/OR/XNOR

When the transistor Tr8 is put into an antiparalell magnetization configuration ($\beta_{p8}$=0.5) in the circuit shown in FIG. 30, the current flowing through the transistor Tr8 can be ignored, and the transistor Tr8 can be regarded as open. Accordingly, this circuit can be made equivalent to the circuit shown in FIG. 24, and the AND/OR/XNOR functions can be achieved by changing the magnetization states of the transistors Tr1, Tr2, and Tr5 (or the current driving capacities $\beta_{p1}$, $\beta_{n2}$, and $\beta_{n5}$).

case where A=B="0", and the operating point $V_m$ is "0". The transistor Tr8 functions only in the case where A=B="1", and the operating point $V_m$ is "1". Taking this fact into consideration, a NAND/NOR can be realized with the circuit shown in FIG. 30.

FIGS. 33A and 33B and FIGS. 34A and 34B show the operating points in the case where the transistors Tr5 and Tr8 are in a paralell magnetization configuration ($\beta_{n5}=\beta_{p8}$=50) in the circuit shown in FIG. 30. The operations of the circuits are shown in Table 7.

TABLE 7

| | | | | | $V_m$ | | | $V_{out}$ | | | |
|---|---|---|---|---|---|---|---|---|---|---|---|
| $\beta_{n1}$ | $\beta_{n2}$ | $\beta_{n5}$ | $\beta_{p8}$ | A<br>B | 0<br>0 | 0<br>1 | 1<br>1 | (in order of Vm) | | | function |
| 1 | 10 | 0.5 | 0.5 | | "1" | "0" | "0" | "0" | "1" | "1" | OR |
| 10 | 1 | 0.5 | 0.5 | | "1" | "1" | "0" | "0" | "0" | "1" | AND |
| 1 | 10 | 50 | 0.5 | | "0" | "0" | "0" | "1" | "1" | "1" | all"1" |
| 10 | 1 | 50 | 0.5 | | "0" | "1" | "0" | "1" | "0" | "1" | XNOR |
| 1 | 10 | 0.5 | 50 | | "1" | "0" | "1" | "0" | "1" | "0" | XOR |
| 10 | 1 | 0.5 | 50 | | "1" | "1" | "1" | "0" | "0" | "0" | all "0" |
| 1 | 10 | 50 | 50 | | $V_T$("0") | $V_P$("0") | $V_U$("1") | "1" | "1" | "0" | NAND |
| 10 | 1 | 50 | 50 | | $V_S$("0") | $V_R$("1") | $V_P$("1") | "1" | "0" | "0" | NOR |

5-1) AND/OR

When the transistor Tr5 is put into an antiparalell magnetization configuration ($\beta_{n5}$=0.5) and the transistor Tr8 is put into an antiparalell magnetization configuration ($\beta_{p8}$=0.5), the transistors Tr5 and Tr8 are both open. Accordingly, this circuit is equivalent to the circuit shown in FIG. 28.

5-2) XNOR

When the transistor Tr5 is put into a paralell magnetization configuration ($\beta_{n5}$=50) and the transistor Tr8 is put into an antiparalell magnetization configuration ($\beta_{p8}$=0.5), the transistor Tr8 is open. Accordingly, this circuit is equivalent to the circuit shown in FIG. 24.

5-3) XOR

When the transistor Tr5 is put into an antiparalell magnetization configuration ($\beta_{n5}$=0.5) and the transistor Tr8 is put into a paralell magnetization configuration ($\beta_{p8}$=50), the circuit becomes an XOR equivalent to the circuit shown in FIGS. 32A and 32B.

Figure 34A:
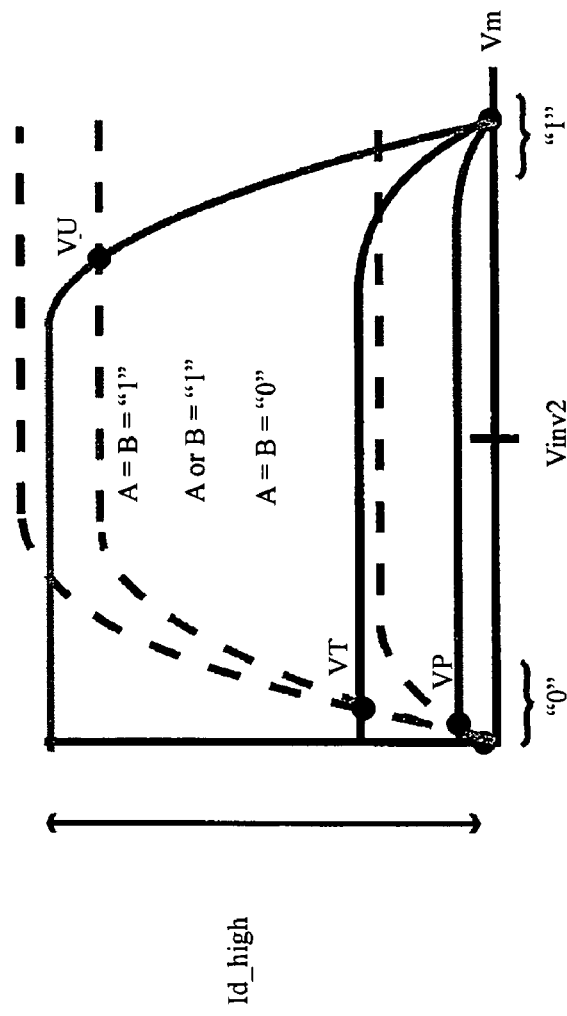
FIG. 34A shows a third operation of the circuit illustrated in FIG. 30.
Figure 34B:
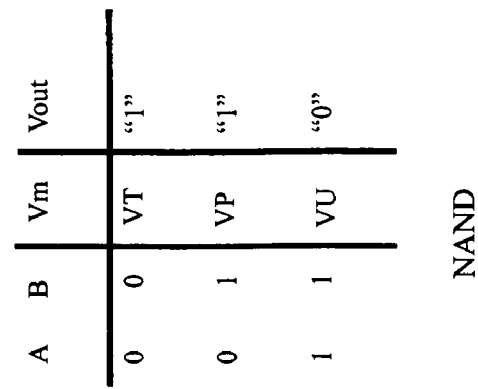
FIG. 34B shows a truth table of the operation.

5-4) NAND (See FIGS. 34A and 34B)

The transistor Tr1 is put into an antiparalell magnetization configuration ($\beta_{p1}$=1), the transistor Tr2 is put into a paralell magnetization configuration ($\beta_{n2}$=10), the transistor Tr5 is put into a paralell magnetization configuration ($\beta_{n5}$=50), and the transistor Tr8 is put into a paralell magnetization configuration ($\beta_{p8}$=50). In the case where A=B="0", discharging is performed by the transistor Tr5, and the operating point $V_m$ becomes $V_T$<$V_{inv2}$. Accordingly, the output $V_{out}$ becomes "1". In the case where A or B is "1", the operating point $V_m$ becomes $V_P$<$V_{inv2}$, and accordingly, the output $V_{out}$ becomes "1". In the case where A=B="1", $V_m$ is charged by the transistor Tr8, so as to be $V_m$=$V_U$>$V_{inv2}$. Accordingly, $V_{out}$ becomes "0".

Figure 35A:
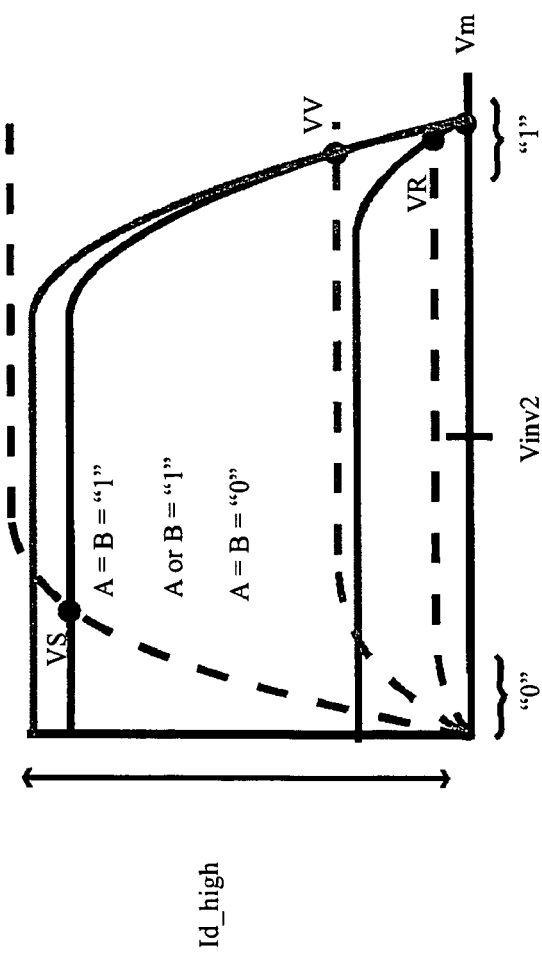
FIG. 35A shows a fourth operation of the circuit illustrated in FIG. 30.
Figure 35B:
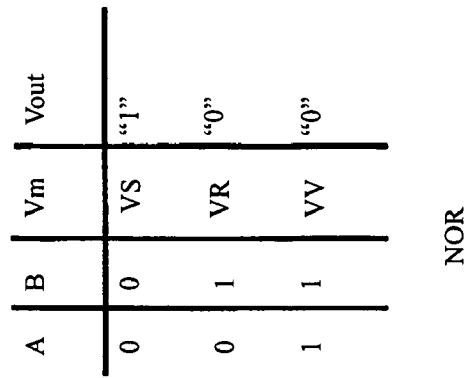
FIG. 35B shows a truth table of the operation.

5-5) NOR (See FIGS. 35A and 35B)

The transistor Tr1 is put into a paralell magnetization configuration ($\beta_{p1}$=10), the transistor Tr2 is put into an antiparalell magnetization configuration ($\beta_{n2}$=1), the transistor Tr5 is put into a paralell magnetization configuration ($\beta_{n5}$=50), and the transistor Tr8 is put into a paralell magnetization configuration ($\beta_{p8}$=50). In the case where A=B="0", charging is performed by the transistor Tr5, and the operating point $V_m$ becomes $V_S$<$V_{inv2}$. Accordingly, the output $V_{out}$ becomes "1". In the case where A or B is "1", the operating point $V_m$ becomes $V_R$>$V_{inv2}$, and accordingly, the output $V_{out}$ becomes "0". In the case where A=B="1", $V_m$ is charged by the transistor Tr8, so as to be $V_m$=$V_P$>$V_{inv2}$. Accordingly, $V_{out}$ becomes "0".

In the circuit shown in FIG. 30, the number of MOSFETs is 10, and the number of capacitors is 2. As this circuit can be realized with a CMOS configuration, the circuit layout can be made very compact.

Figure 36:
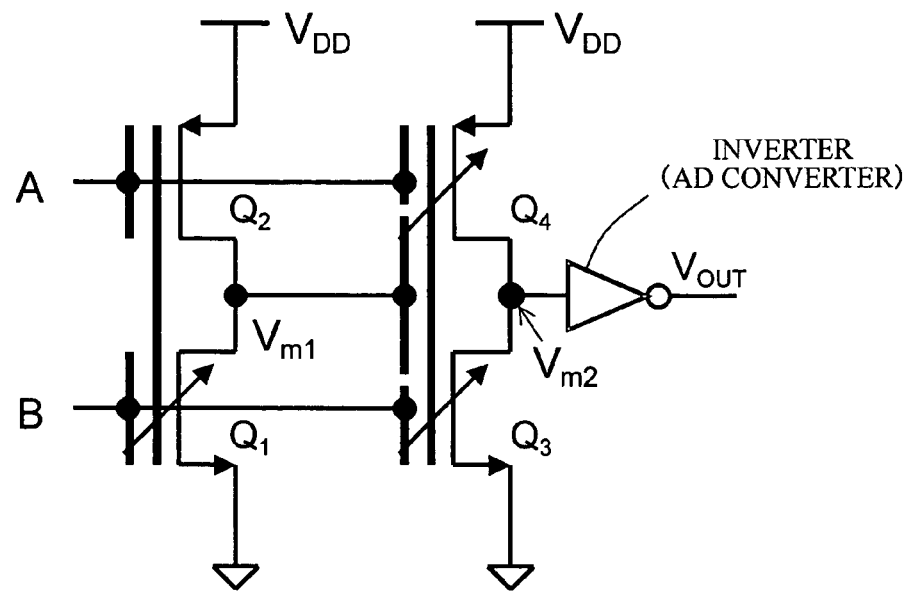
FIG. 36 illustrates an example structure of a reconfigurable logic circuit with a spin MOSFET.

FIG. 36 shows a circuit in which CMOS inverters using spin MOSFETs are connected in two stages. Each of the first-stage inverter and the second-stage inverter has an input of a vMOS structure. In this circuit, the same weighting is set on inputs A and B. The inputs A and B are input to the second-stage inverter, and the output $V_{m1}$ of the first stage is also input to the second-stage inverter. The capacitance weighting is the same between the inputs A and B in the second-stage inverter, but the capacitance weighting differs between the input A (or B) and the output $V_{m1}$. For example, with the input capacitance with $V_{m1}$ being $C_{m1}$, the relationship of 3$C_{m1}$=$C_A$ (=$C_B$) should be established. In this logic circuit, the magnetization states of Q1, Q2, and Q4 are changed to rewrite the logic functions. With the output $V_{m1}$, the logic functions of NOR and NAND can be realized. With the output $V_{m2}$, the logic functions of XNOR, XOR, AND, OR, all "1", and all "0" can be realized. Since the logic amplitude may not reach the "0" level or "1" level with the outputs $V_{m1}$ and $V_{m2}$, depending on the logic function, it is preferable that a CMOS inverter or the like is added to each output to amplify the signal. In such a case, however, the logic function is inverted. Also, it is possible to employ a spin MOSFET for Q2.

Next, a logic circuit of a second CMOS configuration is described for reference, in conjunction with the accompanying drawings. In this logic circuit, a threshold value variable inverter is employed as the output-stage inverter, so as to form a rewritable logic circuit. A logic threshold value $V_{inv}$ is a binary value ($V_{inv\_high}$ or $V_{inv\_low}$), and is supplied through an inverter that includes a conventional nMOS and a p-channel spin MOSFET. This inverter functions as an A-D converter that amplifies an analog voltage ("1/2" as described below) to a digital logic level ("0" or "1"), but also controls the threshold value. The output-stage A-D converter can be realized by employed the logic threshold value variable inverter, with the spin MOSFETs of the E/E, E/D, and CMOS inverters (shown in FIG. 6) having the vMOS structure for the inputs being replaced with conventional MOSFETs. In the following, other circuits are described for reference.

1) NAND/NOR

Figure 37:
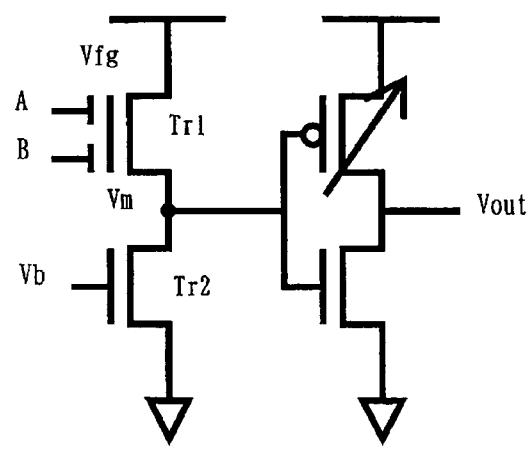
FIG. 37 illustrates an example structure of a NAND/NOR circuit.
Figure 38:
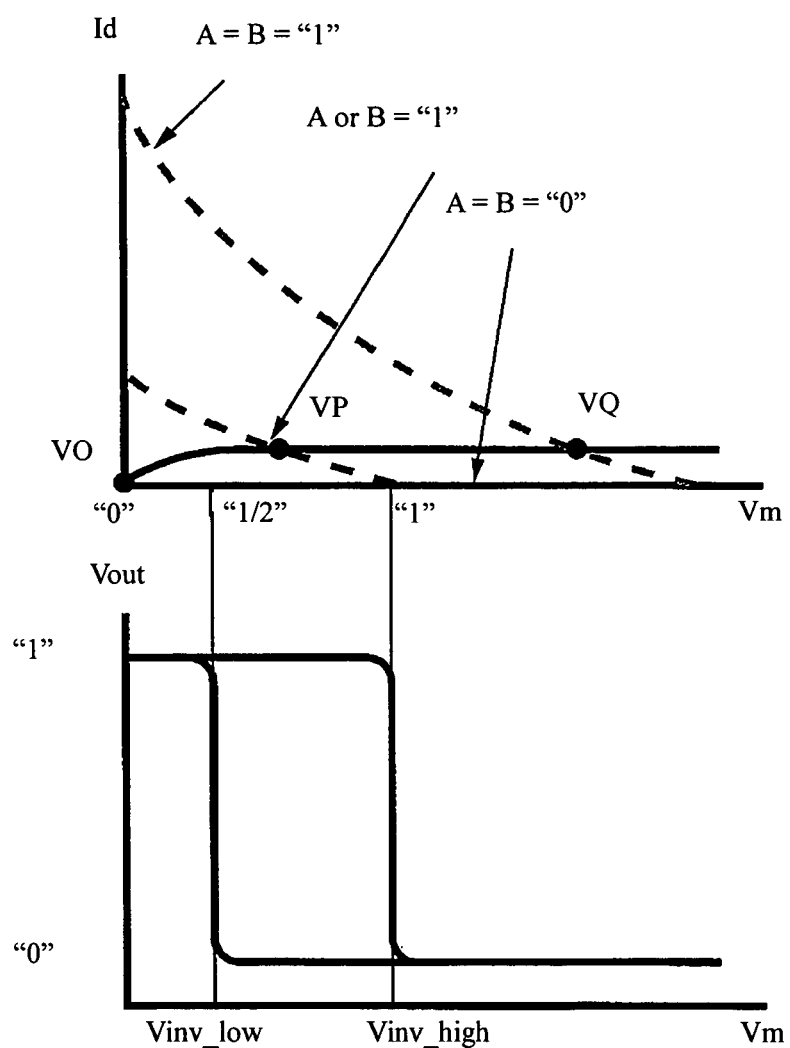
FIG. 38 shows the operating points of the circuit illustrated in FIG. 37, and the characteristics of the inverter.
Figures 39, 40:
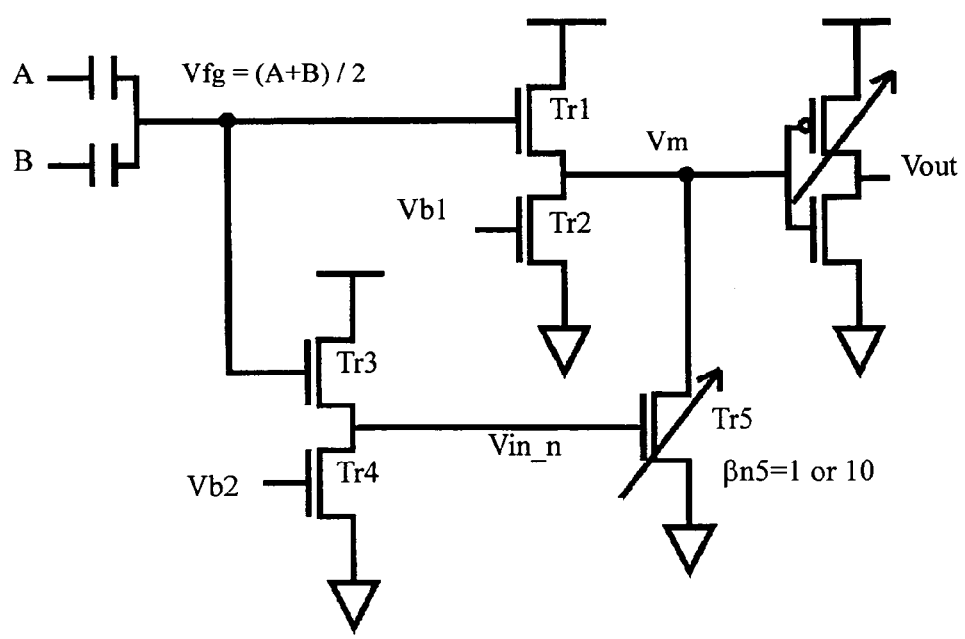
FIG. 39 shows a truth table of the circuit illustrated in FIG. 37.
FIG. 40 is a circuit diagram of a NAND/NOR/XNOR circuit.

FIG. 37 illustrates an example structure of a NAND/NOR circuit. This circuit differs from the circuit illustrated in FIG. 48, in that the value of Vm is not varied by spin MOSFETs but the threshold value is varied when the threshold value is amplified to the logic level by the inverter. As shown in FIG. 38, the load curve (the characteristics of the vMOS structure) of the logic circuit shown in FIG. 37 is represented by a single line, and the operating points are indicated only by $V_O$, $V_P$, and $V_Q$. Here, the functions are changed by varying the operating point with the logic threshold value $V_{inv}$ that is higher ($V_{inv\_high}$) or lower ($V_{inv\_low}$) than the operating point $V_P$ when A or B is "1". The region between the values $V_{inv\_high}$ and $V_{inv\_low}$ is "1/2". FIG. 39 shows the truth table in this case, and Table 8 shows the details of the operation of the above circuit.

TABLE 8

| | | $V_m$ | | | |
|---|---|---|---|---|---|
| | A | 0 | 0 | 1 | $V_{out}$ (in |
| $V_{inv}$ | B | 0 | 1 | 1 | order of Vm) function |
| $V_{inv\_low}$ | | $V_O$("0") | $V_P$("½") | $V_Q$("1") | "1" "0" "0" NOR |
| $V_{inv\_high}$ | | $V_O$("0") | $V_P$("½") | $V_Q$("1") | "1" "1" "0" NAND |

In the case where A=B="0", the operating point $V_m$ is $V_O$<$V_{inv\_low}$, $V_{inv\_high}$, and the output $V_{out}$ becomes "1" with the inverter. In the case where A=B="1", the operating point $V_m$ is $V_Q$<$V_{inv\_low}$, $V_{inv\_high}$, and the output $V_{out}$ becomes "0" with the inverter. Here, the outputs do not depend on the logic threshold value $V_{inv}$ of the inverter. In the case where A or B is "1", the relationship $V_{inv\_low}$<$V_P$<$V_{inv\_high}$ is established. In this case, if the threshold value $V_{inv}$ is equal to $V_{inv\_low}$, the output $V_{out}$ is "0", and accordingly, the circuit functions as a NOR circuit. If the threshold value $V_{inv}$ is equal to $V_{inv\_high}$, the output $V_{out}$ is "1", and accordingly, the circuit functions as a NAND circuit.

2) NAND/NOR/XOR

Figure 41:
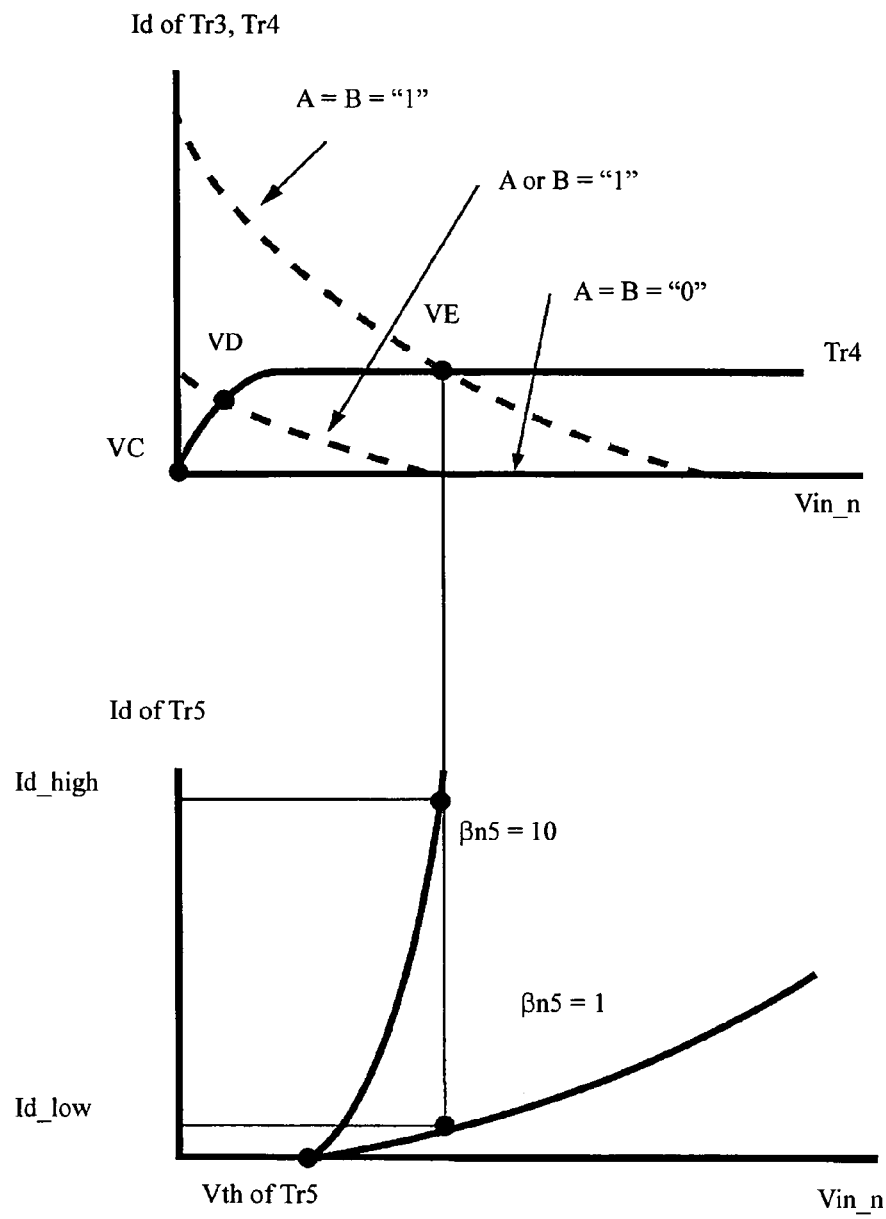
FIG. 41 shows the operating points of Vin_n of the circuit illustrated in FIG. 40.

FIG. 40 illustrates a NAND/NOR+XNOR circuit. FIG. 41 shows the operating points of the circuit. The principles of the operation of this circuit are the same as those shown in FIGS. 50 through 54. In NOR, the circuit that has the output $V_{out}$="1" ($V_m$="0", accordingly) in the case where A=B="1" is formed with the transistors Tr3, Tr4, and Tr5 (an n-channel spin MOSFET). The transistor Tr5 is either in a high driving force state ($\beta_{n5}$=10) or in a low driving force state ($\beta_{n5}$=1). The details of the operation are shown in Table 9.

TABLE 9

| $V_{inv}$ | $\beta_{n5}$ | A<br>B | $V_m$<br>0<br>0 | 0<br>1 | 1<br>1 | $V_{out}$<br>(in order of Vm) | | | function |
|---|---|---|---|---|---|---|---|---|---|
| $V_{inv\_low}$ | 1 | | $V_O$("0") | $V_P$("½") | $V_Q$("1") | "1" | "0" | "0" | NOR |
| $V_{inv\_high}$ | 1 | | $V_O$("0") | $V_P$("½") | $V_Q$("1") | "1" | "1" | "0" | NAND |
| $V_{inv\_low}$ | 10 | | $V_O$("0") | $V_P$("½") | $V_R$("0") | "1" | "0" | "1" | XNOR |
| $V_{inv\_high}$ | 10 | | $V_O$("0") | $V_P$("½") | $V_R$("0") | "1" | "1" | "1" | all "1" |

2-1) NAND/NOR (See FIGS. 42A and 42B)

In the circuit shown in FIG. 40, the transistor Tr5 is put into the state in which $\beta_{n5}$ is "1", so that the drain current $I_{id\_low}$ can be ignored. Accordingly, the transistor Tr5 can be regarded as open, and the circuit becomes equivalent to the NAND/NOR circuit shown in FIG. 37.

2-2) XNOR (See FIGS. 43A and 43B)

Figure 45:
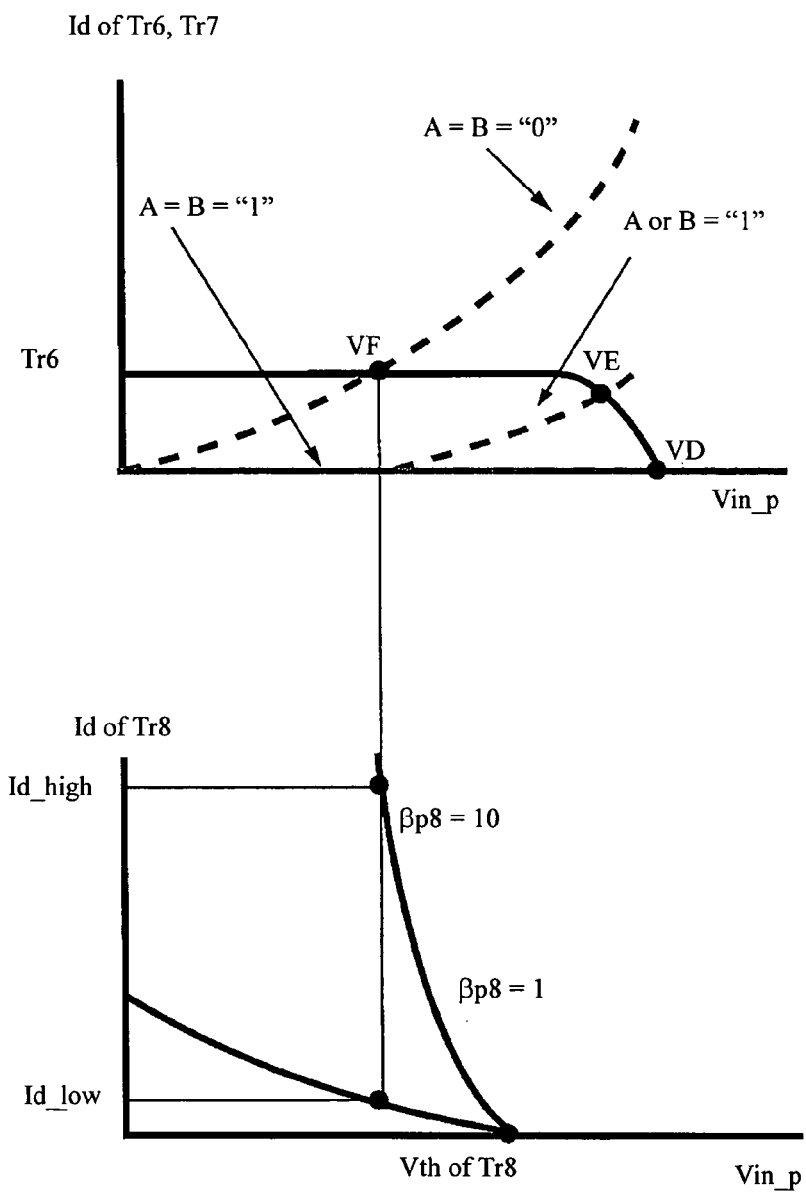
FIG. 45 shows the operating points of Vin_p of the circuit illustrated in FIG. 44.

In FIG. 45, the transistor Tr5 is put into the state in which $\beta_{n5}$ is 10, and the threshold value of the inverter is set at $V_{inv\_low}$ as in the NOR circuit. In the case where A=B="0" or A or B="1", the transistor Tr5 is regarded as open, and operates in the same manner as the NOR circuit. In the case where A=B="1", $V_m$ is charged with the current $I_{d\_high}$ of the transistor Tr5, so as to be $V_m = V_R < V_{inv\_low}$, and the output $V_{out}$ becomes "1".

Further, when the transistor Tr5 is put into the state in which $\beta_{n5}$ is 10 and the threshold value is set at $V_{inv\_high}$, the output $V_{out}$ becomes "1" for all inputs.

3) NAND/NOR/XNOR/XOR

Figure 44:
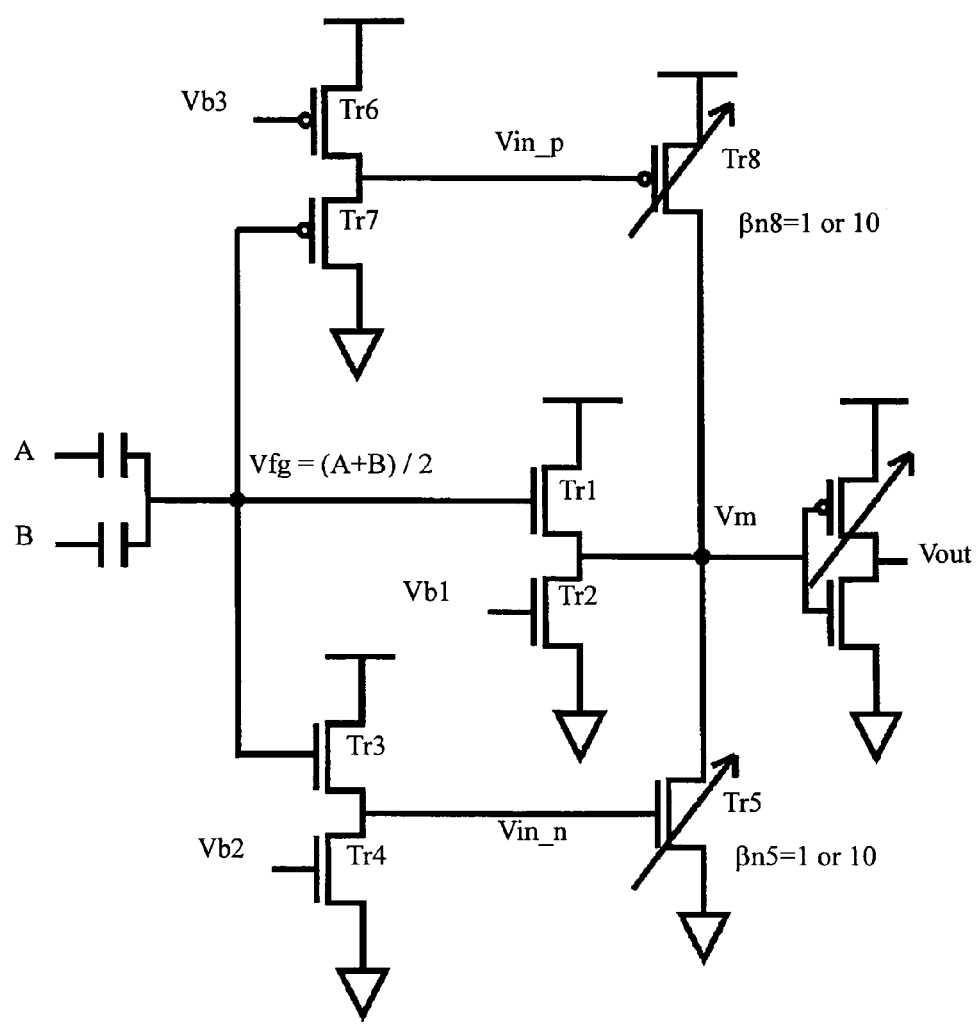
FIG. 44 is a circuit diagram of a NAND/NOR/XNOR/XOR circuit.

FIG. 44 illustrates a NAND/NOR/XNOR/XOR circuit. In the XOR circuit, the input/output correlation is the same as that in the NAND circuit in the case where A=B="1" or A or B="1", but is different from that in the AND circuit only in the case where A=B="0", with $V_{out}$ being "0". Accordingly, this function can be realized by adding a circuit with which $V_{out}$ becomes "0" (with $V_m$ being "1") in the case where A=B="0". The XOR function can be achieved by employing the p-channel transistors Tr6, Tr7, and Tr8 (a p-channel spin MOSFET) in a complementary manner together with the n-channel transistors Tr3, Tr4, and Tr5 (an n-channel spin MOSFET). The transistor Tr8 is either in a high driving force state ($\beta_{p8}$=10) or a low driving force state ($\beta_{p8}$=1). The source follower of the transistors Tr6 and Tr7 is a positive level shifter, and the transistor Tr8 is turned on only in the case where A=B="0".

FIG. 45 shows the operating characteristics of the transistors Tr6 and Tr7. According to the operating characteristics, $V_{in\_p}$ is determined. The operating point $V_D$ in the case where A=B="1" and the operating point $V_E$ in the case where A or B is "1" are both higher than the threshold value of the transistor Tr8. Accordingly, no current flows, and the circuit can be regarded as open. Only with the operating point $V_F$ in the case where A=B="0", the transistor Tr8 is turned on. (If p-channel spin MOSFETs with threshold values higher than $V_{dd}/2$ can be integrated, the transistors Tr6 and Tr7 are unnecessary, and the $V_{fg}$ node should be connected directly to the gate of the transistor Tr8.) In the case where $\beta_{p8}$ is 10, a sufficiently high current $I_{d\_high}$ flows, but in the case where $\beta_{p8}$ is 1, the value of the current ($I_{d\_low}$) is very small. FIGS. 46A and 46B show the operating points $V_m$ in the case where $\beta_{p8}$ is 10 and in the case where $\beta_{n5}$ is 1. The sum of the currents flowing through the transistors Tr1 and Tr8 is indicated by solid lines, and the current $I_{d\_low}$ is ignored in FIGS. 46A and 46B.

The details of the operation are shown in Table 10.

TABLE 10

| $V_{inv}$ | $\beta_{n5}$ | $\beta_{p8}$ | A<br>B | $V_m$<br>0<br>0 | 0<br>1 | 1<br>1 | $V_{out}$<br>(in order of Vm) | | | function |
|---|---|---|---|---|---|---|---|---|---|---|
| $V_{inv\_low}$ | 1 | 1 | | "0" | "½" | "1" | "1" | "0" | "0" | NOR |
| $V_{inv\_high}$ | 1 | 1 | | "0" | "½" | "1" | "1" | "1" | "0" | NAND |
| $V_{inv\_low}$ | 10 | 1 | | "0" | "½" | "0" | "1" | "0" | "1" | XNOR |
| $V_{inv\_high}$ | 10 | 1 | | "0" | "½" | "0" | "1" | "1" | "1" | all "1" |
| $V_{inv\_low}$ | 1 | 10 | | $V_O$("1") | $V_P$("½") | $V_Q$("1") | "0" | "0" | "0" | all "0" |
| $V_{inv\_high}$ | 1 | 10 | | $V_O$("1") | $V_P$("½") | $V_Q$("1") | "0" | "1" | "0" | XOR |

3-1) NAND/NOR/XNOR

The transistor Tr8 is put into a non-driving force state ($\beta_{p8}$=1), so that the current flowing through the transistor Tr8 can be ignored. Accordingly, this part can be regarded as open, and the circuit becomes equivalent to the circuit shown in FIG. 40. By simply changing $\beta_{n5}$ and $V_{inv}$, the NAND/NOR/XOR functions can be maintained.

3-2) XOR

The transistor Tr8 is put into the state in which $\beta_{p8}$ is 10, and the threshold value of the inverter is set at $V_{inv\_high}$ as in the NAND circuit. The transistor Tr5 is put into the state in which $\beta_{n5}$ is 1, so as to be open. In the case where A=B="1" or A or B="1", the transistor Tr8 is open, and operates in the same manner as the NAND circuit. In the case where A=B="0", $V_m$ is charged by the p-channel spin MOSFET, so as to be $V_m = V_O < V_{inv\_high}$, and the output $V_{out}$ becomes "0". Further, when the transistor Tr8 is put into the state in which $\beta_{p8}$ is 10 and the threshold value is set at $V_{inv\_low}$, the output $V_{out}$ becomes "0" for all inputs.

4) NAND/NOR/XNOR/XOR/OR/AND

In the circuit shown in FIG. 44, the transistor Tr5 functions only in the case where A=B="1", and $V_m$ is "0". The transistor Tr8 functions only in the case where A=B="0", and $V_m$ is "1".

Taking this fact into consideration, an OR/AND can be realized with the circuit shown in FIG. 44. In the circuit, the number of MOSFETs is 10, and the number of capacitors is 2. FIG. 46A shows the load curve in the case where $\beta_{n5}=\beta_{p8}=10$ in FIG. 44. Although the spin MOSFETs of two different types having different rates of change in driving force (the rate of change between Tr1 and Tr2 is 10, and the rate of change between Tr5 and Tr8 is 100, for example) need to be integrated in the circuit shown in FIG. 30, the circuit shown in FIG. 44 requires only one type of spin MOSFET.

The details of the operation are shown in Table 11.

TABLE 11

| | | | | $V_m$ | | | $V_{out}$ | | | |
|---|---|---|---|---|---|---|---|---|---|---|
| $V_{inv}$ | $\beta_{n5}$ | $\beta_{p8}$ | A<br>B | 0<br>0 | 0<br>1 | 1<br>1 | (in order of Vm) | | | function |
| $V_{inv}$_low | 1 | 1 | | "0" | "½" | "1" | "1" | "0" | "0" | NOR |
| $V_{inv}$_high | 1 | 1 | | "0" | "½" | "1" | "1" | "1" | "0" | NAND |
| $V_{inv}$_low | 10 | 1 | | "0" | "½" | "0" | "1" | "0" | "1" | XNOR |
| $V_{inv}$_high | 10 | 1 | | "0" | "½" | "0" | "1" | "1" | "1" | all "1" |
| $V_{inv}$_low | 1 | 10 | | "1" | "½" | "1" | "0" | "0" | "0" | all "0" |
| $V_{inv}$_high | 1 | 10 | | "1" | "½" | "1" | "0" | "1" | "0" | XOR |
| $V_{inv}$_low | 10 | 10 | | $V_O$("1") | $V_P$("½") | $V_R$("0") | "0" | "0" | "1" | AND |
| $V_{inv}$_high | 10 | 10 | | $V_O$("1") | $V_P$("½") | $V_R$("0") | "0" | "1" | "1" | OR |

4-1) NAND/NOR (See FIGS. 46A and 46B)

With $\beta_{n5}$ being 1 and $\beta_{p8}$ being 1, the transistors Tr5 and Tr8 are both open. Accordingly, this circuit is equivalent to the circuit shown in FIG. 37, and functions as a NOR ciruict with $V_{inv\_low}$, and as a NAND circuit with $V_{inv\_high}$.

4-2) XNOR

With $\beta_{n5}$ being 10 and $\beta_{p8}$ being 1, the transistor Tr8 is open with $V_{inv\_low}$. Accordingly, this circuit is equivalent to the circuit shown in FIG. 43, and functions as a XNOR circuit.

4-3) XOR

With $\beta_{n5}$ being 1 and $\beta_{p8}$ being 10, this circuit is equivalent to the circuit shown in FIG. 43B, and functions as a XNOR circuit.

4-4) AND/OR

Figure 47A:
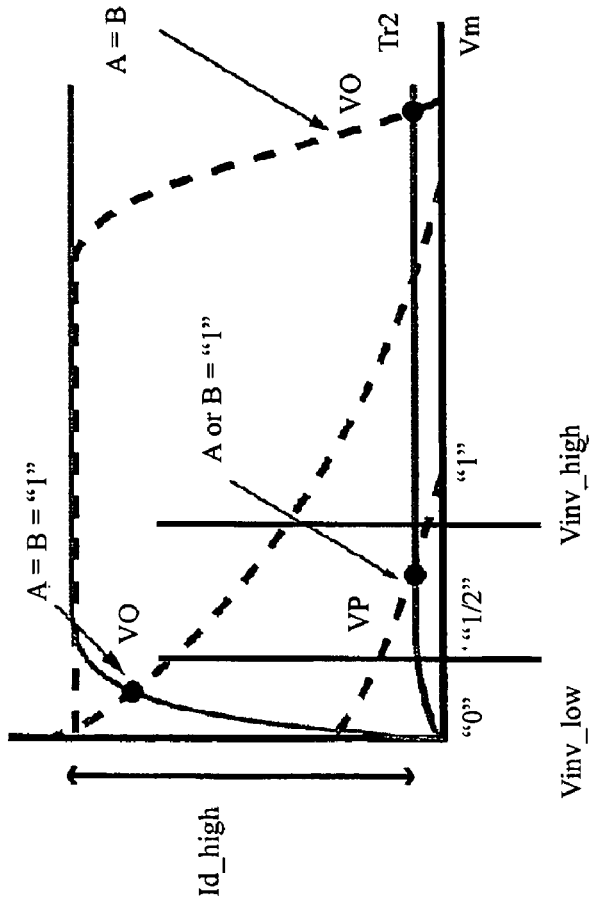
FIG. 47A shows a second operation of the circuit illustrated in FIG. 44.
Figure 47B:
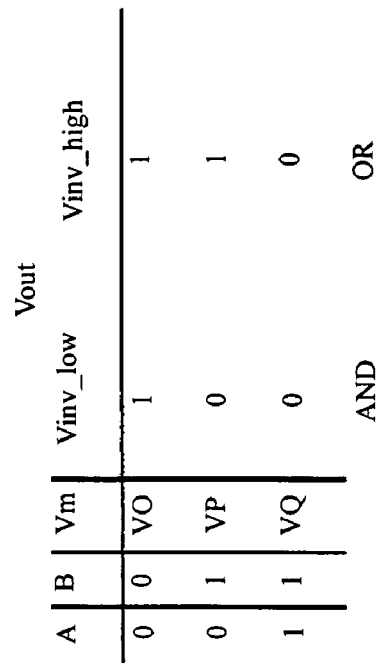
FIG. 47B shows a truth table of the operation.

The value $\beta_{n5}$ is set at 10, and the value $\beta_{p8}$ is set at 10 in the circuit shown in FIG. 44 (see FIGS. 47A and 47B). In the case where A=B="0", charging is performed by the transistor Tr8, and the operating point $V=V_O>V_{inv\_low}$, $V_{inv\_high}$. Accordingly, the output $V_{out}$ becomes "0". In the case where A=B="1", discharging is performed by the transistor Tr5, and the operating point $V_m$ becomes $V_Q<V_{inv2low}$, $V_{inv\_high}$. Accordingly, the output $V_{out}$ becomes "1". In the case where A or B is "1", the transistors Tr5 and Tr8 are both open, and accordingly, the circuit becomes equivalent to the circuit shown in FIG. 37. Since the relationship $V_{inv\_low}<V_P<V_{inv\_high}$ is established, the circuit functions as an AND circuit, with $V_{inv}$ being $V_{inv2low}$. The circuit functions as an OR circuit, with $V_{inv}$ being $V_{inv\_high}$.

The above circuit may be of either an n-channel type or a p-channel type, as long as the transistors Tr1 and Tr2 are of the same conductivity type in each circuit diagram.

In the following, a logic circuit in accordance with the above examples of reconfigurable circuits using spin MOS-FETs is described in conjunction with the accompanying drawings. This logic circuit employs circuit groups including enhancement MOSFETs and n-channel spin MOSFETs.

1) NAND/NOR Circuit

Figure 48:
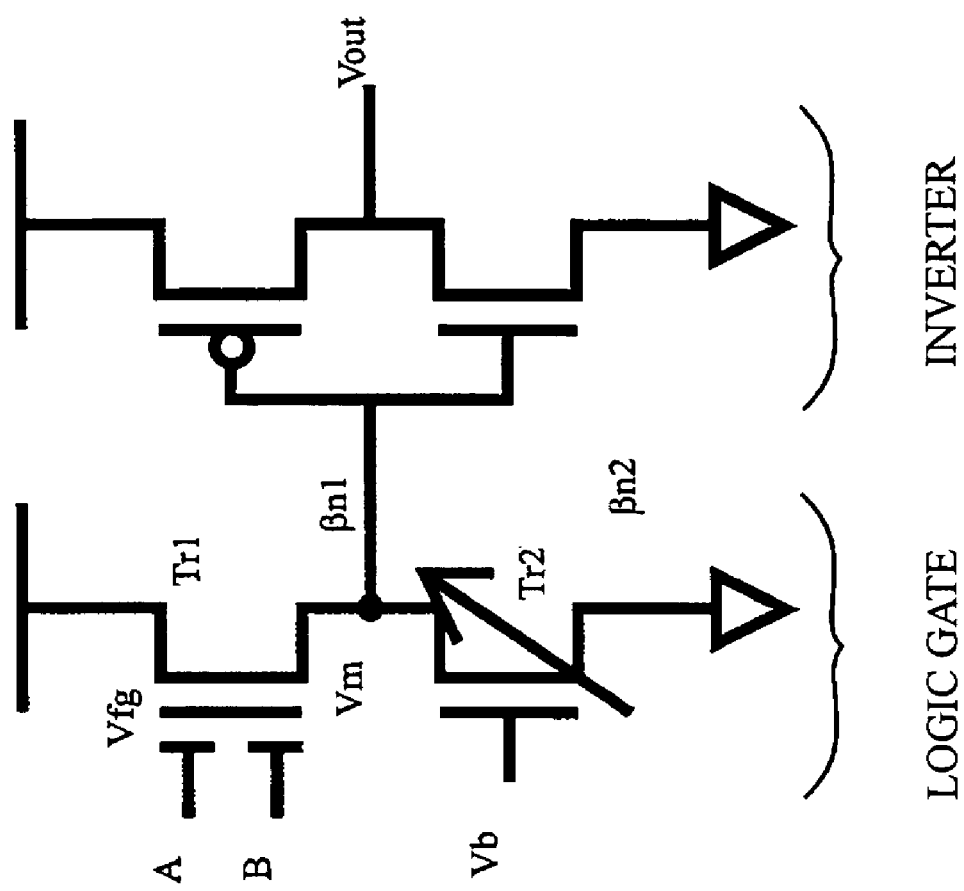
FIG. 48 illustrates an example structure of a NAND/NOR circuit (E/E configuration)

FIG. 48 illustrates an example structure of a rewritable NAND/NOR circuit. As shown in FIG. 48, a rewritable NAND/NOR circuit includes a logic gate stage and an inverter stage. The logic gate stage has a series-connection structure in which a νMOS (Tr1) and a spin MOSFET (Tr2) are connected in series. The νMOS (Tr1) has two inputs A and B, and the voltage $V_{fg}$ to be applied to the floating gate according to the input value is determined by the equation: (A+B)/2, for example. The current gain of the νMOS (Tr1) is represented by $\beta_{n1}$. The inputs are represented by A and B, and the output is represented by $V_{out}$, which is either "0" (Low level, 0V) or "1" (High level, the source voltage $V_{dd}$). The above νMOS (Tr1) functions as a D-A converter that converts a digital input of "0" or "1" to a voltage of 0, $V_{dd}/2$, or $V_{dd}$.

Tr2 is a spin MOSFET (distinguished from a conventional MOSFET by the addition of an arrow), and a constant bias $V_b$ is applied to Tr2. The driving force can be either $\beta_{n2}=1$ or $\beta_{n2}=10$, depending on the magnetization state stored in the spin MOSFET (Tr2).

Figure 49:
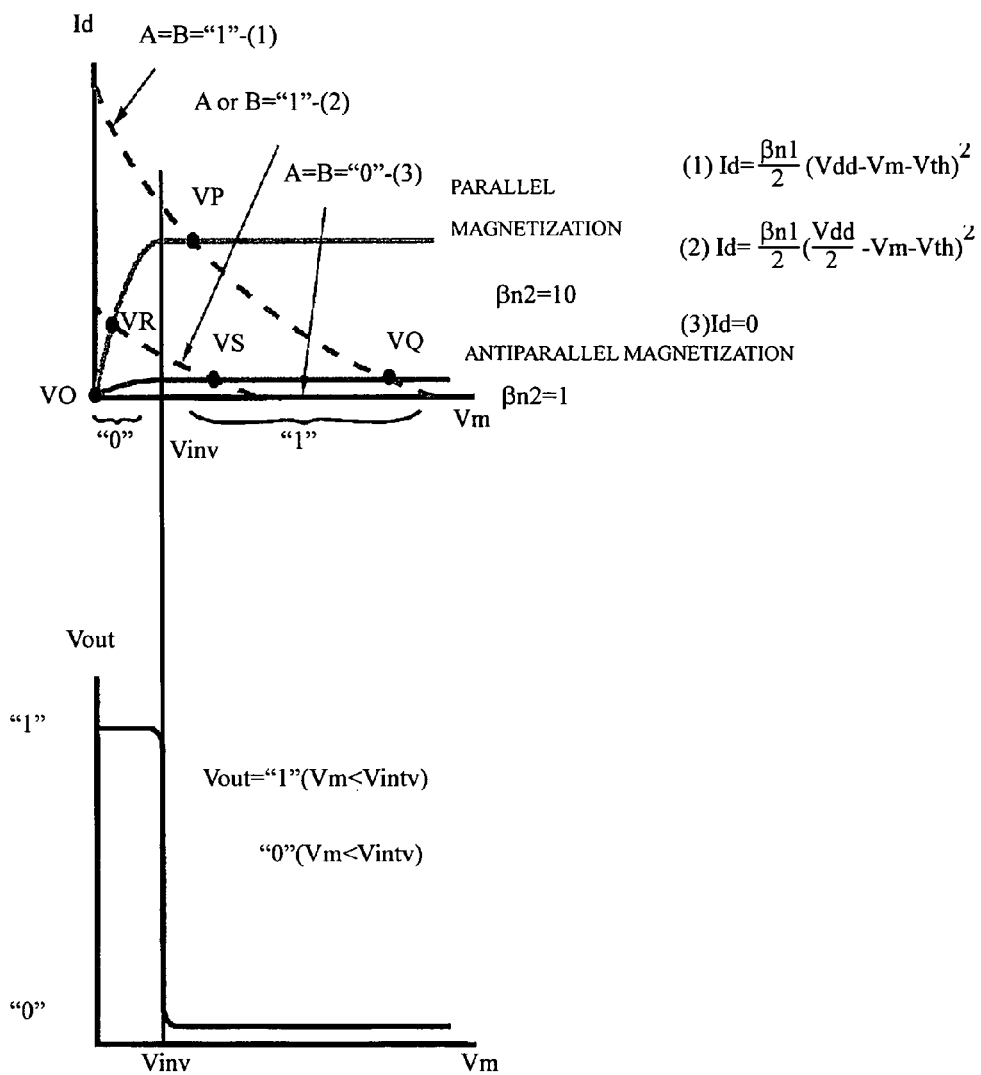
FIG. 49 illustrates the operation of the circuit illustrated in FIG. 48.

The static characteristics of the spin MOSFET (Tr2) are shown by the solid line in FIG. 49. The νMOS (Tr1) and the spin MOSFET (Tr2) function as a source follower circuit. The νMOS (Tr1) charges the $V_m$ node, which is the connecting point between the νMOS (Tr1) and the spin MOSFET (Tr2), with the driving force according to $V_{fg}$. The spin MOSFET (Tr2) discharges the $V_m$ node with the driving force according to the magnetization state. The νMOS (Tr1) and the spin MOSFET (Tr2) constitute the logic gate. FIG. 49 shows the load curve according to the νMOS (Tr1) (indicated by the broken line) and the operating points ($V_O$ through $V_S$) of this logic gate.

The analog voltage $V_m$ supplied at the operating points ($V_O$ through $V_S$) is inverted and amplified to the digital logic level "0" or "1" by an inverter with the characteristics shown in the lower half of FIG. 49, with $V_{inv}$ being the threshold value. The analog voltage $V_m$ is then output to an output terminal $V_{out}$.

Table 12 shows the relationship among $\beta_{n2}$, the operating points, and the circuit functions.

TABLE 12

| | | | $V_m$ | | | $V_{out}$ | | | |
|---|---|---|---|---|---|---|---|---|---|
| $\beta_{n2}$ | A<br>B | 0<br>0 | 0<br>1 | 1<br>1 | (in order of Vm) | | | | function |
| 1 | | $V_O$("0") | $V_S$("1") | $V_Q$("1") | "1" | "0" | "0" | | NOR |
| 10 | | $V_O$("0") | $V_R$("0") | $V_P$("1") | "1" | "1" | "0" | | NAND |

The driving force of the spin MOSFET (Tr2) in a paralell magnetization configuration is $\beta_{n2}=10$. In the case where A=B="0", the drain current $I_d$ is 0. The analog voltage $V_m$ is $V_O<V_{inv}$, and the output $V_{out}$ is "1", with the inverting amplification of the A-D converter being taken into consideration. In the case where A=B="1", the drain current $I_d$ is expressed as $I_d=\beta_{n1}(V_{dd}-V_m-V_{th})^2/2$. Here, $V_m$ is $V_P>V_{inv}$, and $V_{out}$ is "0". The above outputs do not depend on the driving force $\beta_{n2}$ of the spin MOSFET (Tr2) (not depending on whether the magnetization state is parallel or antiparallel). In the case where A or B is "1", the drain current $I_d$ is expressed as $I_d=\beta_{n1}(V_{dd}/2-V_m-V_{th})^2$. Here, one of the inputs is "1", and $V_m$ is discharged by Tr2. As a result, $V_m$ becomes $V_R<V_{inv}$, and $V_{out}$ is "1". Thus, the circuit functions as a NAND circuit.

The driving force of the spin MOSFET (Tr2) in an anti-paralell magnetization configuration is $\beta_{n2}=1$. In the case where A=B="0", the analog voltage $V_m$ is $V_O<V_{inv}$, and the output $V_{out}$ is "1", with the inverting amplification of the A-D converter being taken into consideration. In the case where A=B="1", $V_m$ is $V_Q>V_{inv}$, and $V_{out}$ is "0". The above outputs do not depend on the driving force $\beta_{n2}$ of the spin MOSFET (Tr2) (not depending on whether the magnetization state is parallel or antiparallel). In the case where A or B is "1", $V_m$ is charged by Tr1. As a result, $V_m$ becomes $V_S>V_{inv}$, and $V_{out}$ is "0". Thus, the circuit functions as a NOR circuit. FIG. 50 shows the truth table of the circuit shown in FIG. 48.

As shown in Table 12, based on whether the driving force $\beta_{n2}$, which can vary according to the magnetization state in the spin MOSFET, is 1 or 10, a NOR logic or a NAND logic can be selected as the output $V_{out}$ in response to the inputs A and B. Since the magnetization state of the spin MOSFET is stored in a non-volatile manner, a NOR logic or a NAND logic can be selected in a single circuit. If a circuit having such a function is formed with a conventional CMOS digital circuit, ten MOSFETs are necessary. The circuit of this example is advantageous in that the same function can be realized with only four MOSFETs.

2) NAND/NOR+XNOR

Referring now to FIG. 51A, a rewritable NAND/NOR+XNOR circuit is described. In an XNOR circuit, the input/output correlation is the same as that in an NOR circuit, in the case of A=B="0" or A or B="1". The input/output correlation is different from that in an NOR circuit only in the case where A=B="1", with $V_{out}$ being "1". Therefore, in the case where A=B="1", $V_{out}$ should be set to "1" ($V_m$ being "0"). Here, a circuit that is formed with two conventional nMOSFETs (Tr3 and Tr4) and one n-channel spin MOSFET (Tr5) is added. The n-channel spin MOSFET (Tr5) can be switched between a high driving force state ($\beta_{n5}=10$) and a low driving force state ($\beta_{n5}=1$) in accordance with the magnetization state.

The source followers of Tr3 and Tr4 form a negative level shifter, and Tr5 is turned on only in the case where A=B="1". In FIG. 51B illustrating the operation, the upper graph shows the operating characteristics of Tr3 and Tr4 in FIG. 8. According to the operating characteristics, $V_{in\_n}$ is determined. The static characteristics of Tr4 are indicated by the solid line, and the load curve of Tr3 is indicated by the broken lines. The operating point VC in the case where A=B="0" and the operating point VD in the case where A or B is "1" are smaller than the threshold value of Tr5. Therefore, no current flows in Tr5, which can be regarded as open. Only the gate voltage of Tr5 at the operating point VE in the case where A=B="1" is greater than the threshold. Accordingly, Tr5 is turned on. If n-channel spin MOSFETs with threshold values greater than $V_{dd}/2$ can be integrated, Tr3 and Tr4 are not necessary, and the $V_{fg}$ node should be connected directly to the gate of Tr5. In the case where $\beta_{n5}$ is 10, a sufficiently high current $I_{d\_high}$ flows, but in the case where $\beta_{n5}$ is 1, the value of the current ($I_{d\_low}$) is very small, as can be seen from the lower graph in FIG. 51B.

FIGS. 52A through 54B show the operating points $V_m$ with the respective values of $\beta$. The sum of the currents flowing through Tr2 and Tr5 is indicated by the solid lines, and the current $I_{d\_low}$ is ignored. Table 13 collectively shows the relationship between $\beta_{n2}$, $\beta_{n5}$, and the functions of the circuit.

TABLE 13

| | | $V_m$ | | | $V_{out}$ | | | |
|---|---|---|---|---|---|---|---|---|
| | | A | 0 | 0 | 1 | | | |
| $\beta_{n2}$ | $\beta_{n5}$ | B | 0 | 1 | 1 | (in order of Vm) | | function |
| 1 | 1 | | $V_O$("0") | $V_S$("1") | $V_Q$("1") | "1" | "0" | "0" | NOR |
| 10 | 1 | | $V_O$("0") | $V_R$("0") | $V_P$("1") | "1" | "1" | "0" | NAND |
| 1 | 10 | | $V_O$("0") | $V_S$("1") | $V_U$("0") | "1" | "0" | "1" | XNOR |
| 10 | 10 | | $V_O$("0") | $V_R$("0") | $V_V$("0") | "1" | "1" | "1" | all "1" |

Figure 52B:
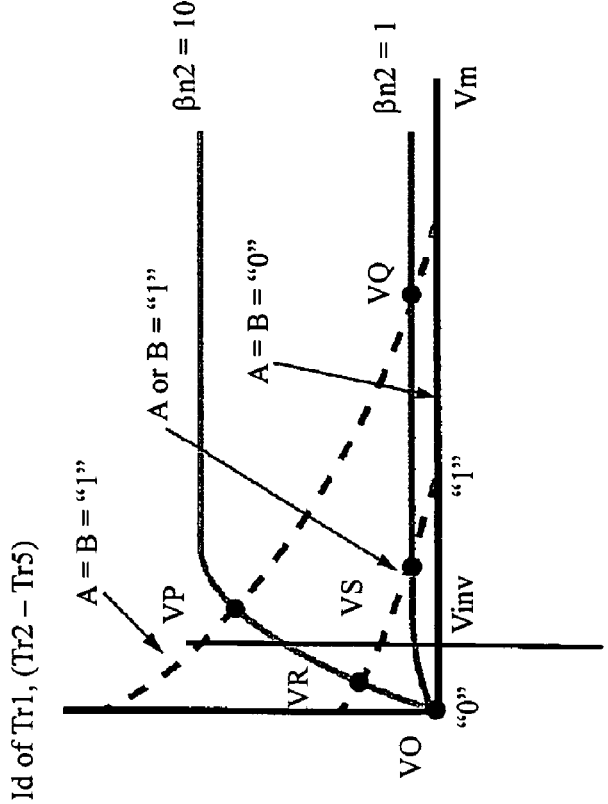
FIG. 52B shows a truth table of the operation shown in FIG. 52A.
Figure 52A:
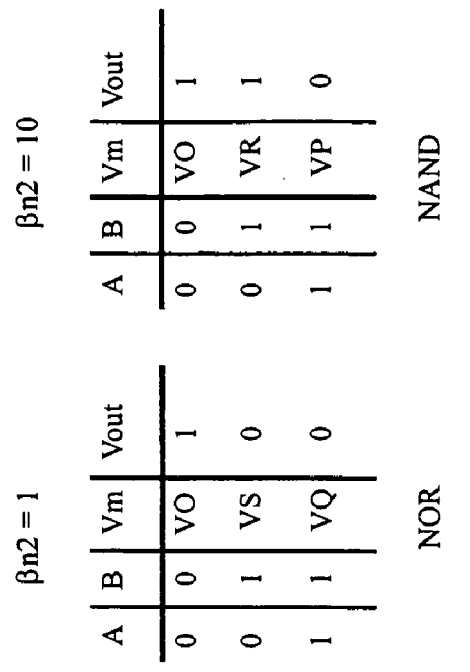
FIG. 52A shows a first operation of the circuit illustrated in FIG. 51A.

FIGS. 52A and 52B illustrate the NAND/NOR functions. Tr5 is put into a non-driving force state ($\beta_{n5}=1$), so that the current flowing through Tr5 can be ignored. Accordingly, the part of Tr5 (FIG. 51A) can be regarded as open. Thus, the NAND/NOR functions can be maintained.

Figures 53A, 53B:
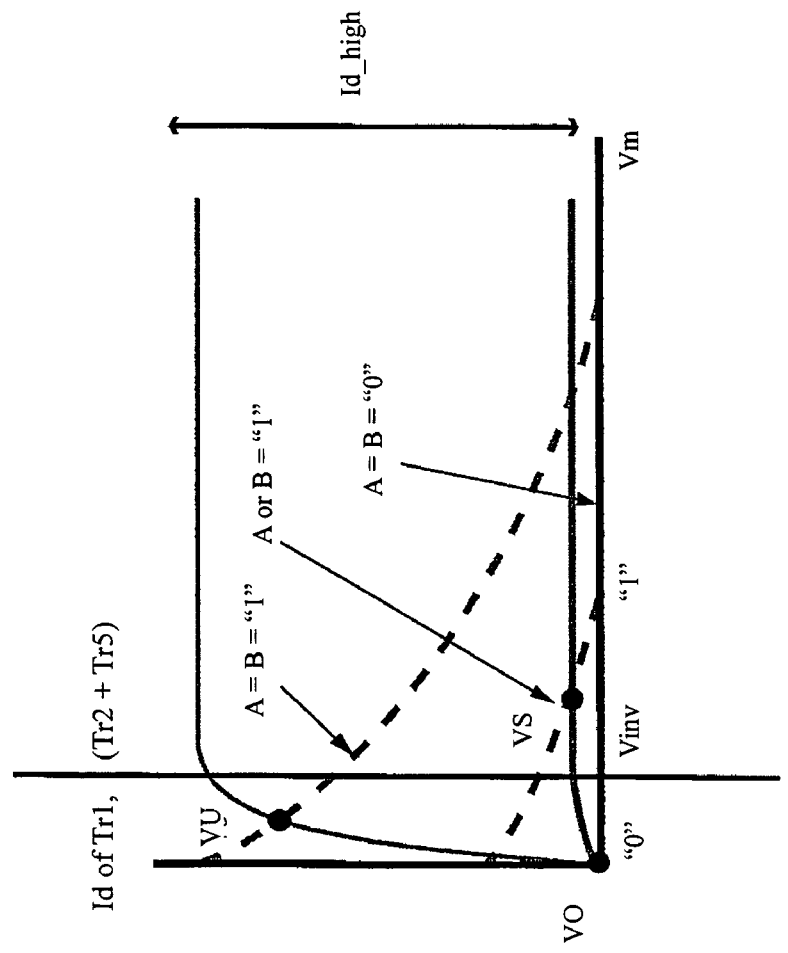
FIG. 53A shows a second operation of the circuit illustrated in FIG. 51A.
FIG. 53B shows a truth table of the operation shown in FIG. 53A.
Figure 54B:
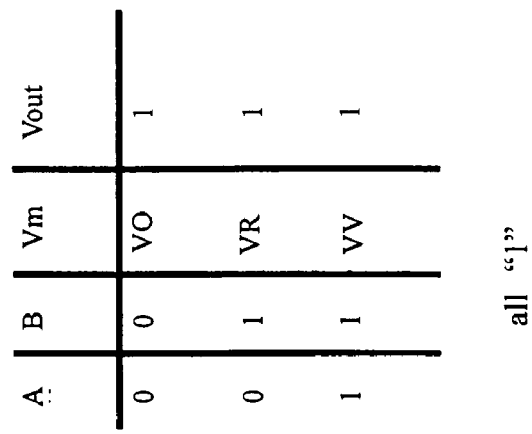
FIG. 54B shows a truth table of the operation shown in FIG. 54A.
Figure 54A:
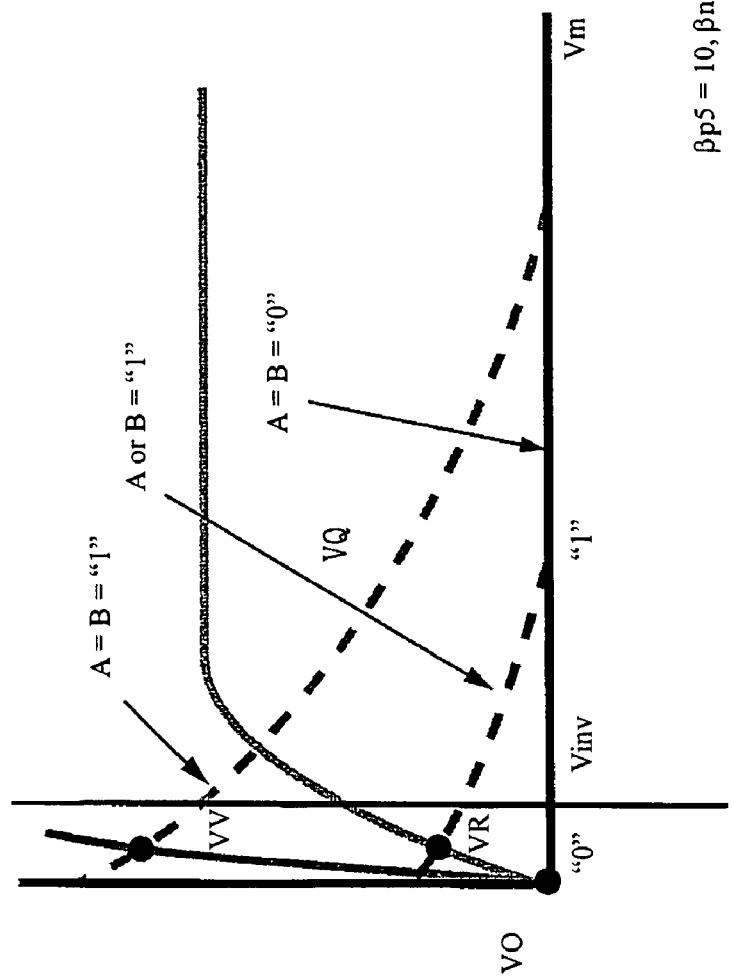
FIG. 54A shows a third operation of the circuit illustrated in FIG. 51A.

FIGS. 53A and 53B illustrate the XNOR function. Tr5 is put into a high driving force state ($\beta_{n5}=10$), and Tr2 is put into the state in which $\beta_{n2}=1$. In the case where A=B="0" or A or B="1", Tr5 is regarded as open, and operates in the same manner as the NOR circuit. In the case where A=B="1", $V_m$ is discharged with the current $V_{inv\_high}$ of Tr5, so as to be $V_m=V_U<V_{inv}$, and the output $V_{out}$ becomes "1". Further, when Tr5 is put into the state in which $\beta_{n5}$ is 10 and Tr2 is put into the state in which $\beta_{n2}$ is 10, the output $V_{out}$ becomes "1" for all inputs (all "1"), as shown in FIGS. 54A and 54B.

3) NAND/NOR/XNOR+AND/OR/XOR Functions

Figure 55:
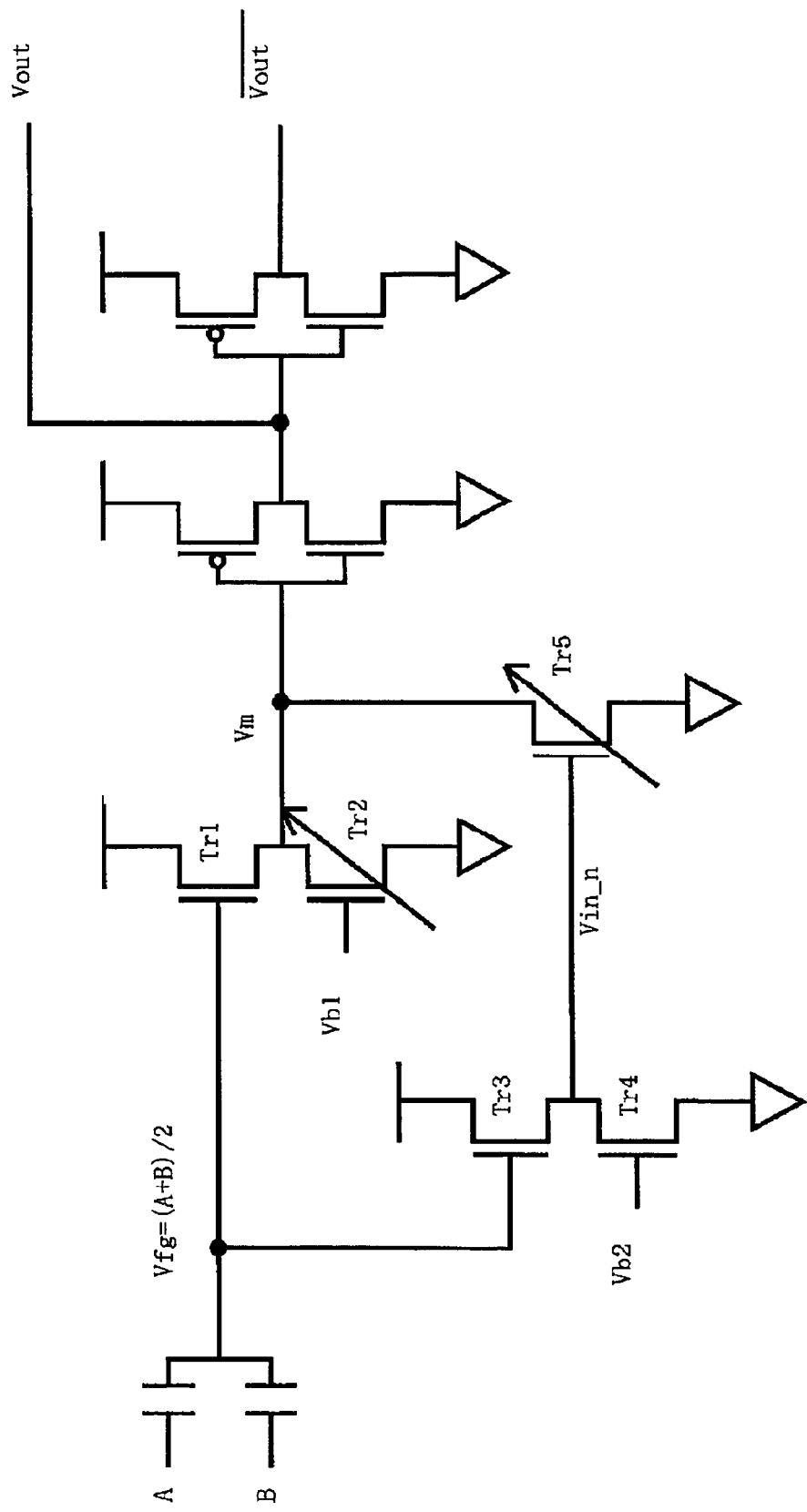
FIG. 55 illustrates the structure of a circuit that can reconfigure all the symmetric Boolean functions.
Figure 56:
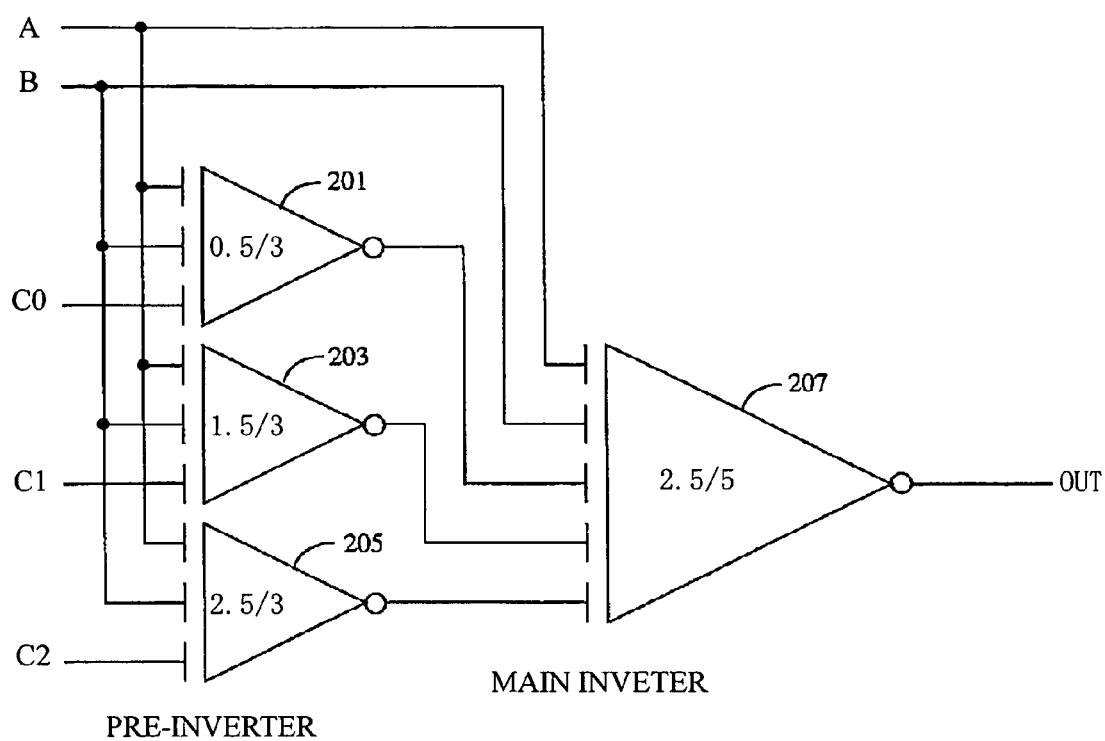
FIG. 56 illustrates an example structure of a logic circuit with which symmetric Boolean functions can be realized.
Figure 57A:
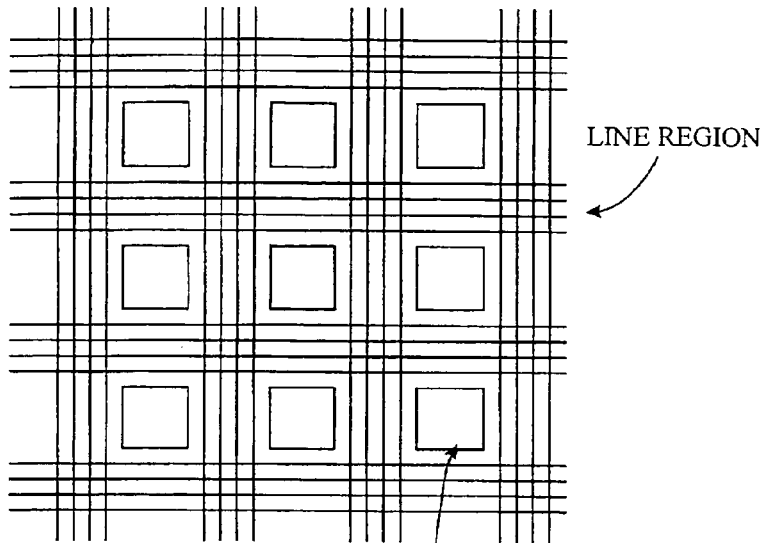
FIG. 57A shows a circuit in which small-sized logic blocks having LUTs and memory devices that can achieve desired functions are arranged in a matrix fashion, and the blocks are connected with lines that can be changed by a switch (a pass transistor, for example)
Figure 57B:
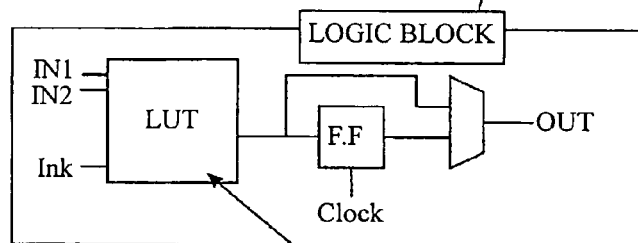
FIG. 57B shows a circuit that includes a flip-flop (FF) for operating in synchronization with a LUT.
Figure 57C:
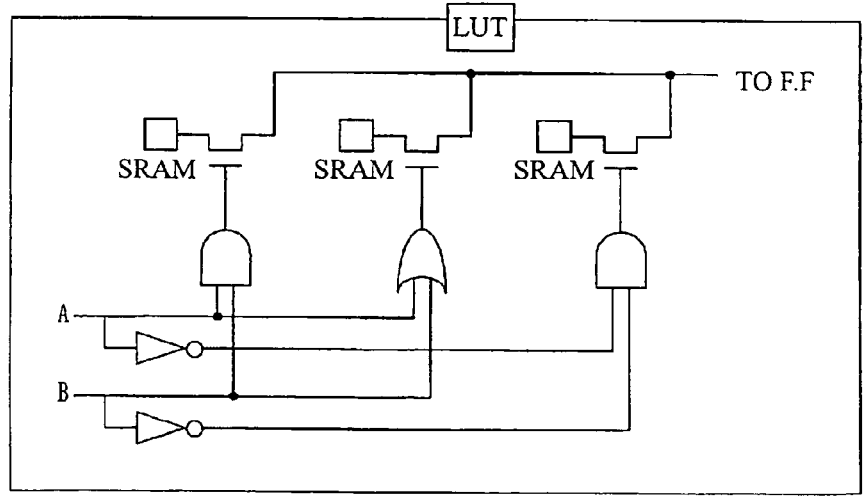
FIG. 57C shows an example of a LUT circuit with which symmetric Boolean functions can be realized.

Another stage of inverter is added to the output terminal $V_{out}$ shown in FIG. 51A, so that $V_{out}$ is inverted. As shown in FIG. 55, NAND/NOR/XNOR becomes AND/OR/XOR. With the two outputs of $V_{out}$ and the inverted $V_{out}$, a circuit that can achieve all the symmetric Boolean functions of NAND/NOR/XNOR+AND/OR/XOR, all "0", and "1" can be formed. In the entire circuit, nine MOSFETs and two capacitances are required. If necessary, a circuit (a pass transistor) for selecting either $V_{out}$ or the inverted $V_{out}$ is added to the output terminal, thereby restricting the number of outputs to 1. Table 14 collectively shows the functions of the circuit illustrated in FIG. 55.

TABLE 14

| | | $V_{out}$ | | | $\overline{V_{out}}$ | | | |
|---|---|---|---|---|---|---|---|---|
| | | A | 0 | 0 | 1 | A | 0 | 0 | 1 |
| $\beta_{n2}$ | $\beta_{n5}$ | B | 0 | 1 | 1 | B | 0 | 1 | 1 | function |
| 1 | 1 | | "1" | "0" | "0" | | "0" | "1" | "1" | NOR/OR |
| 10 | 1 | | "1" | "1" | "0" | | "0" | "0" | "1" | NAND/AND |
| 1 | 10 | | "1" | "0" | "1" | | "0" | "1" | "0" | XNOR/XOR |
| 10 | 10 | | "1" | "1" | "1" | | "0" | "0" | "0" | all "1"/ all "0" |

As described so far, any of the logic circuits in accordance with the embodiments of the present invention includes a spin transistor or a spin MOSFET that can change the current driving force in a non-volatile manner, and a vMOS structure. In such a structure, symmetric Boolean functions that are reconfigurable in a non-volatile manner can be realized with a small number of devices. With this circuit, the chip area can be reduced, and high-speed, low-consumption electric operations can be expected. Accordingly, this circuit can be applied to the integrated circuits for mobile devices that are produced in a short time.

Although the logic circuits in accordance with the specific examples and embodiments of the present invention have been described so far, the present invention is not limited to them. It should be obvious to those skilled in the art that various changes and modifications can be made to the above examples and embodiments, and various combinations of them can also be made.

INDUSTRIAL APPLICABILITY

Using a logic circuit of the present invention, symmetric Boolean functions that are reconfigurable in a non-volatile manner can be realized with a smaller number of devices. Since a circuit of the present invention can maintain each logic function in a non-volatile manner, there is no need to employ a non-volatile memory for storing logic functions. Accordingly, the chip size can be reduced. Also, using a circuit with a smaller number of devices, high-speed, low-consumption electric operations can be expected. Thus, the circuits of the present invention can be applied to the integrated circuits for mobile devices that are produced in a short time.

The invention claimed is:

1. A circuit comprising:
a first terminal that outputs an operating point;
a first circuit group charging the first terminal;
a second circuit group discharging the first terminal;
an applying portion applying a weighted mean of a plurality of inputs to one or both of the first circuit group and the second group;
a spin transistor having transfer characteristics depending on the spin direction of conduction carriers and being included in one or both of the first circuit group and the second circuit group; and
an output terminal that outputs a Boolean function of a plurality of inputs based on the operating point, wherein the operating point is changed based on the transfer characteristics, thereby reconfiguring the Boolean function.

2. The circuit as claimed in claim 1, wherein:
the spin transistor includes at least two ferromagnetic layers, and has the transfer characteristics depending on magnetization states of the ferromagnetic layers; and
the magnetization states of the spin transistor is changed to move the operating point, thereby reconfiguring the Boolean function.

3. The circuit as claimed in claim 2, wherein:
the spin transistor has at least one ferromagnetic body ("free layer") with a magnetization direction that can be controlled independently, and at least one ferromagnetic body ("pin layer") with a fixed magnetization direction; and
the spin transistor changes the operating point based on two of the magnetization states including a first state in which the free layer and the pin layer have the same magnetization directions ("parallel magnetization"), and a second state in which the free layer and the pin layer have the opposite magnetizing states to each other ("antiparallel magnetization").

4. The circuit as claimed in claim 1, wherein the first terminal has a potential that is determined by changing the spin directions of the condition carriers of the spin transistor or by controlling the transfer characteristics depending on magnetization state of the spin transistor.

5. The circuit as claimed in claim 1, wherein the applying portion has a neuron MOS (νMOS) structure including capacitors weighing the plurality of inputs with capacitance thereof and a floating gate connecting weighted input signals.

6. The circuit as claimed in claim 5, wherein the weighted input signals are weighted so as to be substantially equal to one another.

7. The circuit as claimed in claim 1, wherein a logic threshold value for dividing a potential generated in the first terminal into an output of a logic level "0" and an output of a logic level "1" is set with respect to the operating point that varies according to a variation in the transfer characteristics of the spin transistor.

8. The circuit as claimed in claim 1, wherein an A-D converter with a predetermined logic threshold value is connected to an output terminal of the circuit.

9. The circuit as claimed in claim 1, wherein the spin transistor is a MOSFET-type spin transistor ("spin MOSFET") that are formed with a source and a drain, including a MOS structure and a ferromagnetic body.

10. The circuit as claimed in claim 1, wherein the first circuit group includes a MOSFET of a first conductivity type or a spin MOSFET of the first conductivity type, and the second circuit group includes a MOSFET of the same conductivity type as the first conductivity type or a spin MOSFET of the same conductivity type as the first conductivity type.

11. The circuit as claimed in claim 10, wherein the first and second circuit groups or one of the first and second circuit groups comprises
a circuit that controls a potential of the first terminal by connecting a source or a drain of another spin MOSFET to the first terminal, and connecting a level shift circuit to a gate of the another spin MOSFET, the level shift circuit turning on the another spin MOSFET only when a predetermined input is made.

12. The circuit as claimed in claim 11, wherein the level shift circuit is formed with an E/E, E/D, or CMOS inverter.

13. The circuit as claimed in claim 11, wherein the circuit is a reconfigurable logic circuit that includes an A-D converter having the first terminal as an input.

14. The circuit as claimed in claim 11, wherein the circuit is a reconfigurable logic circuit that includes an inverter having an output of an A-D converter as an input, and can achieve all symmetric Boolean functions.

15. The circuit as claimed in claim 10, wherein the second circuit group comprises
a circuit that controls a potential of the first terminal by connecting a drain of another spin MOSFET of n-channel type to the first terminal, and connecting a level shift circuit to a gate of the another spin MOSFET of n-channel type, the another spin MOSFET of n-channel having a source grounded, the level shift circuit turning on the another spin MOSFET of n-channel type only when an input is A=B="0".

16. The circuit as claimed in claim 10, wherein the first circuit group comprises
a circuit that controls a potential of the first terminal by connecting a drain of another spin MOSFET of p-channel type to the first terminal, and connecting a level shift circuit to a gate of the another spin MOSFET of p-channel type, the another spin MOSFET of p-channel having a source connected to a supply voltage, the level shift circuit turning on the another spin MOSFET of p-channel type only when an input is A=B="1".

17. The circuit as claimed in claim 1, comprising
an E/E circuit that includes a structure in which a source of an enhancement MOSFET or an enhancement spin MOSFET contained in the first circuit group is connected to a drain of an enhancement MOSFET or an enhancement spin MOSFET contained in the second circuit group, and a first terminal that is formed at the connection portion.

18. The circuit as claimed in claim 17, wherein the drain of the enhancement MOSFET or the enhancement spin MOSFET contained in the first circuit group in the E/E circuit is connected to a gate of the enhancement MOSFET or the enhancement spin MOSFET.

19. The circuit as claimed in claim 17, wherein the enhancement MOSFET or the enhancement spin MOSFET contained in the second circuit group in the E/E circuit has a vMOS structure.

20. The circuit as claimed in claim 19, wherein the vMOS structure has two inputs (A and B) weighted with capacitances by capacitors.

21. The circuit as claimed in claim 1, comprising
an E/D circuit that includes a structure in which a source of a depletion MOSFET or a depletion spin MOSFET contained in the first circuit group is connected to a drain of an enhancement MOSFET or an enhancement spin MOSFET contained in the second circuit group, and a first terminal that is formed at the connection portion.

22. The circuit as claimed in claim 21, wherein the source of the depletion MOSFET or the depletion spin MOSFET contained in the first circuit group in the E/D circuit is connected to a gate of the depletion MOSFET or the depletion spin MOSFET.

23. The circuit as claimed in claim 21, wherein the enhancement MOSFET or the enhancement spin MOSFET contained in the second circuit group in the E/D circuit has a vMOS structure.

24. The circuit as claimed in claim 1, wherein the circuit is a NAND/NOR reconfigurable logic circuit or an AND/OR reconfigurable logic circuit that includes a A-D converter having the first terminal as an input.

25. The circuit as claimed in claim 1, wherein the first circuit group includes a MOSFET of a first conductivity type or a spin MOSFET of the first conductivity type, and the second circuit group includes a MOSFET of a second conductivity type different from the first conductivity type or a spin MOSFET of the second conductivity type.

26. The circuit as claimed in claim 25, comprising
a CMOS circuit that includes a structure in which a p-channel MOSFET or a p-channel spin MOSFET contained in the first circuit group is connected to an n-channel MOSFET or an n-channel spin MOSFET contained in the second circuit group with a shared drain terminal, and a first terminal that is formed at the shared drain terminal.

27. The circuit as claimed in claim 25, comprising
a CMOS circuit that is formed with a p-channel spin MOSFET contained in the first circuit group and an n-channel spin MOSFET contained in the second circuit group.

28. The circuit as claimed in claim 25, wherein the p-channel MOSFET or the p-channel spin MOSFET, and the n-channel MOSFET or the n-channel spin MOSFET of the CMOS circuit have a shared floating gate forming a vMOS structure.

29. The circuit as claimed in claim 28, wherein the vMOS structure has two inputs (A and B) weighted with capacitances by capacitors.

30. The circuit as claimed in claim 25, wherein the circuit is an AND/OR reconfigurable logic circuit or a NAND/NOR reconfigurable logic circuit that includes an A-D converter having the first terminal as an input.

31. The circuit as claimed in claim 25, wherein the first and second circuit groups, or one of the first and second circuit groups comprises
a circuit that controls a potential of the first terminal by connecting a source or a drain of another spin MOSFET to the first terminal, and connecting a level shift circuit to a gate of the another spin MOSFET, the level shift circuit turning on the another spin MOSFET only when a predetermined input is made.

32. The circuit as claimed in claim 31, wherein the level shift circuit is formed with an E/E, E/D, or CMOS inverter.

33. The circuit as claimed in claim 25, wherein the second circuit group comprises
a circuit that controls a potential of the first terminal by connecting a drain of another spin MOSFET of n-channel type to the first terminal, and connecting a level shift circuit to a gate of the another spin MOSFET of n-channel type, the another spin MOSFET of n-channel having a source grounded, the level shift circuit turning on the another spin MOSFET of n-channel type only when an input is A=B="0".

34. The circuit as claimed in claim 25, wherein the circuit is an AND/OR/XNOR reconfigurable logic circuit or a NAND/NOR/XOR reconfigurable logic circuit that includes an A-D converter having the first terminal as an input.

35. The circuit as claimed in claim 25, wherein the first circuit group comprises
a circuit that controls the potential of the first terminal by connecting the drain of the another spin MOSFET of p-channel type to the first terminal, and connecting a level shift circuit to the gate of the another spin MOSFET of p-channel type, the another spin MOSFET of p-channel having the source connected to a supply voltage, the level shift circuit turning on the another spin MOSFET of p-channel type only when an input is A=B="1".

36. The circuit as claimed in claim 25, wherein the circuit is an AND/OR/XOR reconfigurable logic circuit or a NAND/NOR/XNOR reconfigurable logic circuit that includes an A-D converter having the first terminal as an input.

37. The circuit as claimed in claim 25, wherein the circuit is a reconfigurable logic circuit that includes an inverter having an output of an A-D converter as an input, and can achieve all symmetric Boolean functions.

38. The circuit as claimed in claim 25, wherein the circuit is formed with a circuit group that is characterized by:
controlling a potential of the first terminal by connecting a drain of another spin MOSFET of n-channel type to the first terminal, and connecting a level shift circuit to a gate of the another spin MOSFET of n-channel type, the another spin MOSFET of n-channel having a source grounded, the level shift circuit turning on the another spin MOSFET of n-channel type only when an input is A=B="1"; and
controlling the potential of the first terminal by connecting a drain of another spin MOSFET of p-channel type to the first terminal, and connecting a level shift circuit to a gate of the another spin MOSFET of p-channel type, the another spin MOSFET of p-channel having a source connected to a supply voltage, the level shift circuit turning on the another spin MOSFET of p-channel type only when an input is A=B="0".

39. The circuit as claimed in claim 38, wherein the circuit is an all symmetric Boolean function logic circuit that includes an A-D converter having the first terminal as an input.

40. An integrated circuit comprising
the circuit including:
- a first terminal that outputs an operating point;
- a first circuit group charging the first terminal
- a second circuit group discharging the first terminal;
- an applying portion applying a weighted mean of a plurality of inputs to one or both of the first circuit group and the second circuit group;
- a spin transistor having transfer characteristics depending on the spin direction of conduction carriers and being included in one or both of the first circuit group and the second circuit group; and
- an output terminal that outputs a Boolean function of a plurality of inputs based on the operating point, wherein the operating point is changeable based on the transfer characteristics thereby reconfiguring the Boolean function.

* * * * *